United States Patent
Ishida et al.

(10) Patent No.: US 7,193,480 B2
(45) Date of Patent: Mar. 20, 2007

(54) VOLTAGE CONTROLLED OSCILLATOR, PLL CIRCUIT, PULSE MODULATION SIGNAL GENERATING CIRCUIT, SEMICONDUCTOR LASER MODULATION DEVICE AND IMAGE FORMING APPARATUS

(75) Inventors: Masaaki Ishida, Kanagawa (JP); Yasuhiro Nihei, Kanagawa (JP); Atsufumi Omori, Kanagawa (JP); Dan Ozasa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 113 days.

(21) Appl. No.: 10/854,268

(22) Filed: May 27, 2004

(65) Prior Publication Data

US 2004/0251973 A1   Dec. 16, 2004

(30) Foreign Application Priority Data

May 30, 2003 (JP) ............................. 2003-155306
Mar. 17, 2004 (JP) ............................. 2004-075842

(51) Int. Cl.
*H03K 3/03* (2006.01)

(52) U.S. Cl. ..................... 331/57; 331/16; 331/175; 331/185

(58) Field of Classification Search ............... 331/57, 331/175, 16, 185
See application file for complete search history.

(56) References Cited

U.S. PATENT DOCUMENTS

| | | | |
|---|---|---|---|
| 5,138,623 A | 8/1992 | Ema et al. | |
| 5,237,579 A | 8/1993 | Ema et al. | |
| 5,258,780 A | 11/1993 | Ema et al. | |
| 5,666,088 A * | 9/1997 | Penza ........................... | 331/34 |
| 5,784,091 A | 7/1998 | Ema et al. | |
| 5,946,334 A | 8/1999 | Ema et al. | |
| 6,118,798 A | 9/2000 | Ema et al. | |
| 6,275,116 B1 * | 8/2001 | Abugharbieh et al. ........ | 331/34 |
| 6,396,357 B1 * | 5/2002 | Sun et al. ...................... | 331/57 |
| 6,498,617 B1 | 12/2002 | Ema et al. | |
| 6,731,317 B2 | 5/2004 | Ema et al. | |
| 2003/0076180 A1 * | 4/2003 | Murakami ................... | 331/57 |

FOREIGN PATENT DOCUMENTS

| | | |
|---|---|---|
| JP | 10-21634 | 1/1998 |
| JP | 2000-77985 | 3/2000 |
| JP | 2002-171165 | 6/2002 |
| JP | 2002-246899 | 8/2002 |
| JP | 2003-103831 | 4/2003 |

* cited by examiner

*Primary Examiner*—Michael B Shingleton
(74) *Attorney, Agent, or Firm*—Oblon, Spivak, McClelland, Maier & Neustadt, P.C.

(57) ABSTRACT

An oscillation frequency control part includes a voltage-to-current converting circuit converting an input voltage to a current having a value corresponding to the input voltage, and outputting a current in proportion to the current obtained from the voltage-to-current converting circuit. An oscillating circuit part includes a ring oscillator, wherein a current in proportion to the output current of the oscillation frequency control part flows through the ring oscillator so that the oscillation frequency in the ring oscillator is controlled by the output current of the oscillation frequency control part. The voltage-to-current converting circuit has linear voltage-to-current conversion characteristics in a predetermined range of the input voltage including a ground potential.

2 Claims, 40 Drawing Sheets

IMAGE DATA — DOT IMAGE

IMAGE DATA — DOT IMAGE

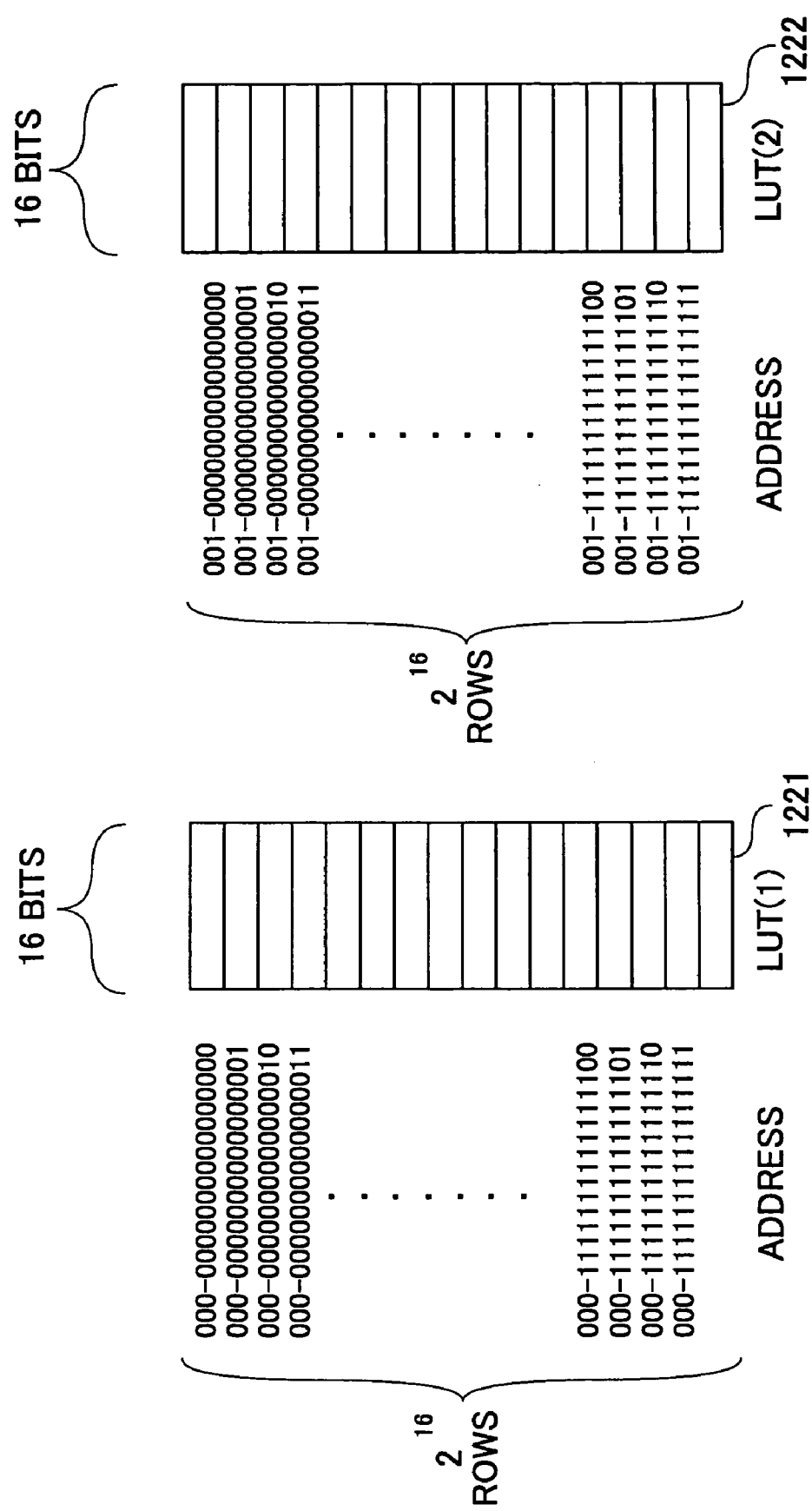

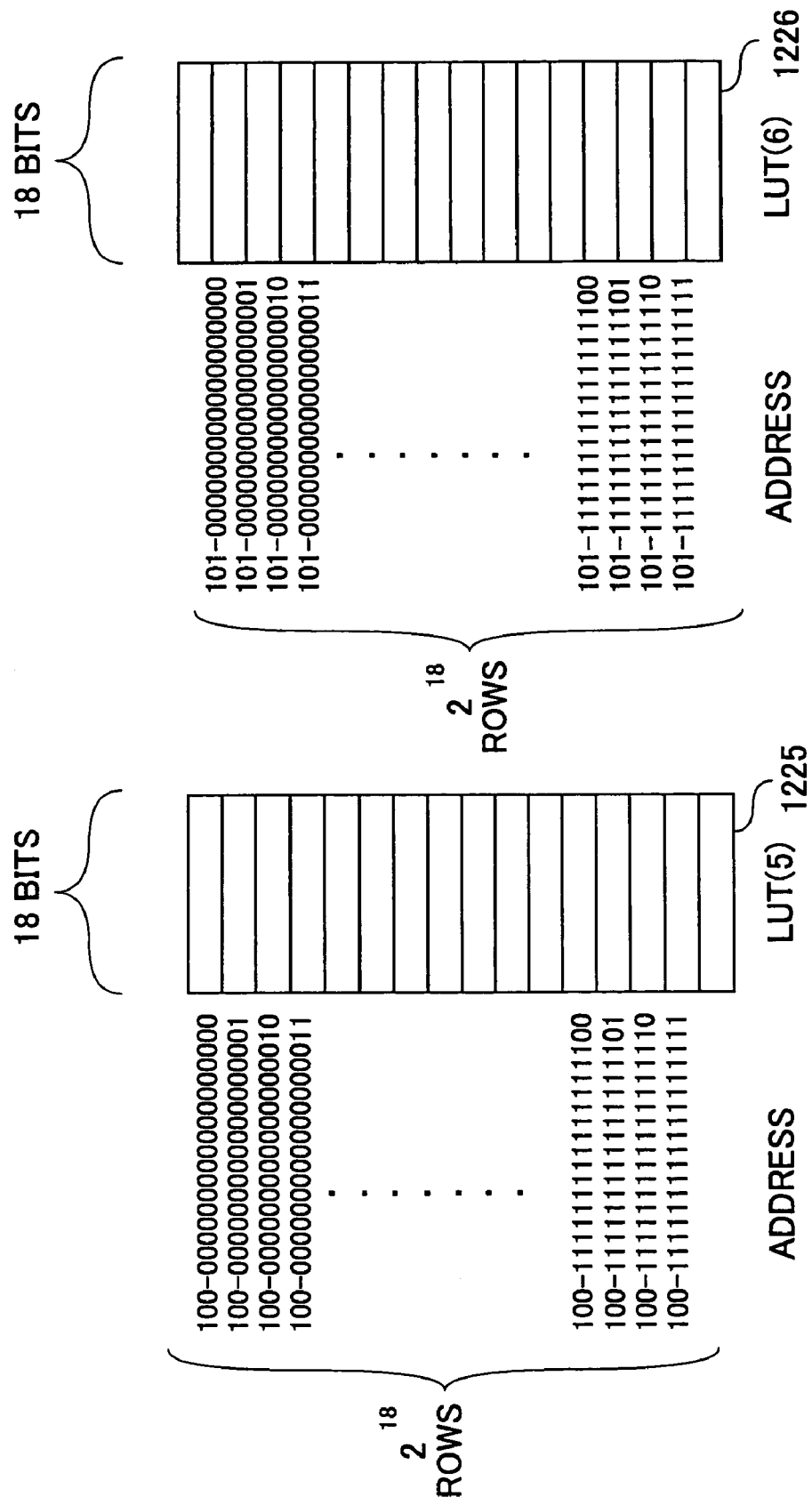

VOLTAGE CONTROLLED OSCILLATOR, PLL CIRCUIT, PULSE MODULATION SIGNAL GENERATING CIRCUIT, SEMICONDUCTOR LASER MODULATION DEVICE AND IMAGE FORMING APPARATUS

BACKGROUND OF THE INVENTION

1. Field of the Invention

The present invention relates to a voltage controlled oscillator (VCO), a PLL (phase locked loop) circuit, a pulse modulation signal generating circuit, a semiconductor laser modulation device and an image forming apparatus.

2. Background of the Invention

FIG. 40 shows a typical circuit configuration of a voltage controlled oscillator (VCO) in the prior art used in a PLL circuit or such. Japanese Laid-open Patent Application No. 2002-246899 (patent document #1) discloses a PLL circuit employing a voltage controlled oscillator having the same basic configuration as that shown in FIG. 40, for example. Such a voltage controlled oscillator is, in general, produced in an integrated circuit.

The circuit configuration shown in FIG. 40 includes an oscillation frequency control part 600 and an oscillating circuit part 700. The oscillation frequency control part 600 includes an n-channel MOS-FET 601, a p-channel MOS-FET 603 and a resister 602 which configure a voltage-to-current converting circuit converting an input voltage at an input terminal IN (VCO input voltage) into a current, as well as p-channel MOS-FETs 604 and 605 used for outputting a current in proportion to the above-mentioned current (a drain current of the p-channel MOS-FET 603) output from the voltage-to-current converting circuit. The oscillating circuit part 700 includes an odd number of stages of commonly used CMOS inverters connected to form a ring shape, and further includes p-channel MOS-FETs 701 through 706 and n-channel MOS-FETs 707 through 712. The p-channel MOS-FETs 701 through 703 are used to control a current (VCO ring current) flowing through the respective stages of the inverters, and configure current mirror with the p-channel MOS-FET 603 in the oscillation frequency control part 600 acting as a master thereof. Similarly, the n-channel MOS-FETs 710 through 712 are used to control the VCO ring current, and configure current mirror with the n-channel MOS-FET 605 in the oscillation frequency control part 600 acting as a master thereof.

In this configuration, when the VCO input voltage changes, the output current of the oscillation frequency control part 600 changes so that the VCO ring current changes and thus, a delay time in the inverter in each stage in the ring oscillator changes. As a result, the oscillation frequency in the ring oscillator changes.

Other than the above, a voltage controlled oscillator employing a ring oscillator in which an odd number of stages of differential inverters each having differential input and output terminals are connected to form a ring shape is also known (see Japanese Laid-open Patent Applications Nos. 2002-171165 and 2000-77985 (patent documents #2 and #3), for example).

Further, Japanese Laid-open Patent Application No. 10-21634 (patent document #4) discloses a configuration in which, in a PLL circuit, in order to decrease a gain in a voltage controlled oscillator, a signal obtained from integration of an input voltage by means of a digital integrator or an analog integrator is input to the voltage controlled oscillator.

Furthermore, Japanese Laid-open Patent Application No. 2003-103831 (patent document #5, corresponding to United States Patent Publication No. 2002/0130944 A1) discloses a pulse modulation signal generating circuit converting modulation data into a serial pulse series as a pulse modulation signal, as well as a semiconductor laser modulation device and an image forming apparatus employing the same.

SUMMARY OF THE INVENTION

Recently, there is a trend in which a PLL circuit which can generate a clock signal in a wide frequency range is requested. However, in order to increase a gain in a voltage controlled oscillator in the PLL circuit for this purpose, an oscillation frequency changes largely and thus jitter may increase, when an input voltage of the voltage controlled oscillator fluctuates due to external noise. Therefore, a voltage controlled oscillator which has a wide dynamic range even with a reduced gain is required. However, it may be difficult to satisfy such a requirement in a voltage controlled oscillator having the configuration shown in FIG. 40 or such. The reason therefor is described next in detail.

In the voltage controlled oscillator shown in FIG. 40, since a drain current does not flow in the n-channel MOS-FET 601 for voltage-to-current conversion until the VCO input voltage exceeds a certain threshold voltage Vth, characteristics of the oscillation frequency with respect to the VCO input voltage is such as that shown in FIG. 41 including a part of non-linearity as shown. These characteristics shown in FIG. 41 can also be regarded as characteristics of the VCO ring current with respect to the VCO input voltage, i.e., a voltage-to-current conversion characteristics, as a result of the vertical axis being replaced by the VCO ring current. However, in the characteristics shown in FIG. 41, a fixed amount of the VCO ring current (offset current) flows even though the VCO input voltage is less than Vth, and thus, oscillation occurs in a certain minimum oscillation frequency at the time. A device having a power source voltage Vcc of 5 V or 3.3 V has a threshold voltage of on the order of 0.6 V, for example. However, when the power source voltage Vcc of the device is lower such as 1.8 V, 1.2 V or 1.0 V, even though a threshold voltage Vth thereof should become also lower accordingly, it is difficult to provide a sufficient dynamic range (i.e., a range of the VCO input voltage in the linear zone in the characteristics shown in FIG. 41, for example). Accordingly, in order to obtain a desired range of the oscillation frequency in such a case, it is necessary to increase a gain (corresponding to the inclination of the characteristics curve in the linear zone in FIG. 41, for example).

Thus, an object of the present invention is to provide a novel voltage controlled oscillator even with a simple configuration in which the oscillation frequency range is wide with a not so high gain, and to provide a PLL circuit which uses this voltage controlled oscillator and can generate a clock signal in a wide frequency range with reduced jitter. Another object of the present invention is to provide a voltage controlled oscillator and a PLL circuit which have the above-mentioned advantages and also, can easily generate clock signals in an even number of phases, and also, to provide a voltage controlled oscillator and a PLL circuit which can prevent the osculating frequency or the clock frequency from exceeding a maximum allowable frequency even when external noise or such occurs.

A configuration including an integrator as disclosed in the patent document #4 for reducing the gain of the voltage controlled oscillator may have a problem that, in a case of employing a digital integrator, the circuit scale increases, while, in a case of employing an analog integrator, it is difficult to manage the offset, to guarantee the performance due to variation in the process applied or due to fluctuation in the ambient temperature, or such.

In a pulse modulation signal generating circuit such as that disclosed in the patent document #5, jitter in a high-frequency clock signal becomes jitter in a pulse modulation signal. Then, when a semiconductor laser which is used as a light source for recording in an image forming apparatus is driven according to the pulse modulation signal, the jitter in the pulse modulation signal may cause fluctuation in dot positions recorded or fluctuation in image tone, and thus, may degrade recording image quality in such a case.

Therefore, another object of the present invention is to provide a pulse modulation signal generating circuit improved so as to be able to generate a pulse modulation signal having effectively reduced jitter by using a PLL circuit according to the present invention, and to provide a semiconductor laser modulation device and an image forming apparatus improved by employing the pulse modulation signal generating circuit according to the present invention.

According to a first aspect of the present invention, a voltage controlled oscillator includes: an oscillation frequency control part including a voltage-to-current converting circuit converting an input voltage to a current having a value corresponding to the input voltage, and outputting a current in proportion to the current obtained from the voltage-to-current converting circuit; and an oscillating circuit part including a ring oscillator, wherein a current in proportion to the output current of the oscillation frequency control part flows through the ring oscillator so that the oscillation frequency in the ring oscillator is controlled by the output current of the oscillation frequency control part, wherein the voltage-to-current converting circuit has linear voltage-to-current conversion characteristics in a predetermined range of the input voltage including a ground potential.

Thereby, even when the power source voltage becomes lower in design, it is possible in a voltage controlled oscillator to provide a wide oscillation frequency range even with a not so high gain According to a second aspect of the present invention, a voltage controlled oscillator includes: an oscillation frequency control part including a voltage-to-current converting circuit converting an input voltage to a current having a value corresponding to the input voltage, and outputting a current in proportion to the current obtained from the voltage-to-current converting circuit; and an oscillating circuit part including a ring oscillator, wherein a current in proportion to the output current of the oscillation frequency control part flows through the ring oscillator so that the oscillation frequency in the ring oscillator is controlled by the output current of the oscillation frequency control part, wherein a first power source voltage of the oscillation frequency control part is higher than a second power source voltage of the oscillating circuit part.

Also in the above-mentioned configuration in the second aspect, the voltage-to-current converting circuit may preferably have linear voltage-to-current conversion characteristics in a predetermined range of the input voltage including a ground potential.

Thereby, since it is possible to reduce only the power source voltage of the oscillating circuit part while a wide dynamic range in voltage-to-current conversion is secured with a not so high gain, it is possible to achieve a voltage controlled oscillator having a wide oscillation frequency range including a higher frequency.

According to a third aspect of the present invention, a voltage controlled oscillator includes: an oscillation frequency control part including a voltage-to-current converting circuit converting an input voltage to a current having a value corresponding to the input voltage, and outputting a current in proportion to the current obtained from the voltage-to-current converting circuit; and an oscillating circuit part including a ring oscillator, wherein a current in proportion to the output current of the oscillation frequency control part flows through the ring oscillator so that the oscillation frequency in the ring oscillator is controlled by the output current of the oscillation frequency control part, wherein the oscillation frequency control part is configured to correct non-linearity of a transistor by combining transistors so as to provide a wide range of linearity with respect to the input voltage.

Thereby, even when the power source voltage becomes lower in design, it is possible to achieve a voltage controlled oscillator having a wide oscillation frequency range with a not so high gain In the voltage controlled oscillator in the first, second or third aspect of the present invention described above, the voltage-to-current conversion characteristics may be such that the linearity holds throughout a range in the input voltage from the ground potential to a power source voltage of the voltage-to-current converting circuit.

In the voltage controlled oscillator in the first, second or third aspect of the present invention, the voltage-to-current converting circuit may be made of an operational amplifier.

Furthermore, the operational amplifier may be one in type of rail-to-rail input/output.

In the voltage controlled oscillator in the first, second or third aspect of the present invention, the oscillation frequency control part may include a limiter circuit for controlling the output current of the oscillation frequency control part lower than a predetermined value.

Furthermore, the oscillation frequency control part may include a limiter circuit for controlling the output current of the oscillation frequency control part lower than a predetermined value, where the limiter circuit is one built in the operational amplifier.

By including the limiter circuit as mentioned above, it is possible to avoid oscillation with an oscillation frequency higher than the maximum allowable one, and thus, to avoid any trouble which would otherwise result from such an abnormal oscillation.

In the voltage controlled oscillator in the first, second or third aspect of the present invention, the ring oscillator may include an even number of differential inverters connected to form a ring shape.

Thereby, it is possible to achieve a voltage controlled oscillator by which clock signals in an even number of phases can be directly generated.

According to a fourth aspect of the present invention, a PLL circuit includes: any of the above-mentioned voltage controlled oscillators generating a clock frequency; a phase comparing part detecting a phase difference between the clock frequency generated by the voltage controlled oscillator or a frequency obtained from once dividing the oscillated frequency and a reference clock frequency; and a voltage inputting part inputting a voltage corresponding to the phase difference detected by the phase comparing part to the voltage controlled oscillator.

According to a fifth aspect of the present invention, a PLL circuit includes: any of the above-mentioned voltage controlled oscillators generating a clock frequency; a frequency divider dividing the clock frequency generated by the voltage controlled oscillator; a phase comparator detecting a phase difference between the clock frequency output from the frequency divider and a reference clock frequency; a charge pump circuit converting an output signal of the phase comparator into a current signal; and a lowpass filter inputting thereto an output signal of the charge pump circuit and outputting a control signal for the voltage controlled oscillator, wherein a first power source voltage higher than any of a second power source voltage of the oscillating circuit part of the voltage controlled oscillator, a third power source voltage of the frequency divider and a fourth power source voltage of the charge pump circuit is applied as a power source voltage of the oscillation frequency control part of the voltage controlled oscillator.

In any of the above-mentioned fourth and the fifth aspects of the present invention, it is possible to achieve a PLL circuit by which a stable clock signal with reduced jitter can be generated, a clock signal can be generated in a wide frequency range including a high frequency, clock signals in an even number of phases can be directly generated, and also, abnormal oscillation in which the maximum allowable frequency is exceeded can be avoided.

According to a sixth aspect of the present invention, a pulse modulation signal generating circuit includes: a high-frequency clock generating part generating a high-frequency clock signal with the use of the above-mentioned PLL circuit; and a serial modulation signal generating part including a shift register, providing modulation data having a plurality of bits to the shift register and causing the shift register to perform shift operation according to the high-frequency clock signal so as to convert the modulation data into a serial pulse series to be output.

According to a seventh aspect of the present invention, a pulse modulation signal generating circuit includes: a high-frequency clock generating part generating high-frequency clock signals in a plurality of phases with the use of the above-mentioned PLL circuit; and a serial modulation signal generating part including a plurality of shift registers and a multiplexer selecting output data of the plurality of shift registers in timing based on the high-frequency clock signals in the plurality of phases, providing modulation data having a plurality of bits to the plurality of shift registers in a dividing manner and causing the plurality of shift registers to perform shift operation according to the corresponding ones of the high-frequency clock signals in the plurality of phases so as to convert the modulation data into a serial pulse series to be output from the multiplexer.

According to an eighth aspect of the present invention, a pulse modulation signal generating circuit includes: a high-frequency clock generating part generating high-frequency clock signals in a plurality of phases with the use of the above-mentioned PLL circuit; and a serial modulation signal generating part including a plurality of shift registers and a multiplexer selecting output data of the plurality of shift registers in timing based on the high-frequency clock signals in the plurality of phases, providing modulation data having a plurality of bits to the plurality of shift registers in a dividing manner, causing the plurality of shift registers to perform shift operation according to the corresponding ones of the high-frequency clock signals in the plurality of phases so as to convert, according to an input load signal, the modulation data into a serial pulse series to be output from the multiplexer.

According to a ninth aspect of the present invention, a pulse modulation signal generating circuit includes: a high-frequency clock generating part generating high-frequency clock signals in a plurality of phases with the use of the above-mentioned PLL circuit; and a serial modulation signal generating part including a plurality of shift registers, a phase adjusting part receiving output data of the plurality of shift registers and outputting it after adjusting the phases thereof and a multiplexer selecting output data of the plurality of shift registers in timing based on the high-frequency clock signal in the plurality of phases, which data is provided through the phase adjusting part, providing modulation data having a plurality of bits to the plurality of shift registers in a dividing manner and causing the plurality of shift registers to all at once perform shift operation according to a high-frequency clock signal in one phase from among the high-frequency clock signals in the plurality of phases so as to convert, according to an input load signal, the modulation data into a serial pulse series to be output from the multiplexer.

In any of the above-mentioned sixth through ninth aspects of the present invention, it is possible to achieve a pulse modulation signal generating circuit by which, even in a relatively simple configuration, a pulse modulation signal in a desired pattern at a frequency which is higher than that of the high-frequency clock signal with reduced jitter can be generated.

According to a tenth aspect of the present invention, a semiconductor laser modulation device includes: a semiconductor laser; the above-mentioned pulse modulation signal generating circuit converting modulation data for modulating the semiconductor laser into a serial pulse series; and a driving part driving the semiconductor laser according to the serial pulse series output from the pulse modulation signal generating circuit.

Thereby, it is possible to achieve a semiconductor laser driving device whereby a semiconductor laser can be driven according to a pulse modulation signal at a high frequency with reduced jitter, which is suitable for modulating the semiconductor laser acting as a light source in an image forming apparatus.

According to an eleventh aspect of the present invention, an image forming apparatus, in which one or a plurality of laser beams emitted from a semiconductor laser(s) are used to scan a photosensitive body so as to form an electrostatic latent image thereon, includes the above-mentioned pulse modulation signal generating circuit converting modulation data into a serial pulse series; and a driving part driving the semiconductor laser according to the serial pulse series output from the pulse modulation signal generating circuit.

Thereby, it is possible to achieve an image forming apparatus in which, even when operation speed is high in design, an image can be produced with stable high resolution and fine tone gradation.

BRIEF DESCRIPTION OF THE DRAWINGS

Other objects and further features of the present invention will become more apparent from the following detailed description when read in conjunction with the following accompanying drawings:

FIGS. 29A, 29B and 29C show another example of a configuration of a lookup table (LUT) for generating modulation data;

DETAILED DESCRIPTION OF THE PREFERRED EMBODIMENTS

First, embodiments of a voltage controlled oscillator according to the present invention will now be described.

A voltage controlled oscillator according to the present invention includes a voltage-to-current converting circuit converting an input voltage into a current with a value corresponding to the value of the input voltage; an oscillation frequency control part outputting a current in proportion to the current provided by the voltage-to-current converting circuit; and an oscillating circuit including a ring oscillator, where a current in proportion to the output current of the oscillation frequency control part flows through the ring oscillator. A feature of the voltage controlled oscillator according to the present invention is that the voltage-to-current converting circuit has linear voltage-to-current conversion characteristics for a predetermined input voltage range including a ground potential.

Figure 1:
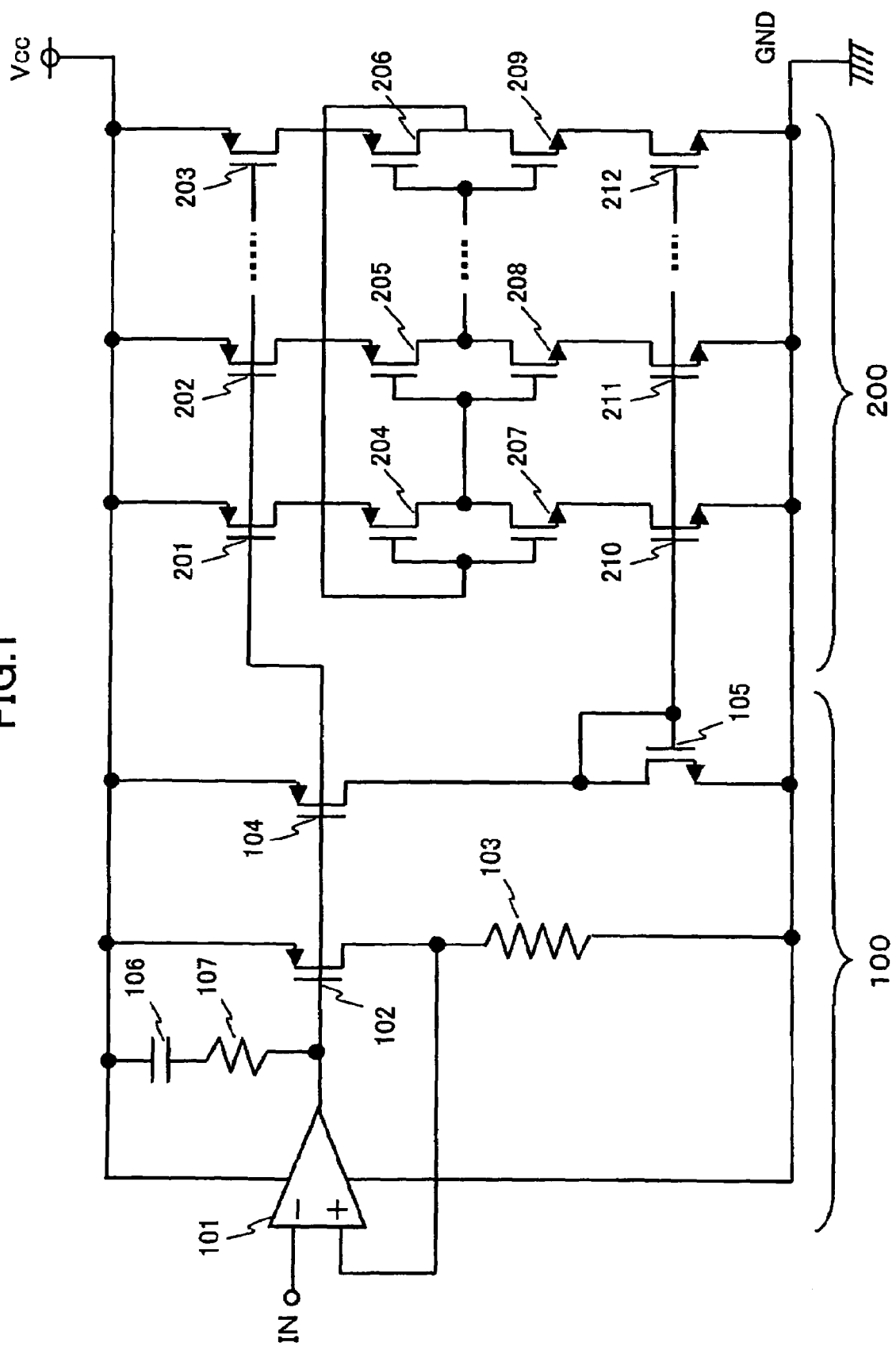
FIG. 1 shows a circuit diagram of a first embodiment of a voltage controlled oscillator according to the present invention.

FIG. 1 shows a circuit diagram of a voltage controlled oscillator in a first embodiment of the present invention. As shown, the voltage controlled oscillator includes an oscillation frequency control part 100 and an oscillating circuit part 200.

The oscillation frequency control part 100 includes an operational amplifier 101, a p-channel MOS-FET 102 and a resister 103 which configure a voltage-to-current converting circuit which converts a voltage input to an input terminal IN (VCO input voltage) into a current, as well as a p-channel MOS-FET 104 and an n-channel MOS-FET 105 for outputting a current (VCO ring current) in proportion to the current (a drain current of the p-channel MOS-FET 102) provided by the voltage-to-current converting circuit. The drain current of the n-channel MOS-FET 102 is controlled so that a voltage at a connection point between the p-channel MOS-FET 102 and the resister 103 become equal to the VCO input voltage.

In a case where the p-channel MOS-FETs 102 and 104 are equal to one another in the transistor sizes, the drain currents of these transistors are equal to one another. It is possible to change a current ratio therebetween by changing the size ratio of these transistors. For example, by making the p-channel MOS-FET 104 double the size with respect to the p-channel MOS-FET 102, it is possible to obtain the VCO ring current double with respect to the drain current of the MOS-FET 102.

The operational amplifier 101 is an operational amplifier in a type of rail-to-rail input/output (the registered trademark of Japan Motorola, Co., Ltd.) such that the input and the output thereof can have the values from 0 V to the power source voltage. Accordingly, this voltage-to-current converting circuit has linear voltage-to-current conversion characteristics in a range of the input voltage from the ground potential GND to the power source voltage Vcc. The gain thereof is defined approximately by the resistance value of the resister 103 for voltage-to-current conversion. A capacitor 106 and a resister 107 are provided if necessary for the purpose of compensating for the response speed of the operational amplifier 101.

When this voltage controlled oscillator is used in a PLL circuit, the frequency characteristics of the operational amplifier influence the loop characteristics of the PLL circuit. Accordingly, it is necessary to set the cut-off frequency of the operational amplifier 101 to be sufficiently higher than the response frequency of the PLL circuit in such a case.

The oscillating circuit 200 includes a ring oscillator in which an odd number of stages of commonly used CMOS inverters are connected to form a ring shape. The oscillating circuit 200 also includes p-channel MOS-FETs 201 through 206 and n-channel MOS-FETs 207 through 212. The p-channel MOS-FETs 201 through 203 are used for controlling a current (VCO ring current) flowing through the respective stages of the inverters. These transistors 201 through 203 have gate potentials common with that of the p-channel MOS-FET 104 in the oscillation frequency control part 100, and thus, a current flowing through each of the p-channel MOS-FETs 201 through 203 is same in the magnitude as that of a current flowing through the p-channel MOS-FET 104. The n-channel MOS-FETs 210 through 212 are also used for controlling the VCO ring current, configure current mirror in which the n-channel MOS-FET 105 in the oscillation frequency control part 100 acts as a master thereof, and thus, have the same current flowing therethrough in the magnitude as that of a current flowing through the p-channel MOS-FET 104.

Figure 2:
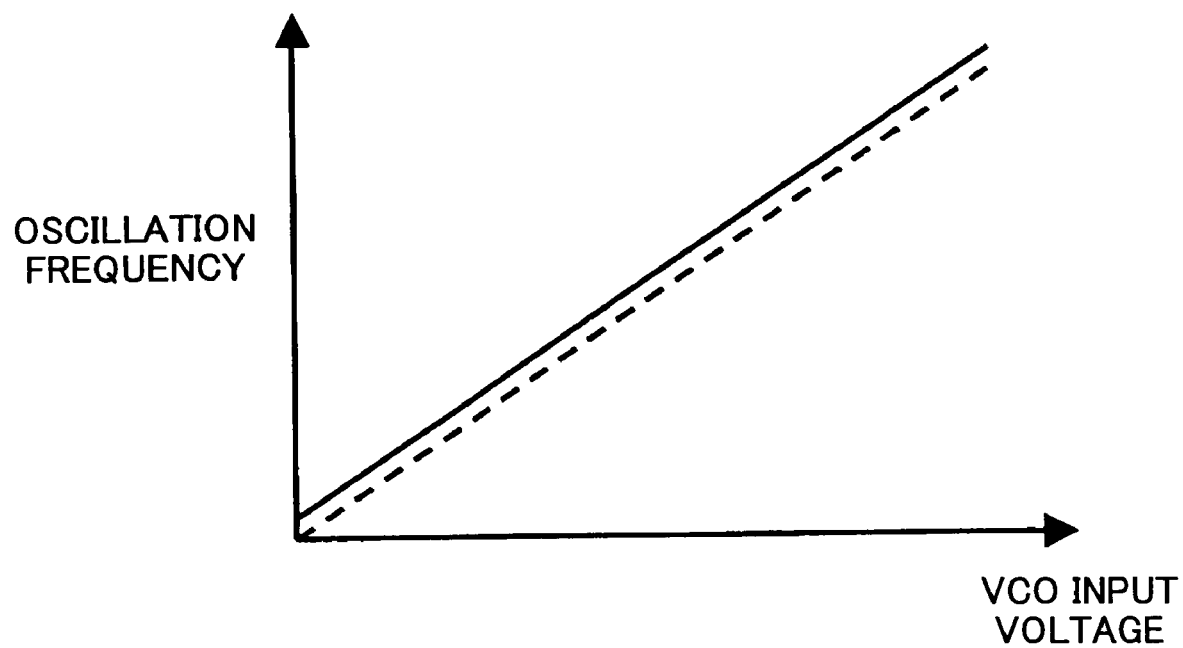
FIG. 2 shows characteristics of an oscillation frequency with respect to a VCO input voltage in the first embodiment shown in FIG. 1.

In this configuration, when the VCO input voltage applied to the input terminal IN changes, the VCO ring current changes since the output current of the oscillation frequency control part 100 changes as a result. Accordingly, the delay time in the inverter in each stage of the ring oscillator changes, and thus, the oscillation frequency in the ring oscillator changes accordingly. Since the voltage-to-current converting circuit in the oscillation frequency control part 100 has a linear conversion characteristics in a range from the ground potential GND to the power source voltage Vcc, characteristics of the oscillation frequency with respect to the VCO input voltage indicated by a broken curve shown in FIG. 2 can be obtained in a case where the VCO ring current has no offset current. In a case where the VCO input voltage has an offset current, characteristics of the oscillation frequency with respect to the VCO input voltage indicated by a solid curve shown in FIG. 2 can be obtained. Thus, since the linear characteristics of the oscillation frequency with respect to the VCO input voltage can be thus obtained throughout all the range of the VCO input voltage, it is possible to provide a wide dynamic range of the VCO input voltage in which linear characteristics are obtained. Accordingly, it is possible to obtain a wide oscillation frequency range with controlling the gain at a low level even in a case where the power source voltage Vcc of the device is low.

Linear characteristics of the oscillation frequency with respect to the VCO input voltage, i.e., linear characteristics of voltage-to-current conversion as described above with the use of the operational amplifier 101 are achieved as a result of non-linearity of a transistor, such as that described above with reference to FIGS. 40 and 41 (especially the dead band shown in FIG. 41) being corrected with the use of the configuration of the operational amplifier 101, especially that in a type of rail-to-rail input/output.

As will be described later for a fifth embodiment, when linear characteristics are obtained from the ground potential GND, even when the linear characteristics are not obtained up to the power source voltage Vcc, it is possible to provide a wide dynamic range in which liner characteristics are obtained in comparison to the prior art as that shown in FIG. 40, even if the power source voltage Vcc is lowered in design. Accordingly, also in such a case, it is possible to obtain a wide oscillation frequency range with well controlling the gain at a low level, and is included in the present invention.

Figure 3:
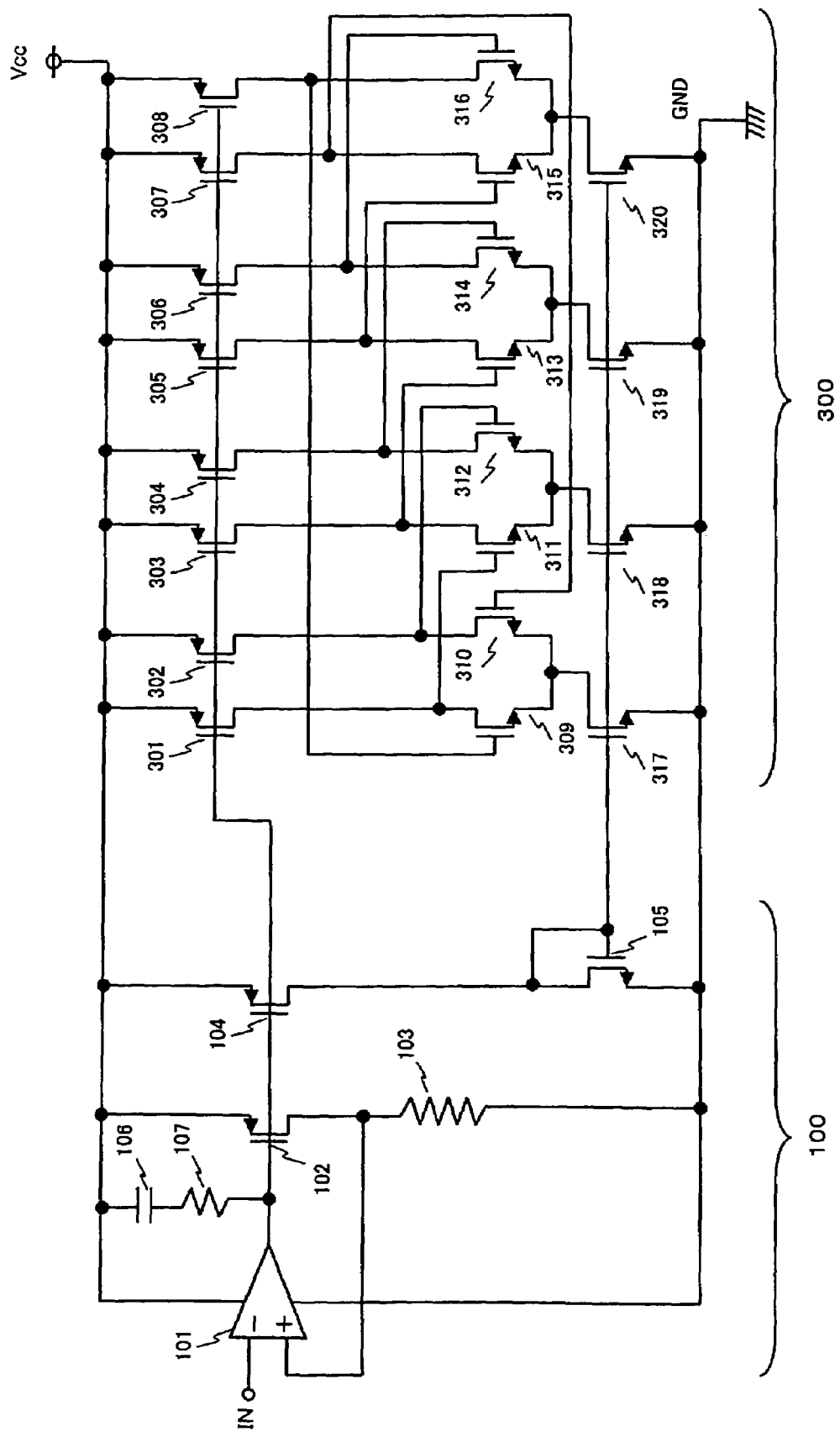
FIG. 3 shows a circuit diagram of a second embodiment of a voltage controlled oscillator according to the present invention.

FIG. 3 shows a circuit diagram of a voltage controlled oscillator in a second embodiment of the present invention. In FIG. 3, an oscillation frequency control part 100 has the same configuration as that of the oscillation frequency control part 100 in the above-described first embodiment. An oscillating circuit part 300 thereof is configured by four stages (or another even number of stages in general) of differential inverters connected to form a ring shape so as to configure a ring oscillator. The oscillating circuit part 300 also includes p-channel MOS-FETs 301 through 308, and n-channel MOS-FETs 309 through 320. Through each of the p-channel MOS-FETs 301 through 308, the same drain current (VCO ring current) flows in the magnitude as the output current of the oscillation frequency control part 100, i.e., a drain current of the p-channel MOS-FET 104, since these transistors 301 through 308 have the same gate potential as that of the p-channel MOS-FET 104. The n-channel MOS-FETs 317 through 320 configure current mirror together with the n-channel MOS-FET 105, and thus, the drain current (VCO ring current) each thereof is the same as that of the p-channel MOS-FET 104. As can be seen from FIG. 3, since the number of stages of the differential inverters configuring the ring oscillator is the even number, the respective outputs of the inverter in the last stage are returned to the reverse-phase inputs of the inverter in the initial stage so as to form a feedback configuration.

Also the voltage controlled oscillator in this embodiment has linear characteristics of the oscillation frequency with respect to the VCO input voltage (in other words, voltage-to-current conversion characteristics) throughout the entire the range of the VCO input voltage from the ground potential GND to the power source voltage Vcc. A feature of the present embodiment is that the oscillating circuit part 300 includes the ring oscillator of ring connection of the even number of stages of differential inverters, and thus, clock signals in an even number of phases can be directly obtained from the ring oscillator. On the other hand, in a configuration in which an odd number of stages of inverters are connected in a ring shape, clock signals in an odd number of phases are obtained therefrom. However, in many digital circuits, clock signals in an even number of phases are required. Accordingly, a configuration such as that of the present embodiment which can directly provide clock signals in an even number of phases is significantly advantageous in many cases.

It is noted that a configuration employing a ring oscillator in which an odd number of stages of differential inverters are connected to form a ring shape is also included in the present invention. In this case, the respective outputs of the inverters in the last stage are connected to the same-phase inputs of the inverter of the initial stage.

Figure 40:
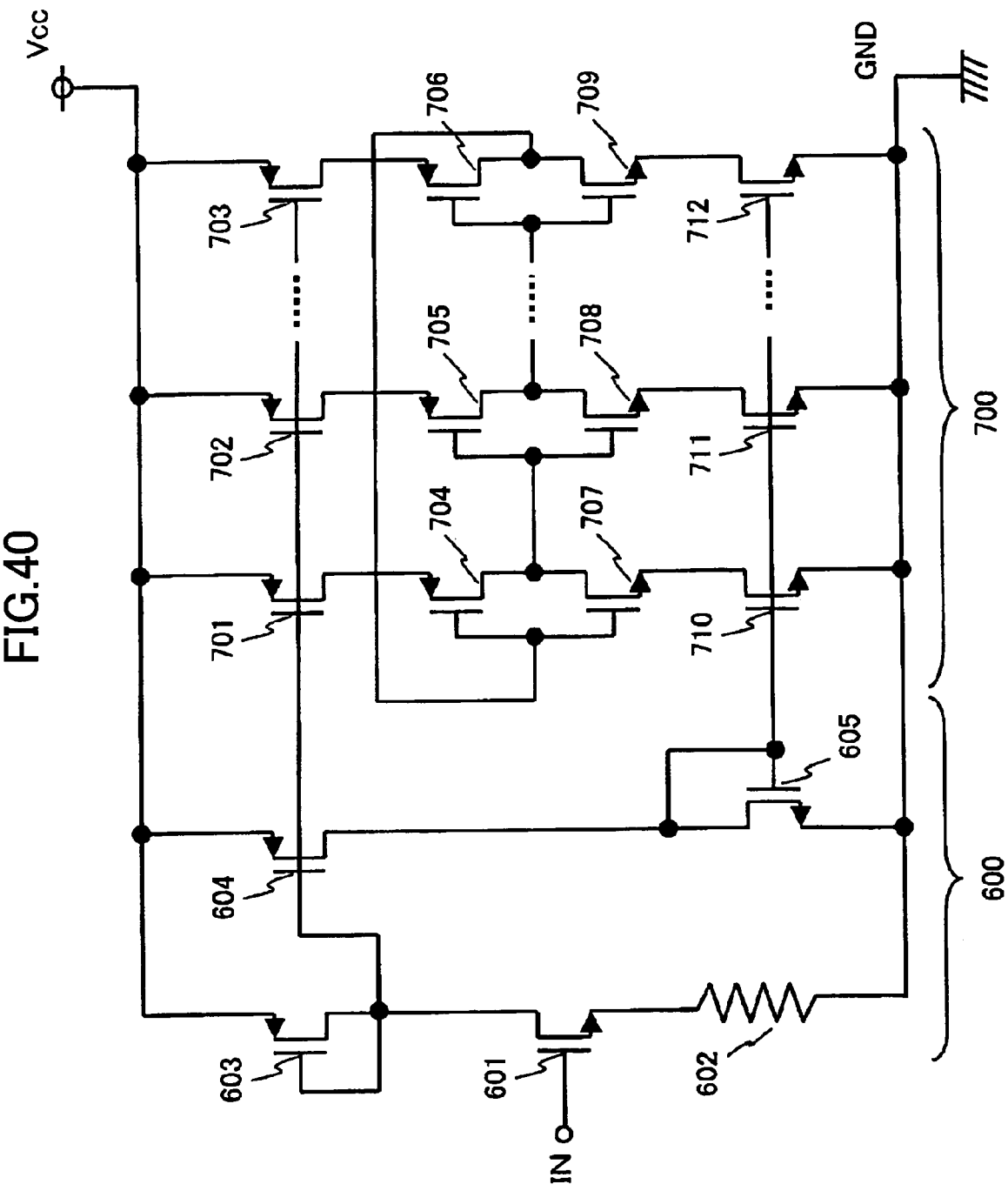
FIG. 40 shows a circuit diagram of a voltage controlled oscillator in the prior art.
Figure 41:
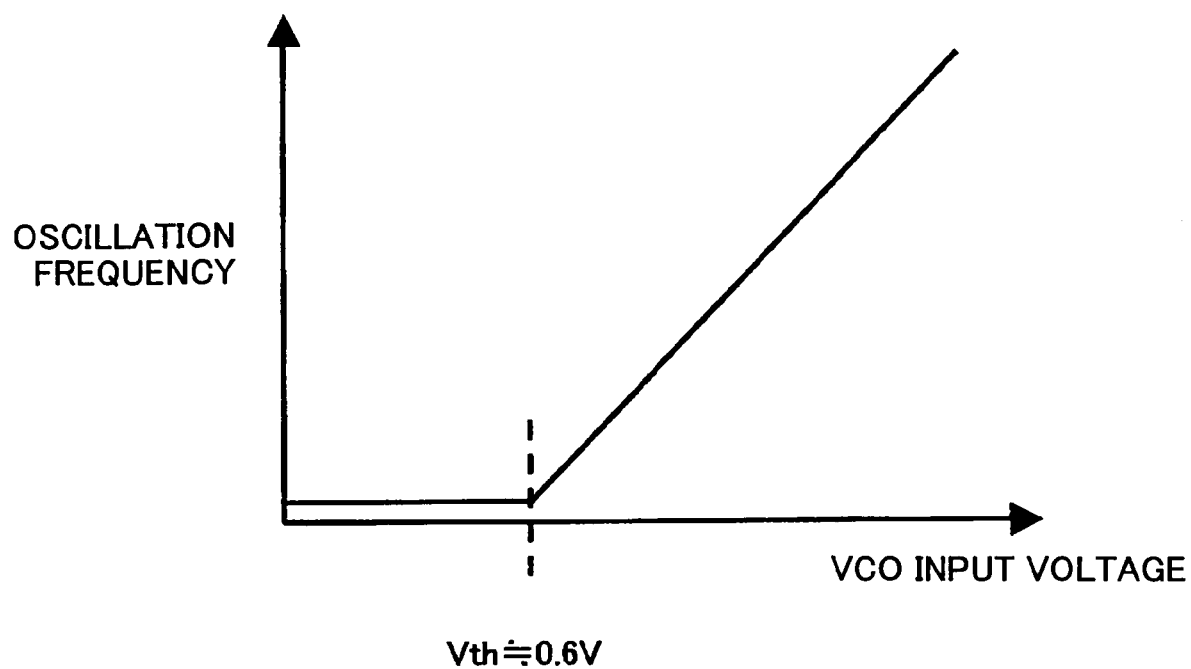
FIG. 41 shows characteristics of an oscillation frequency with respect to a VCO input voltage in the prior art shown in FIG. 40.

Furthermore, also in the present embodiment, when linear characteristics are obtained from the ground potential GND, even when the linear characteristics are not obtained up to the power source voltage Vcc, it is possible to provide a wide dynamic range in which liner characteristics are obtained in comparison to the prior art as that shown in FIG. 40, even if the power source voltage Vcc is lowered in design. Accordingly, also in such a case, it is possible to obtain a wide oscillation frequency range with well controlling the gain at a low level, and is included in the present invention.

Figure 4:
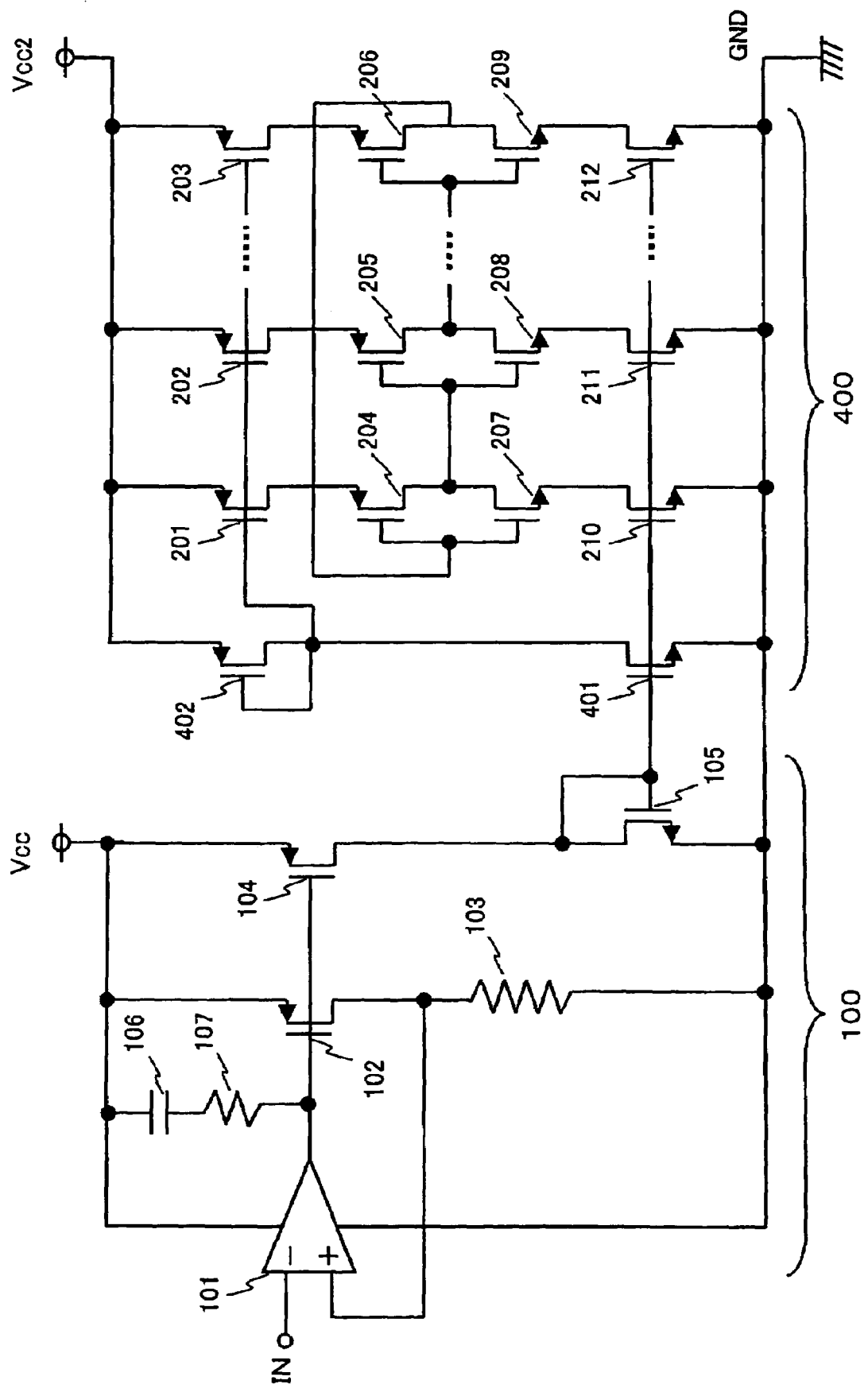
FIG. 4 shows a circuit diagram of a third embodiment of a voltage controlled oscillator according to the present invention.

FIG. 4 shows a circuit diagram of a voltage controlled oscillator according to a third embodiment of the present invention. This voltage controlled oscillator has a feature that the power source voltage Vcc of an oscillation frequency control part 100 is different from the power source voltage Vcc2 of an oscillating circuit part 400.

The oscillation frequency controlling part 100 is the same as the oscillation frequency control part 100 in the first embodiment described above. A basic configuration of the oscillating circuit part 400 is same as that in the first embodiment. However, the power source voltage Vcc2 thereof is different from the power source voltage Vcc of the oscillation frequency control part 100. In this connection, an n-channel MOS-FET 401 configuring current mirror with the n-channel MOS-FET 105 is added, and also, a p-channel MOS-FET 402 configuring current mirror with the p-channel MOS-FETs 201 through 203 is also added in series with the above-mentioned transistor 401.

In order to obtain a higher oscillation frequency, it is necessary to lower the power source voltage Vcc2 of the oscillating circuit part 400 and to apply a finer rule to the transistors 204 through 209 configuring the ring oscillator. However, if the power source voltage of the oscillation frequency control part 400 is lowered in design in the same way, the dynamic range of voltage-to-current conversion is narrowed, and thus, the gain should be increased accordingly.

In the voltage controlled oscillator in the present embodiment, the power source voltage Vcc2 is set at a lower level, and the power source voltage Vcc can be set at a higher level. Thereby, it is possible to achieve a voltage controlled oscillator having a wider oscillation frequency range by which the wider dynamic range of voltage-to-current conversion is secured while increase in the gain can be well controlled, and also, a higher frequency can be oscillated by means of the ring oscillator since the power source voltage Vcc2 is lowered and thus a finer rule can be applied thereto as mentioned above.

In the case of the present embodiment, it is not necessary that the operational amplifier 101 is of a rail-to-rail input/output type. This is because, by setting the power source voltage Vcc at a sufficiently high level without regard to the power source voltage Vcc2 of the ring oscillator, it is possible to secure a necessary voltage-to-current conversion dynamic range accordingly. However, by further employing an operational amplifier in a rail-to-rain input/output type as the operational amplifier 101, it is possible to obtain a further wide dynamic range with the same power source voltage Vcc. In other words, it is possible to obtain an equivalent dynamic range even with the lower power source voltage Vcc.

In the configuration shown in FIG. 4, specific numerical examples are shown next for reference. The power source voltage Vcc is 3.3 V, while the power source voltage Vcc2 is 1.2 V or 1.8 V (corresponding to a CMOS process applied to the ring oscillator, i.e., 0.13 µm or 0.18 µm, respectively). The available range of oscillation frequency in the ring oscillator is as wide as from a direct current to 1 through 5 GHz.

Figure 5:
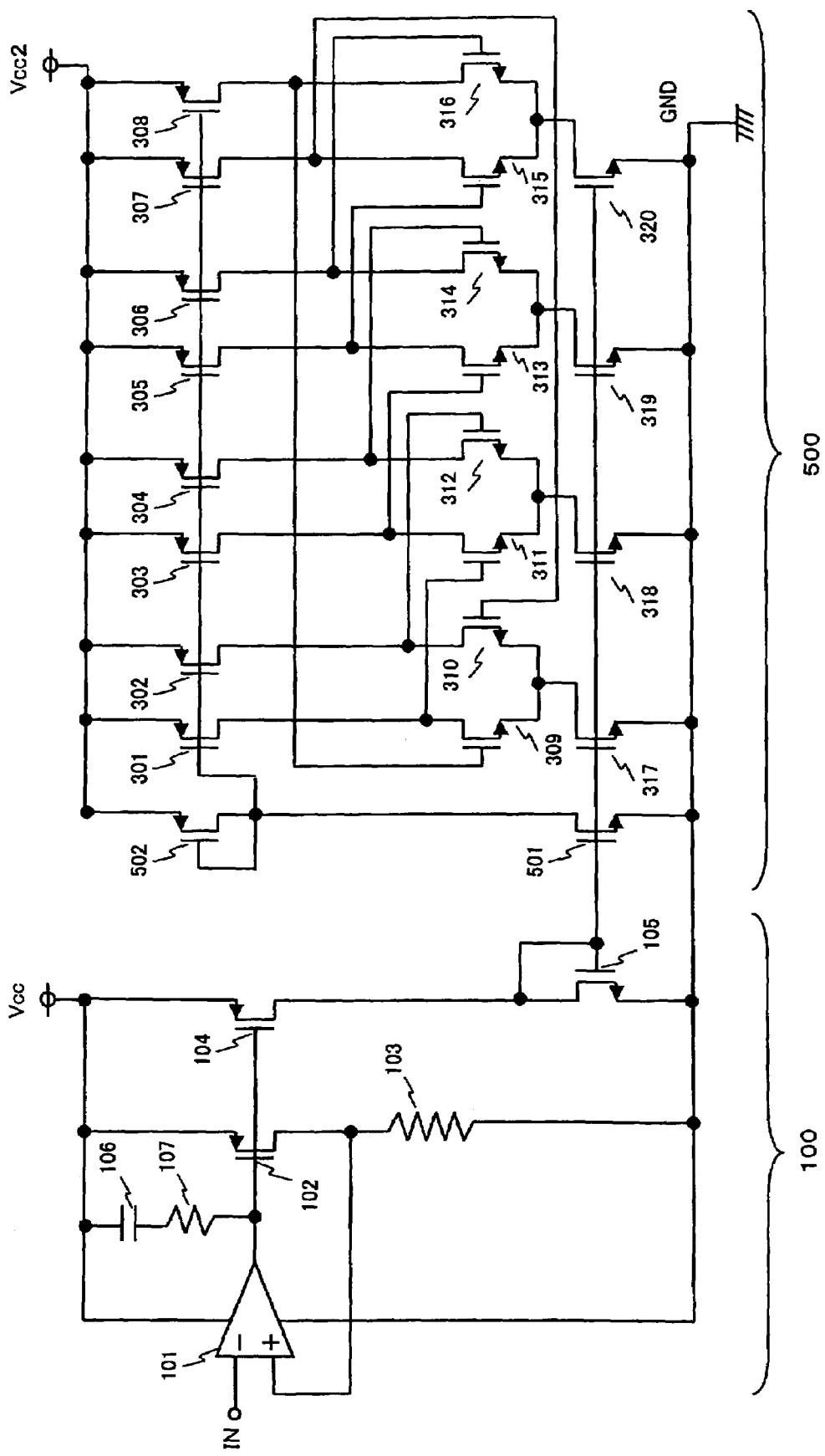
FIG. 5 shows a circuit diagram of a fourth embodiment of a voltage controlled oscillator according to the present invention.

FIG. 5 shows a circuit diagram of a voltage controlled oscillator according to a fourth embodiment of present invention. This voltage controlled oscillator has a feature that the power source voltage Vcc of the oscillation frequency control part is different from the power source voltage Vcc2 of the oscillating circuit part 500 the same as in the above-described third embodiment.

The oscillation frequency controlling part 100 is the same as the oscillation frequency control part 100 in the first embodiment described above. A basic configuration of the oscillating circuit part 500 is same as that in the second embodiment. However, the power source voltage Vcc2 thereof is different from the power source voltage Vcc of the oscillation frequency control part 100. In this connection, an n-channel MOS-FET 501 configuring current mirror with the n-channel MOS-FET 105 is added, and also, a p-channel MOS-FET 502 which configuring current mirror with the p-channel MOS-FETs 301 through 308 is added in series with the above-mentioned transistor 501.

As described above for the third embodiment, in order to obtain a higher oscillation frequency, it is necessary to lower the power source voltage Vcc of the oscillating circuit part 500 and to apply a finer rule to the transistors 309 through 316 configuring the ring oscillator. However, if the power source voltage Vcc of the oscillation frequency control part 400 is lowered in the same way, the dynamic range of voltage-to-current conversion is narrowed, and thus, the gain should be increased accordingly. In the voltage controlled oscillator in the present embodiment, the power source voltage Vcc2 is set at a lower level, and the power source voltage Vcc can be set at a higher level without regard thereto. Thereby, it is possible to achieve a voltage controlled oscillator having a wider oscillation frequency range by which the wider dynamic range of voltage-to-current conversion is secured while increase in the gain can be well controlled, and also, a higher frequency can be oscillated as in the third embodiment. Also in the present embodiment, it is not necessary that the operational amplifier 101 is of a rail-to-rail input/output type. However, in order to obtain a wider dynamic range with a lower power source voltage Vcc, it is also preferable to employ the operational amplifier in a type of rail-to-rail input/output as the operational amplifier 101.

A voltage controlled oscillator in a fifth embodiment of the present invention is described next. In the present embodiment, a limiter circuit is added to the oscillation frequency control part 100 same as that of each of the above-mentioned first through fourth embodiments of the present invention. This limiter circuit may be built in the operational amplifier 101 for voltage-to-current conversion, or may be provided on the input side or the output side of the voltage-to-current converting circuit separately.

Figure 6:
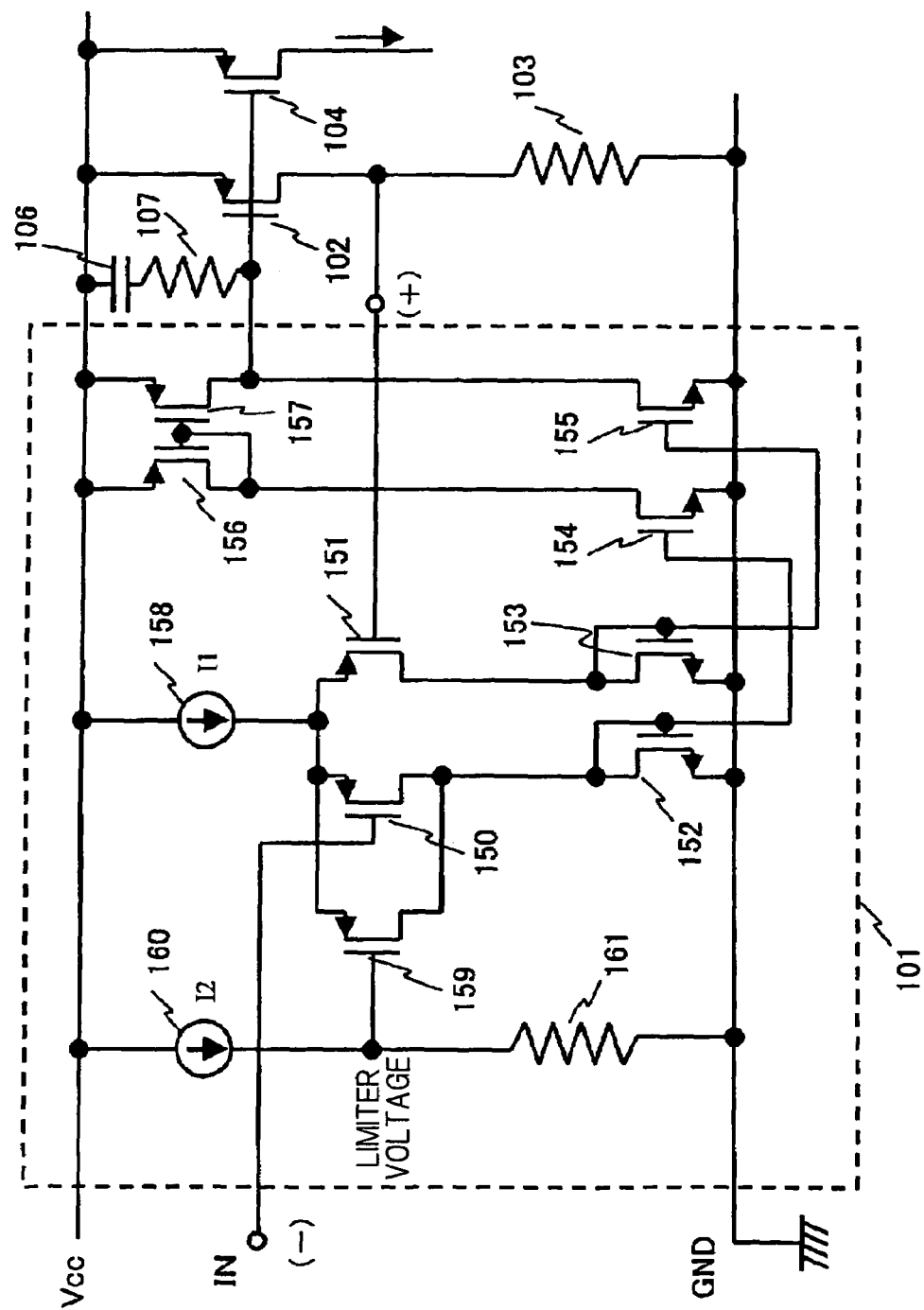
FIG. 6 shows a circuit diagram illustrating a fifth embodiment of a voltage controlled oscillator according to the present invention.

FIG. 6 shows one example of the operational amplifier 101 having the limiter circuit built therein. As shown in the figure, basic circuit devices of the operational amplifier 101 are a constant current source 158, p-channel MOS-FETs

150, 151, 156, 157 and n-channel MOS-FETs 152 through 155. The constant current source 158 and the n-channel MOS-FETs 150 and 151 configure a differential amplifier, and the output thereof is returned by the n-channel MOS-FETs 152 through 155 and the p-channel MOS-FETs 156 and 157. A drain of the n-channel MOS-FET 157 is drawn out as an output of the operational amplifier 101.

Figure 7:
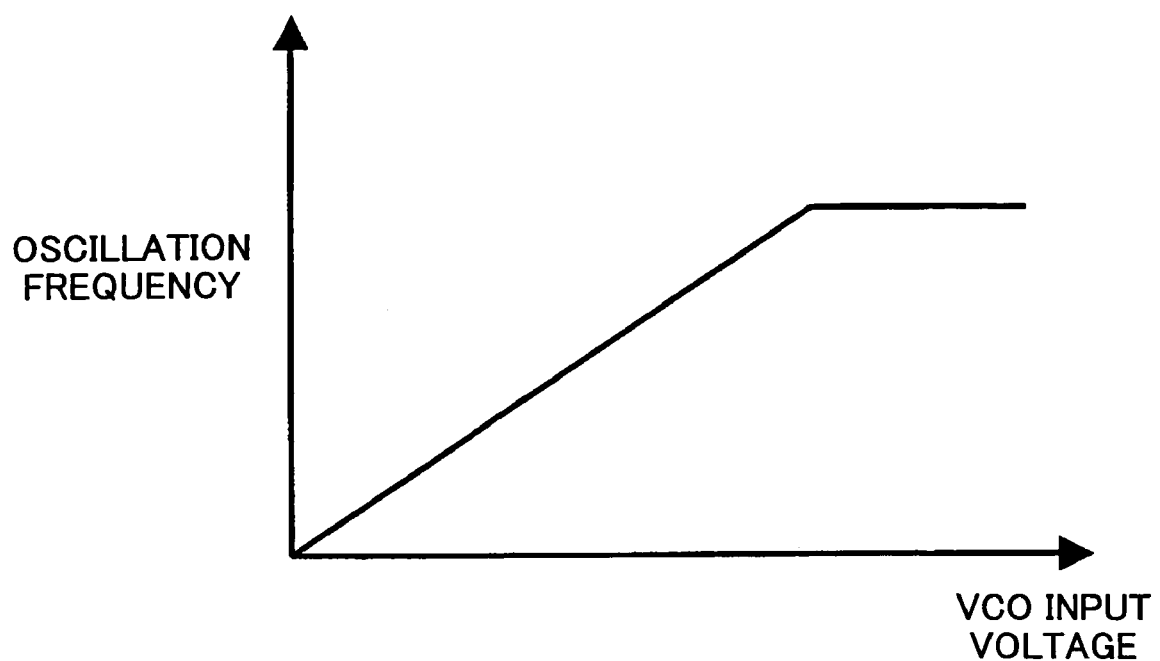
FIG. 7 shows characteristics of an oscillation frequency with respect to a VCO input voltage in the fifth embodiment shown in FIG. 6.

A constant current source 160, a resistor 161 and an n-channel MOS-FET 159 configure the limiter circuit. Even when a reference voltage (limiter voltage) defined by a current value of the constant current source 160 and a resistance value of the resister 161 is exceeded by the VCO input voltage, the drain current of the n-channel MOS-FET 102 does not increase further. Accordingly, characteristics of the oscillation frequency with respect to the VCO input voltage shown in FIG. 7 are obtained.

In many cases, a high-frequency clock signal generated by such a voltage controlled oscillator is used as a clock signal for a digital circuit after being divided in frequency. In this case, if the oscillation frequency in the voltage controlled oscillator becomes an unexpectedly very high frequency transitionally, the digital circuit may malfunction, and thus, may be damaged. In the voltage controlled oscillator according to the present embodiment, even the VCO input voltage increases to an abnormally high voltage due to noise or such, the VCO ring current is prevent from exceeding a predetermined value, and thus, the oscillation frequency is prevented from exceeding the predetermined maximum frequency. Accordingly, such a trouble can be positively avoided.

The resistor 161 for setting the limiter voltage and the resister 103 for voltage-to-current conversion may be those built in an integrated circuit, or those mounted externally. A built-in resistor has a high relative accuracy while having a not so high absolute accuracy, and thus, even if the resistance value varies, it is possible to achieve a high-accuracy limiter function although the limiter voltage itself varies.

Embodiments of a PLL circuit according to the present invention are described next. A feature of a PLL circuit according to the present invention is that the voltage controlled oscillator according to the present invention described above is employed therein as will be described now.

Figure 8:
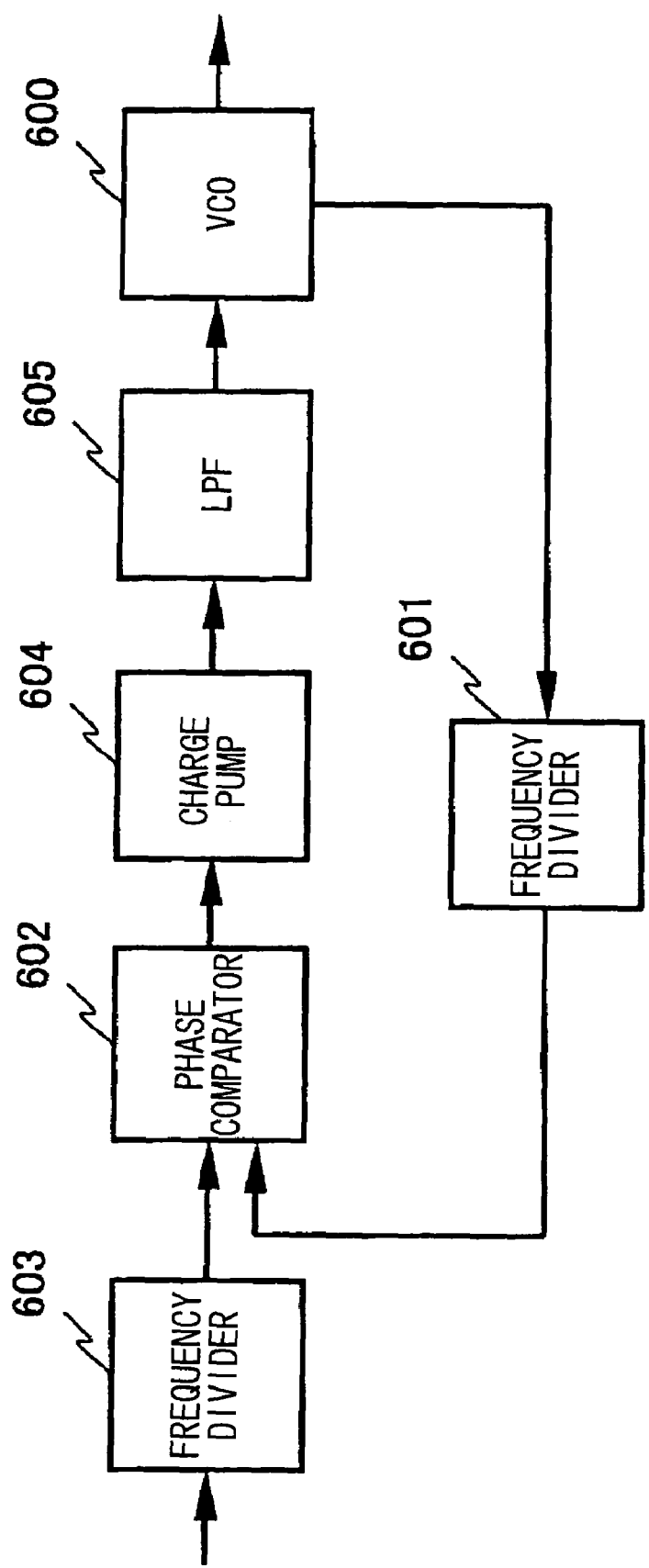
FIG. 8 shows a block diagram of one embodiment of a PLL circuit according to the present invention.

FIG. 8 shows a PLL circuit in a sixth embodiment of the present invention. As shown in the figure, a clock signal generated by a quartz oscillator or such not shown is divided in frequency in a frequency dividing circuit 603, and then, is input to a phase comparator 602 as a reference clock signal. Another clock signal taken out from any stage of a ring oscillator of a voltage controlled oscillator (VCO) 600 according to the present invention is also input to the phase comparator 602 as a comparative clock signal. The phase comparator produces a signal corresponding to a phase difference between the reference clock signal and the comparative clock signal, the thus-produced signal is sent to a loop filter (lowpass filter) 605 through a charge pump circuit 604, thereby a voltage corresponding to the phase difference between the reference clock signal and the comparative clock signal is generated, and the thus-generated voltage is input to the voltage controlled oscillator 600 as the VCO input voltage. Thus, the oscillation frequency in the voltage controlled oscillator 600 is controlled so that the comparative clock signal and the reference clock signal are made in phase, and thus, a clock signal in synchronization with the reference clock signal is generated therefrom. By changing the frequency dividing ratio in the frequency divider 603 and/or the frequency divider 601, it is possible to change the frequency of the thus-generated clock signal.

As the PLL circuit described above employs the voltage controlled oscillator 600 according to the present invention in which the necessary dynamic range can be secured while the gain can be lowered as described above, it is possible to provide the clock frequency in a wide range without increasing jitter. Furthermore, in a case the voltage controlled oscillator according to the fifth embodiment of the present invention including the limiter circuit is employed as the voltage controlled oscillator 600, it is possible to avoid generation of the clock signal having an unexpectedly abnormally high frequency. Accordingly, it is possible to avoid malfunction or failure in a digital circuit which uses the clock signal thus generated due to such an abnormal clock signal.

A configuration, different from that shown in FIG. 8, in which the clock signal generated by the voltage controlled oscillator 600 is directly input to the phase comparator 602 as a comparative clock signal without passing through the frequency divider 601, and also, the clock signal generated by a quartz oscillator or such not shown is directly input to the phase comparator 602 as a reference clock signal without passing through the frequency divider 603 is also included in the present invention.

Figure 9:
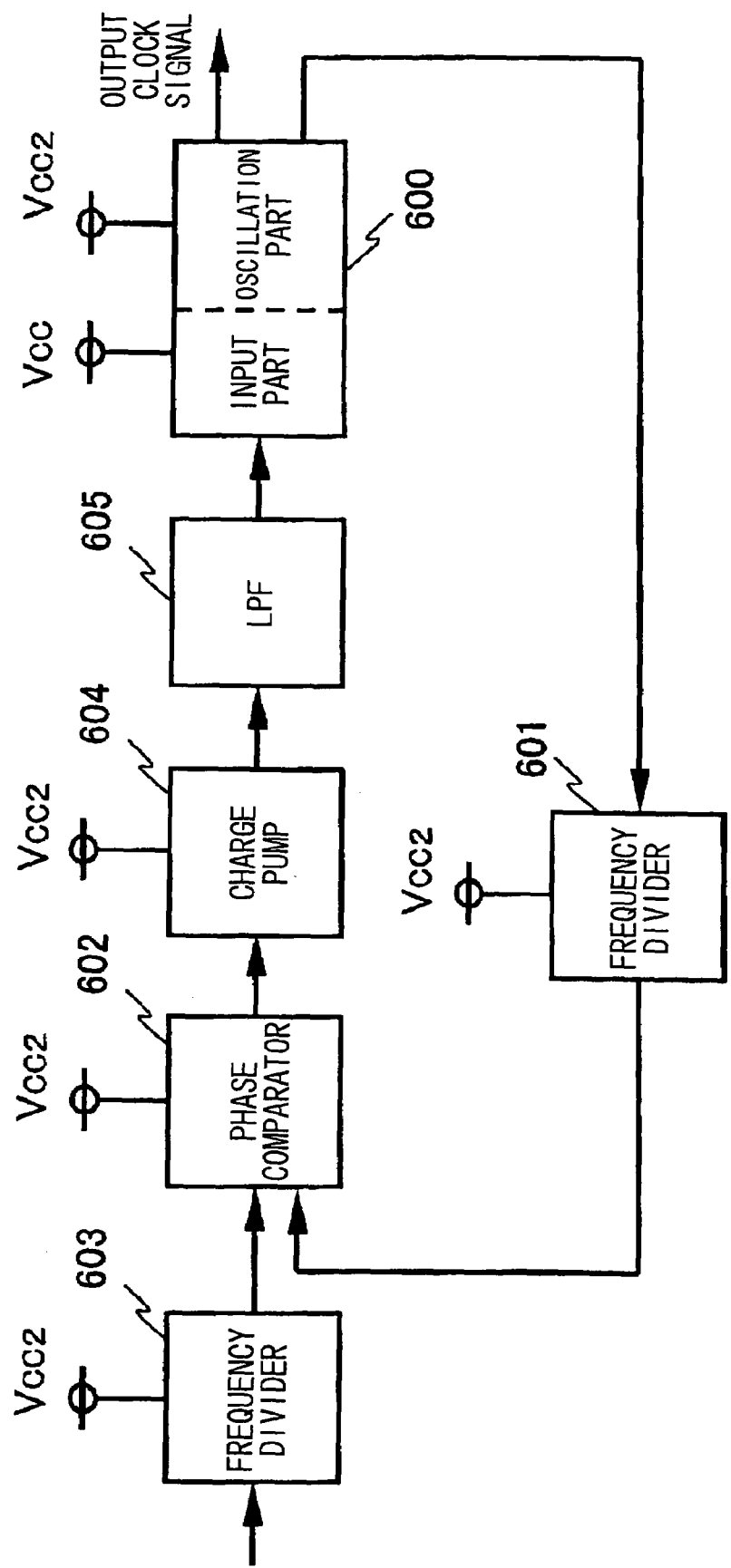
FIG. 9 shows a block diagram of another embodiment of a PLL circuit according to the present invention.

A seventh embodiment of the present invention is described next. In the present embodiment, a PLL circuit employs the voltage controlled oscillator shown in FIG. 4 or 5, with reference to FIG. 9. In FIG. 9, the same reference numerals are given to the same circuit devices as those shown in FIG. 8.

As shown in FIG. 9, in the PLL circuit, a power source voltage Vcc is provided to the oscillation frequency control part (referred to as INPUT PART in the figure) in the voltage controlled oscillator 600, while a power source voltage Vcc2 which is lower than the power source voltage Vcc is provided to the oscillating circuit part (ring oscillator part, referred to as OSCILLATION PART in the figure), the frequency dividers 601 and 603, the phase comparator 602 and the charge pump 604. In this configuration, the wide dynamic range of the control voltage in the voltage controlled oscillator 600 from 0 V to Vcc can be secured, while increase in the gain is controlled, and also, a high speed operation with a high frequency can be performed. For example, in a case where Vcc is 3.3 V, and Vcc2 is 1.8 V, it is possible to utilize the entire dynamic range of the control voltage in the voltage controlled oscillator from 0 V to 1.8 V.

An eighth embodiment of the present invention is described next with reference to FIGS. 10 and 11. In the embodiment, a PLL circuit employs the voltage controlled oscillator shown in FIG. 4 or 5.

Figure 10:
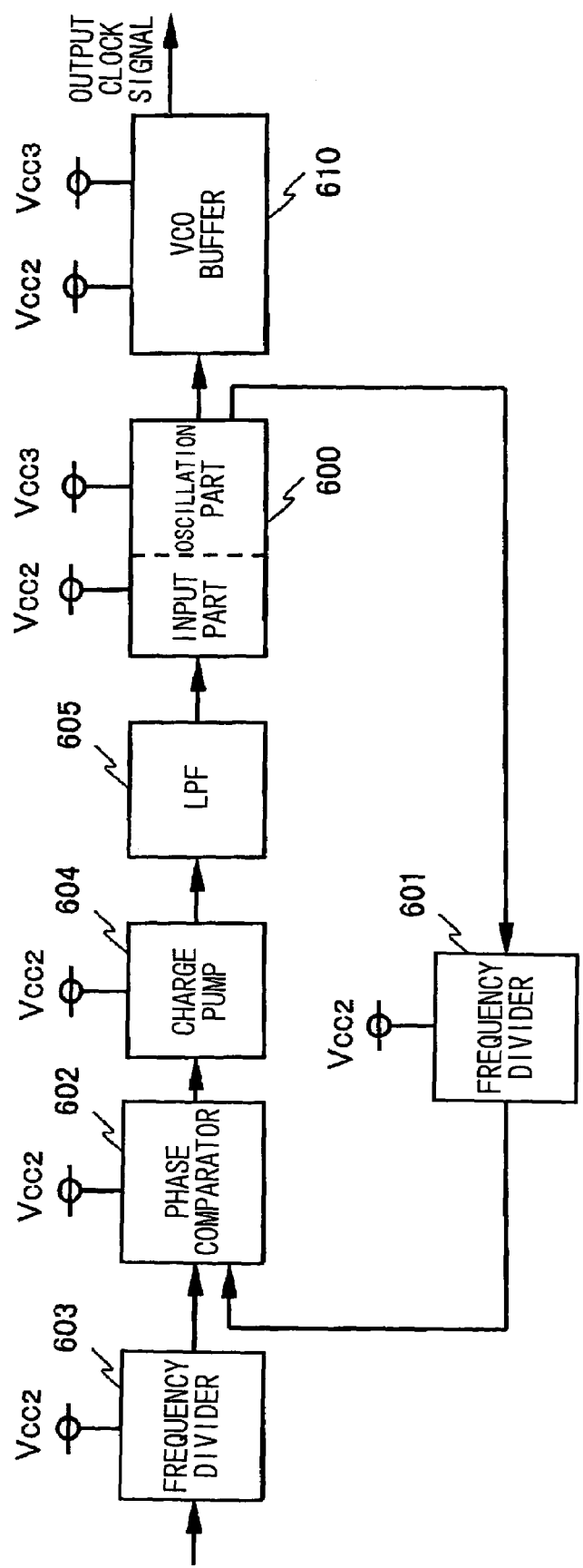
FIG. 10 shows a block diagram of another embodiment of a PLL circuit according to the present invention.

In FIG. 10, the same reference numerals are given to the same circuit devices as those shown in FIG. 8. In the PLL circuit shown, in order to control an oscillation frequency fluctuation (jitter) otherwise occurring due to the power source voltage fluctuation in the oscillating circuit part (ring oscillator part) of the voltage controlled oscillator 600, a power source voltage Vcc3 is provided to the oscillating circuit part (ring oscillator part, referred to as OSCILLATION PART in the figure) of the voltage controlled oscillator 600 from a power source, having well reduced noise, which power source is independent from a digital power source supplying a power source voltage Vcc2 to the oscillation frequency control part (referred to as INPUT PART in the figure) in the voltage controlled oscillator 600 and so forth as shown in the figure. Vcc3 and Vcc2 may be the same potential or different potentials. Even the respective power sources are set so that Vcc3 and Vcc2 have the same potential, a phase error may occur in output clock signals since the potentials may differ from one another slightly between Vcc3 and Vcc2. In order to avoid such a phase error in the output clock signals, a VCO buffer circuit 610 is added in the present PLL circuit, buffering between the power sources with the use of a level shift circuit in the VCO circuit buffer 610.

Figure 11:
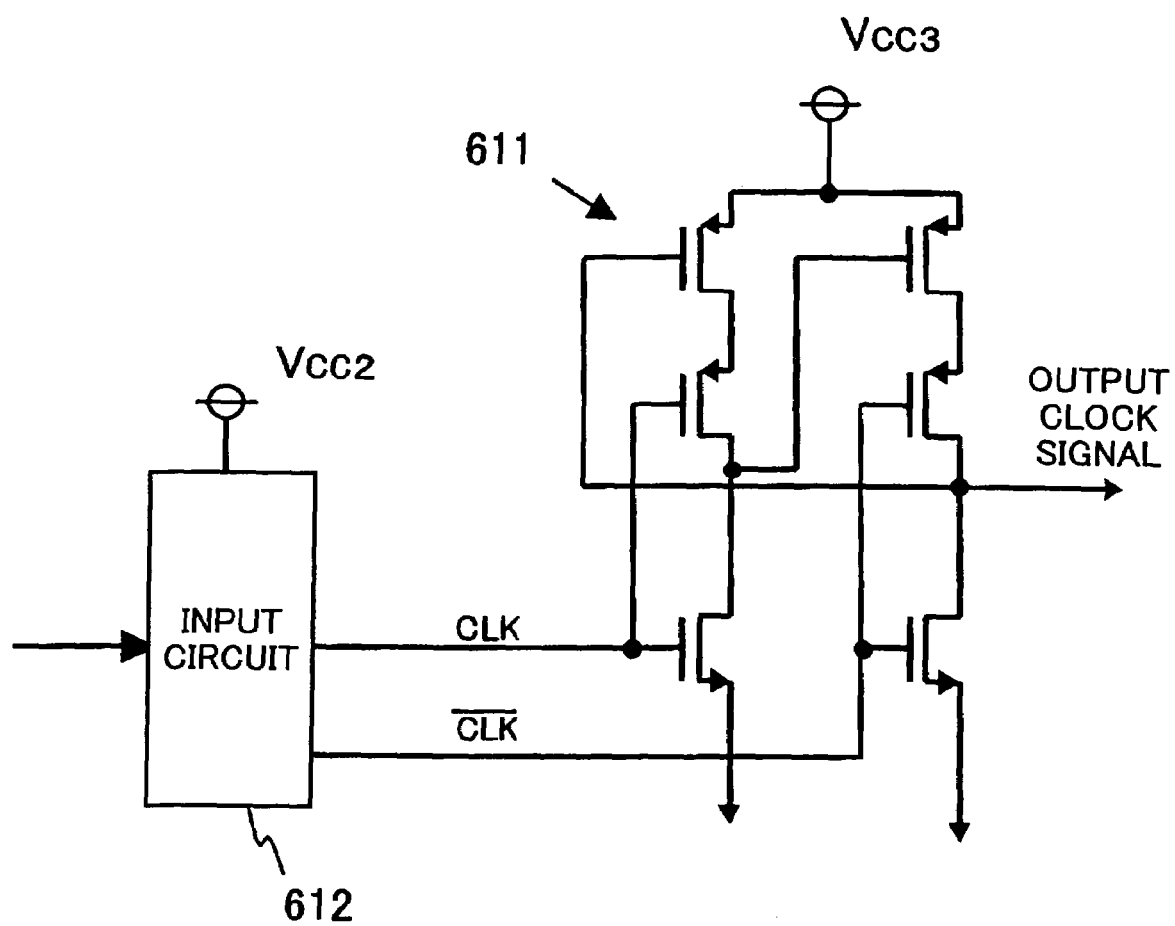
FIG. 11 shows a circuit diagram illustrating a VCO buffer circuit shown in FIG. 10.

FIG. 11 shows one example of the above-mentioned VCO buffer circuit 610 shown in FIG. 10. As shown in FIG. 11, this circuit 610 includes a well-known level shift circuit 611, to which the power source voltage Vcc3 is provided. An input circuit 612 is used for inputting two clock signals having phases reversed from one another to the level shift circuit 611, and has the power source voltage Vcc2 provided thereto. The input circuit 612 includes two pairs of inverters (or, a series of inverters), or one pair of differential inverters (or a series of differential inverters), and has two clock signal having phases reversed from one another input thereto from the voltage controlled oscillator 600.

A pulse modulation signal generating circuit in an embodiment of the present invention is described next. The pulse modulation signal generating circuit is suitable for generating a pulse modulation signal for modulating a semiconductor laser used as a light source in an image forming apparatus.

In the related art, a pulse width modulation method is generally used as a method of modulating optical output of a semiconductor laser, a triangle waveform or a sawtooth waveform is generated according to each pulse generation period, and a pulse width modulation signal is obtained from comparing the triangle or sawtooth waveform with an analog video signal with the use of a comparator, for example. In another example, a high frequency clock signal is generated, a delay pulse is generated as a result of dividing the frequency of the clock signal in a digital manner, and a pulse width modulation signal is generated as a result of logical sum or logical product being obtained therefrom. However, a problem may occur in these methods in the related arts according to increase in operation speed in a laser printer, a digital copier or another image forming apparatus. Specifically, in the former method, it may be difficult to both secure linearity and reproducibility in the triangle waveform or the sawtooth waveform and to increase the operation speed. In the latter method, it may be difficult to both secure image tone gradation finally obtained and to increase the operation speed.

In the pulse modulation signal generating circuit according to the present invention, it is possible to generate a high-speed pulse modulation signal with a desired pattern even with a simple configuration. By utilizing a pulse modulation signal generated by means of a pulse modulation signal generating circuit according to the present invention to modulate a semiconductor laser in an image forming apparatus, it is possible to finally form a stable and fine-tone-gradation image in which fluctuation in recording dots is well controlled even when the operation speed is high in the machine.

Figure 12:
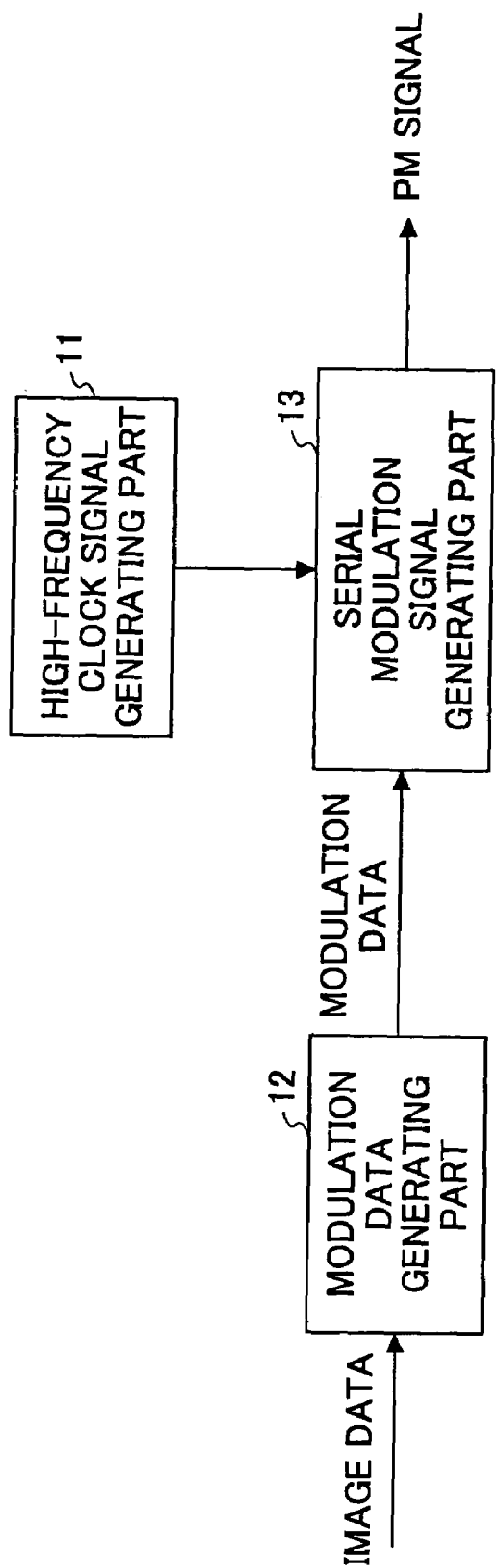
FIG. 12 shows a general conceptual diagram of a pulse modulation signal generating circuit according to the present invention.

FIG. 12 shows a basic conceptual diagram of such a pulse modulation signal generating circuit according to the present invention. This pulse modulation signal generating circuit includes a high-frequency clock signal generating part 11, a modulation data generating part 12 and a serial modulation signal generating part 13 as shown.

The high-frequency clock signal generating part 11 generates a high-frequency clock signal(s) in a single phase or multiple phases having a frequency higher than a frequency of a reference period corresponding to one dot called an image clock signal needed in an image forming apparatus in general. A PLL circuit according to the present invention described above is used in this high-frequency clock signal generating part 11. The modulation data generating part 12 generates modulation data expressing a desired bit pattern based on image data given externally from an image processing unit or such. The serial modulation signal generating part 13 converts the modulation data provided by the modulation data generating part 12 based on the high-frequency clock signal into a serial pulse series, and outputs it as a pulse modulation signal PM.

A feature of the pulse modulation signal generating circuit according to the present invention is that, as described above, the modulation data is input to the serial modulation signal generating part 13, which then generates the pulse modulation signal PM which is a serial pulse series according to a bit pattern of the modulation data based on the high-frequency clock signal having the frequency remarkably higher than the image clock signal. As will be described later, it is possible to achieve the serial modulation signal generating part 13 with a simple configuration with the use of a shift register, and this is also a feature of the configuration according to the present invention. Jitter in the high-frequency clock signal provided to the serial modulation signal generating part 13 from the high-frequency clock signal generating part 11 becomes jitter in the pulse modulation signal generated therefrom. Accordingly, it is necessary to effectively reduce jitter from the high-frequency clock signal. Since the PLL circuit according to the present invention can provide a high-frequency clock signal with effectively reduced jitter as mentioned above, it is possible to provide the high-frequency clock signal with effectively reduced jitter to the serial modulation signal generating part 13 when the PLL circuit according to the present invention is used in the high-frequency clock signal generating circuit 11 to generate the high-frequency clock signal. Thereby, it is possible to finally generate the serial modulation signal with effectively reduced jitter.

Figure 13:
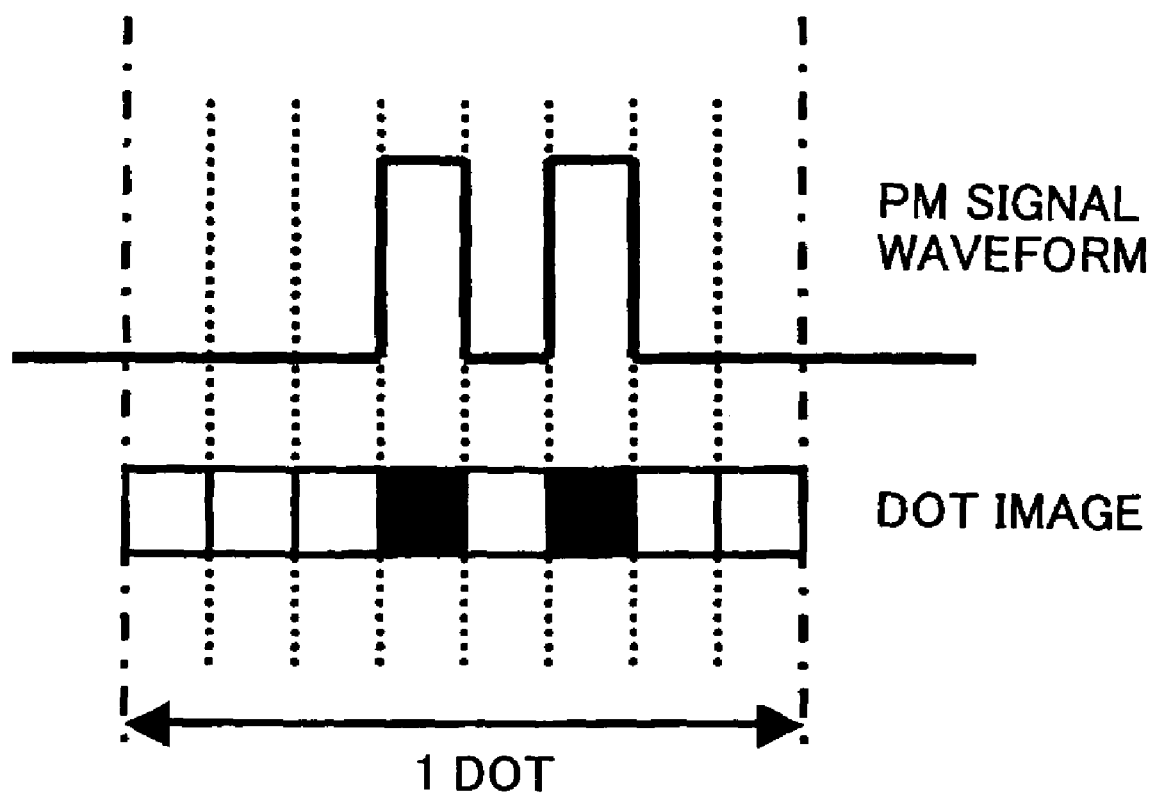
FIG. 13 shows a dot image of a pulse modulation signal according to the present invention.

FIG. 13 illustrates image of pulse series output in the pulse modulation signal generating circuit according to the present invention. There, for the purpose of simplification of the description, image of outputting a pulse series corresponding to a single dot is shown. In a case where a single dot is produced by eight pulses as in FIG. 13, where a pulse series is output pulse by pulse serially, by setting each of the eight pulses as ON (for example, black) or OFF (white, in the example) arbitrarily, it is possible to output desired pulses at positions within the single dot. It is noted that the present invention is not limited to such a way for a single dot width.

Figure 14:
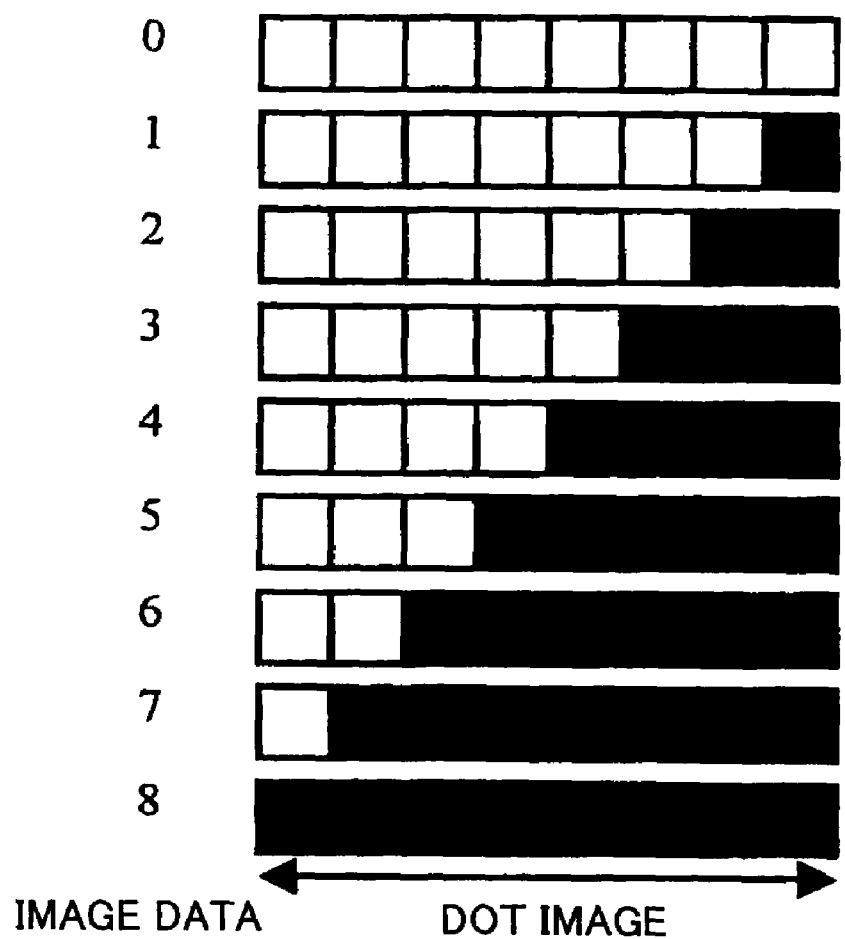
FIG. 14 shows dot images of a pulse width modulation signal in the prior art.
Figure 15:
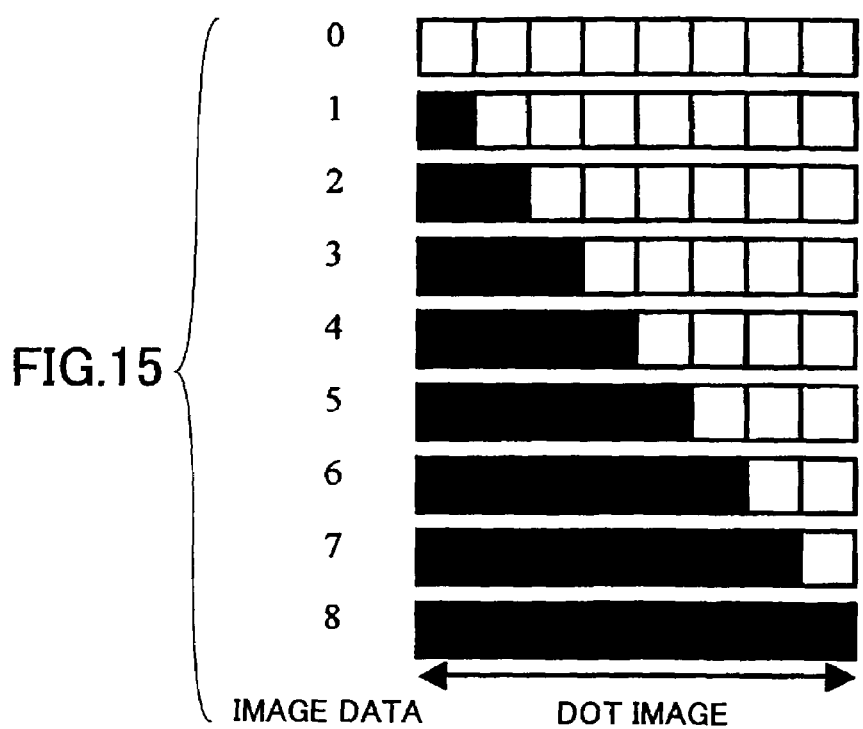
FIG. 15 shows other dot images of a pulse width modulation signal in the prior art.
Figure 16:
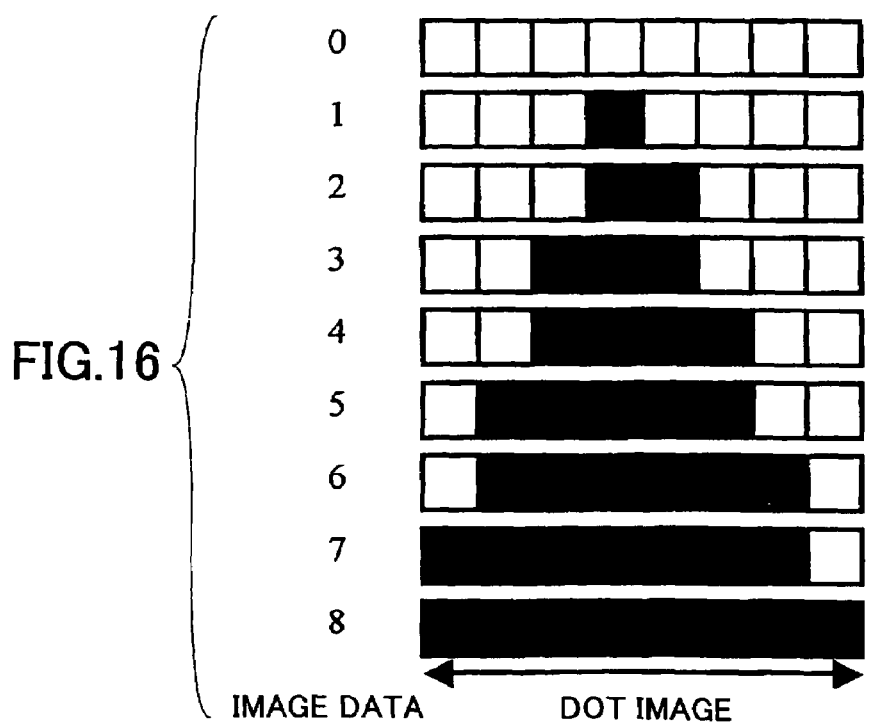
FIG. 16 shows other dot images of a pulse width modulation signal in the prior art.

FIGS. 14 through 16 show examples of pulses (in image) generated by a pulse width modulation circuit according to the related art. FIG. 14 shows an example where black (ON) pulses are set from the right end at any time. FIG. 15 shows another example in which black pulses are set from the left end at any time. FIG. 16 shows another example in which black pulses are set from the center at any time. Thus, according to the related art, it is not actually possible to set a desired pulse at a desired position within one dot. Even if such setting is made possible in the related art, a complicated configuration is needed.

Figure 17:
FIG. 17 shows a specific example of dot images of a pulse modulation signal according to the present invention.

FIG. 17 shows pulse output image according to the present invention. There, since description becomes complicated if the number of pulses increases, a pulse output example in which four pulses P1 through P4 produce one dot is made to correspond to image data (four bits). As shown in FIG. 17, according to the present invention, since it is possible to output a pulse (black pulse or ON pulse) at any position in one dot, total 16 ($2^4$=16) patterns of pulse series output are available with the use of the four pulses P1 through P4. Similarly, 32 ($2^5$=36) patterns are available with the use of five pulses, or, 64 ($2^6$=36) patterns are available with the use of six pulses, . . .

The modulation data (bit pattern) for outputting such a pulse series can be easily produced with the use of a lookup table (LUT) in the modulation data generating part 12 according to the present invention.

Figure 18:
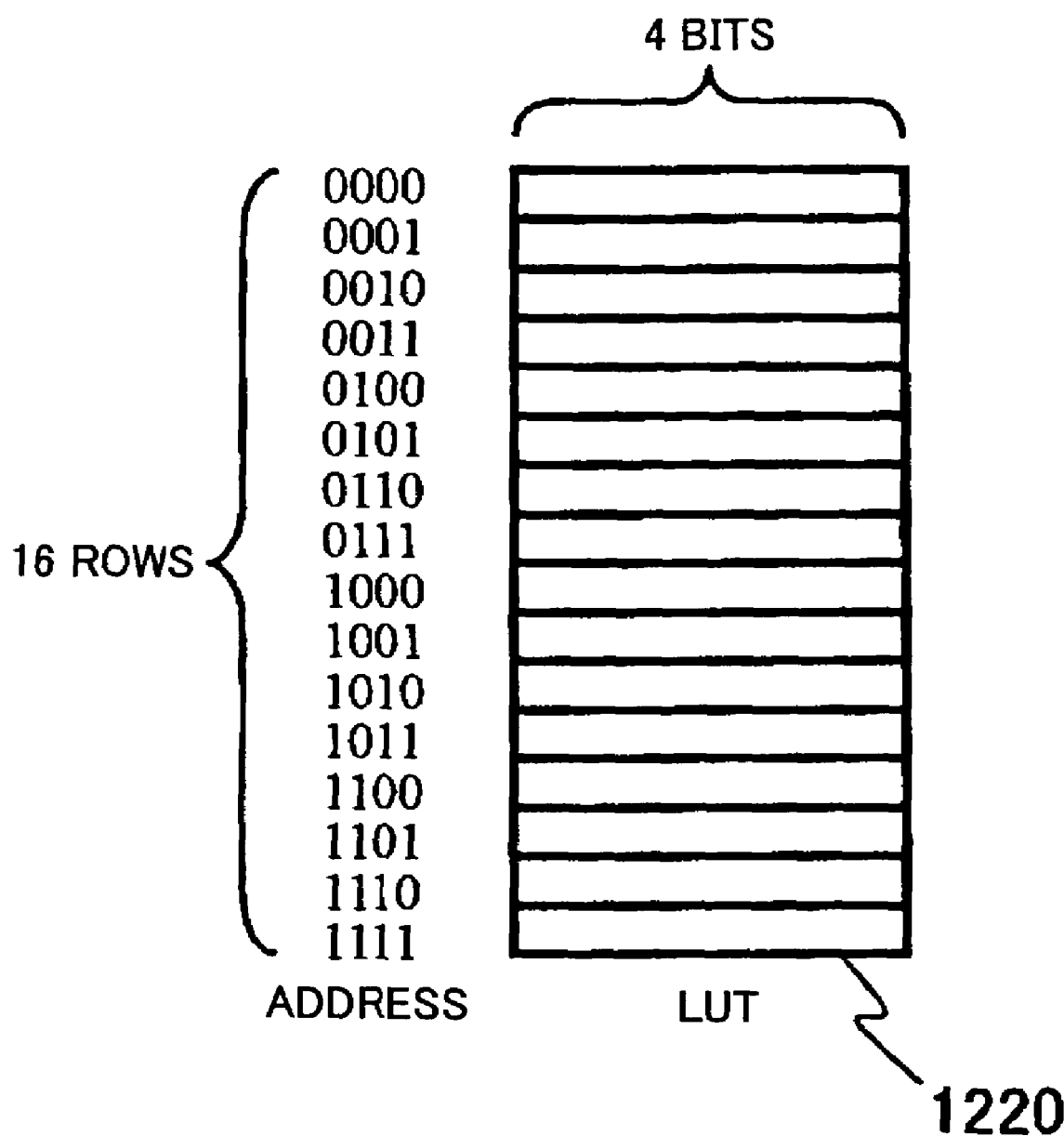
FIG. 18 shows an example of a configuration of a lookup table (LUT) for generating modulation data.

FIG. 18 shows an example of a configuration of a lookup table (LUT) 1220 for generating 16 patterns of four bits, i.e., four pulses P1 through P4 shown in FIG. 17. As shown in FIG. 18, the lookup table 1220 includes 64 bits, i.e., 4 bits (horizontally)×16 rows (vertically), and 16 addresses, i.e., from 0000 through 1111. Accordingly, it is possible to output a bit series (pulse series) P1 through P4 in a desired pattern from the LUT by inputting image data in a form of the address signal thereto. Further, as can be seen from FIG. 17, the bit pattern is inverted between the image data of '0000' and the image data of '1110'. Similarly, the bit pattern is inverted between '0001' and '0100', for example. By utilizing this phenomenon, with the use of a bit of the total four bits of image data as an inverting signal, the LUT 1220 does not need 16 rows but merely needs 8 rows. Thus, by using the inverting signal, it is possible to halves the required memory capacity for the LUT 1220.

The LUT may be configured with the use of any memory such as a ROM, a DRAM, an SRAM, or such. For example, when a DRAM is used, it is advantageous to miniaturize a device according to the present invention in a case where the device is produced in a form of an ASIC. When an SRAM is used on the other hand, it is advantageous to increase the operation speed of the device.

Figure 19:
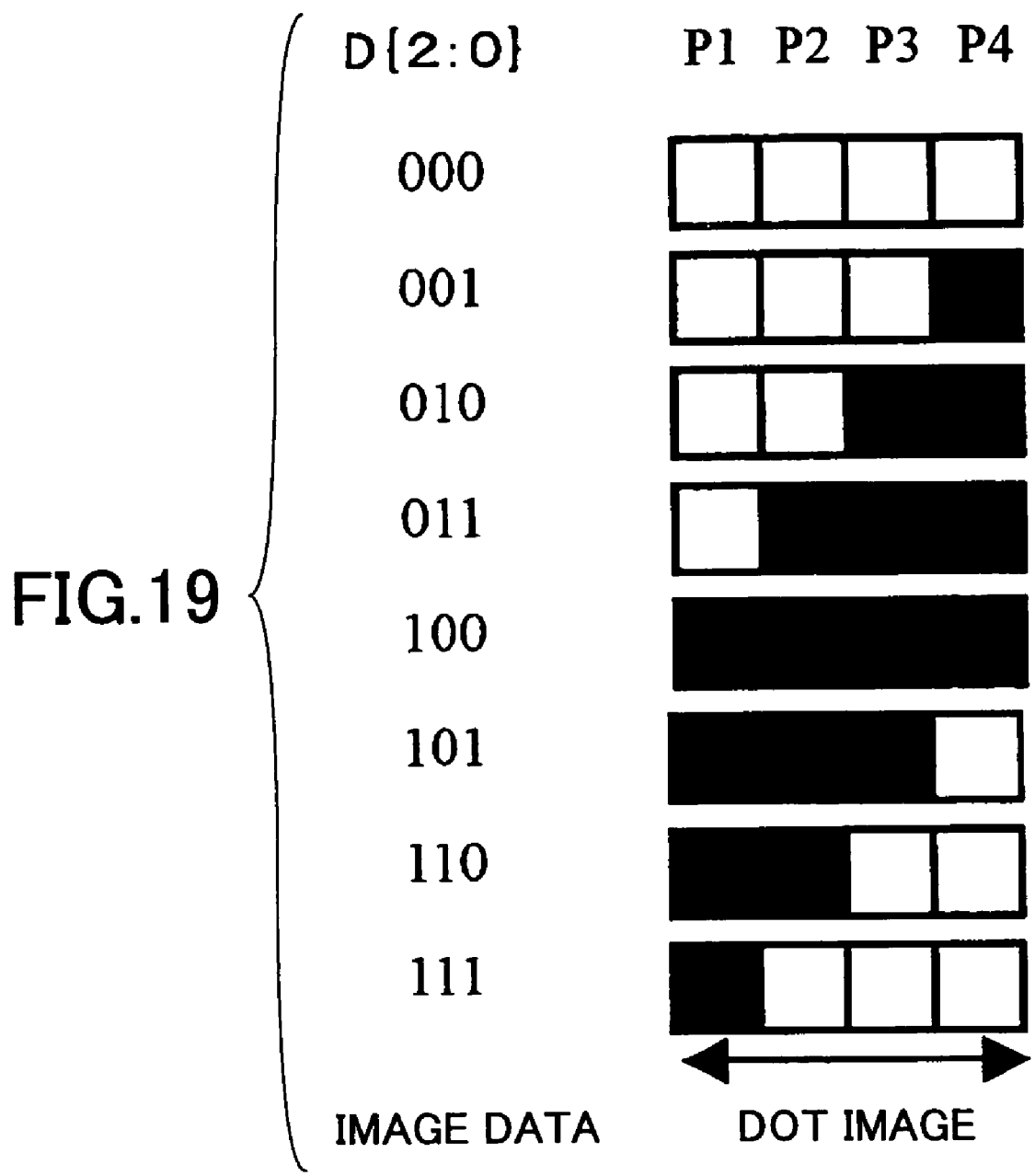
FIG. 19 illustrates a decoder for generating modulation data.

However, the modulation data generating part 12 should not necessarily have a configuration of an LUT as mentioned above. For example, it is also possible to configure the modulation data generating part 12 with a decoder. This case is described next with reference to FIG. 19. FIG. 19 shows image in which 8 sorts of pulse series with the use of four bits, i.e., 4 pulses P1 through P4 are output for 3-bit image data given. Assuming that D2, D1 and D1 denote the respective bits of the image data of three bits from the MSB, logic in the decoder is as follows:

$P1=D2$ $P2=D2B \cdot D1 \cdot D0+D2 \cdot D1B+D2 \cdot D1 \cdot D0B$ $P3=D2B \cdot D1+D2 \cdot D1B$ $P4=D2B \cdot D1B \cdot D0+D2B \cdot D1 \cdot D2 \cdot D1B \cdot D0B$ There, D0B, D1B and D2B denote inverted ones of D0, D1 and D2, respectively. The decoder having this logic can be easily achieved from a combination of logic gates such as those of AND, OR or such.

The serial modulation signal generating part 13 has modulation data input thereto from the modulation data generating part 12 configured by the LUT, the decoder or such as mentioned above, converts it into a serial pulse series, and outputs it in synchronization with the high-frequency clock signal. This serial modulation data signal generating part 13 can be easily configured with the use of a shift register in a type having parallel input and serial output.

Figure 20:
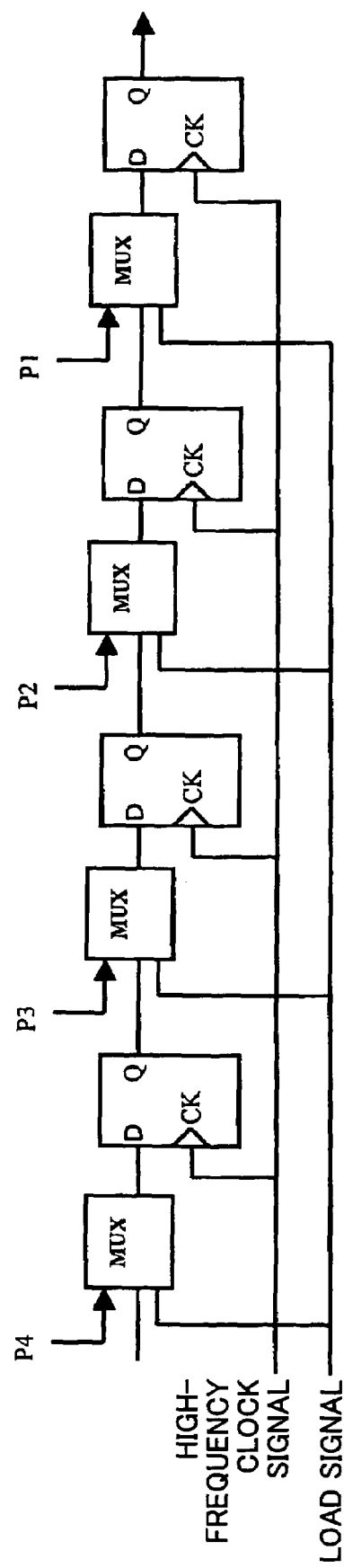
FIG. 20 shows a block diagram of an example of a shift register used in a serial modulation signal generating part.
Figure 21:
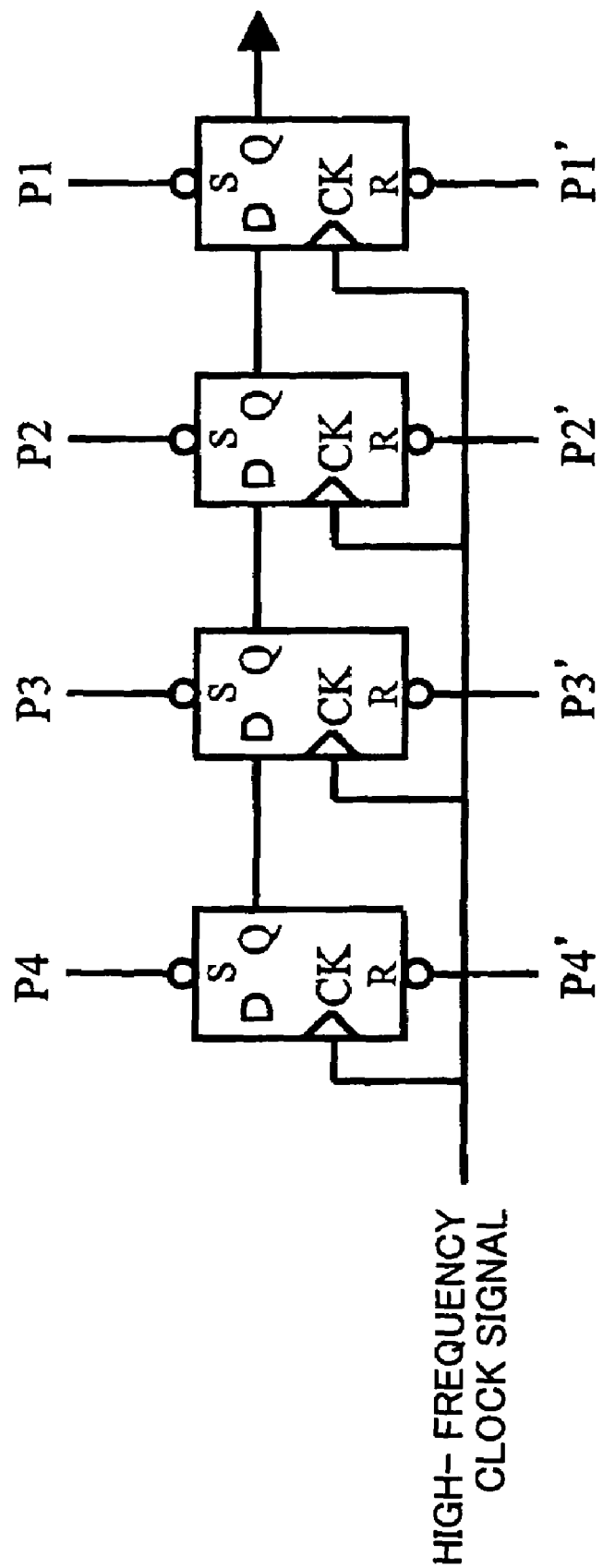
FIG. 21 shows a block diagram of another example of a shift register used in a serial modulation signal generating part.

In a case where the high-frequency clock signal in a single phase is used and a serial modulation signal made of four pulses P1 through P4 is produced, a shift register such as that shown in FIG. 20 or 21 may be used. The shift register shown in FIG. 20 includes a multiplexer (MUX) and synchronization-type D-flip flops. In this configuration, after respective bits of P1 through P4 are loaded on the flip flops in the respective stages via the MUX in response to a load signal (LOAD), the respective bits are shifted and output serially in synchronization with the high-frequency clock signal one by one in sequence. The shift register shown in FIG. 21 includes synchronization-type D-flip flops having asynchronous RS input terminals. In this configuration, the respective bits of P1 through P4 and inverted bits thereof. P1' through P4' are input to set input terminals (S) and reset input terminals (R) of the flip flops in the respective stages as shown. Then, as the set input values and the reset input values are held as "1" after the respective bits of P1 through P4 are loaded on the flip flops in the respective stages, the respective bits are shifted and output serially one by one in sequence in synchronization with the high-frequency clock signal.

Embodiments of the pulse modulation signal generating circuit according to the present invention are described next.

Figure 22:
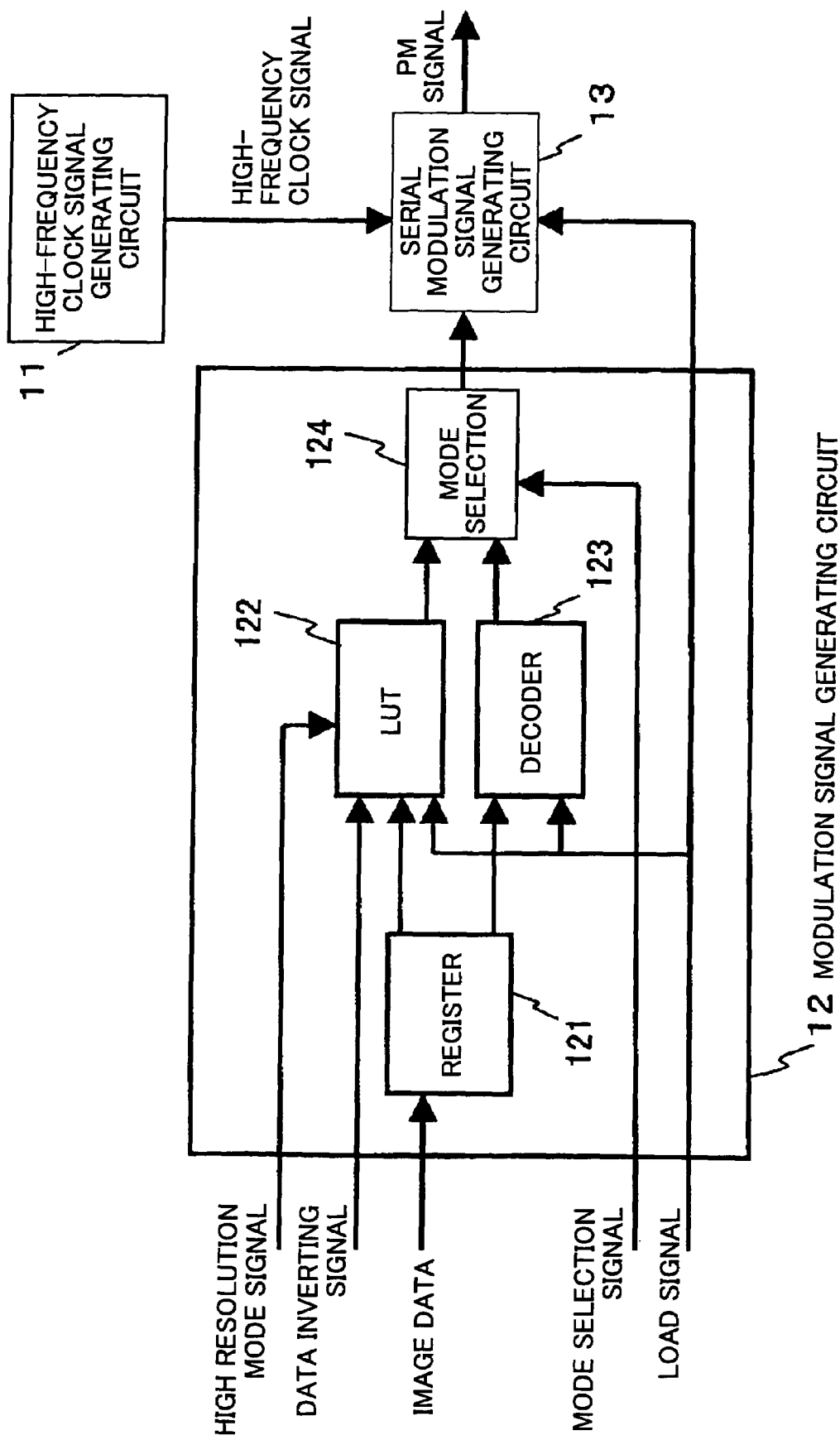
FIG. 22 shows a block diagram illustrating an embodiment a pulse modulation signal generating circuit according to the present invention.

A ninth embodiment of the present invention is described next. FIG. 22 shows a block diagram illustrating a pulse modulation signal generating circuit in the ninth embodiment of the present invention. By embodying such a pulse modulation signal generating circuit in a form of a single chip of an ASIC, it is possible to save energy, to achieve miniaturization and to reduce the costs of the device.

As shown in FIG. 22, the modulation data generating part 12 includes a register 121, an LUT 122, a decoder 123 and a mode selecting circuit 124. Image data input externally is held by the register 121, and then, is input to both the LUT 122 and the decoder 123 in timing of a LOAD signal. Each of the LUT 122 and the decoder 123 independently converts the image data into modulation data of a desired bit pattern (pulse pattern). The mode selecting circuit 124 responds to a mode selection signal for selecting any of the modulation data output from the LUT 122 and the modulation data output from the decoder 123, and outputs the selected one to the serial modulation signal generating part 13.

Thus, in this configuration, one of the outputs of the LUT 122 and the decoder 123 is selected, and thus, it is possible to improve the flexibility in operation. In other words, it is possible to generate various modulation data with respect to input image data. However, it is also possible that only one of the LUT 122 and the decoder 123 is provided in such a configuration.

Furthermore, by adopting a configuration in which, as described with reference to FIG. 18, a data inverting signal is input, it is possible to effectively reduce a required memory capacity. Further, it is also possible to adopt a configuration in which a plurality of LUTs 122 are provided, a high resolution mode signal is used, a pulse series is output a plurality of times one by one serially from the plurality of LUTs, and thus, it is possible to output a longer pulse series without increasing the memory of the LUT 122. Such a case will be described later in detail.

In the simplest configuration, the serial modulation signal generating part 13 can be embodied by a signal line of shift register as shown in FIG. 20 or 21, and such a configuration is included in the present invention. However, it is preferable to use two or more then two lines of shift registers for the purpose of generating a pulse modulation signal at high frequency with a larger number of bits. Generally speaking, in a case where M lines of shift registers are used to configure the serial modulation signal generating part 13, high-frequency clock signals in M phases should be generated by the high-frequency clock generating part 11, and be provided to the serial modulation signal generating part 13, for example.

Figure 23:
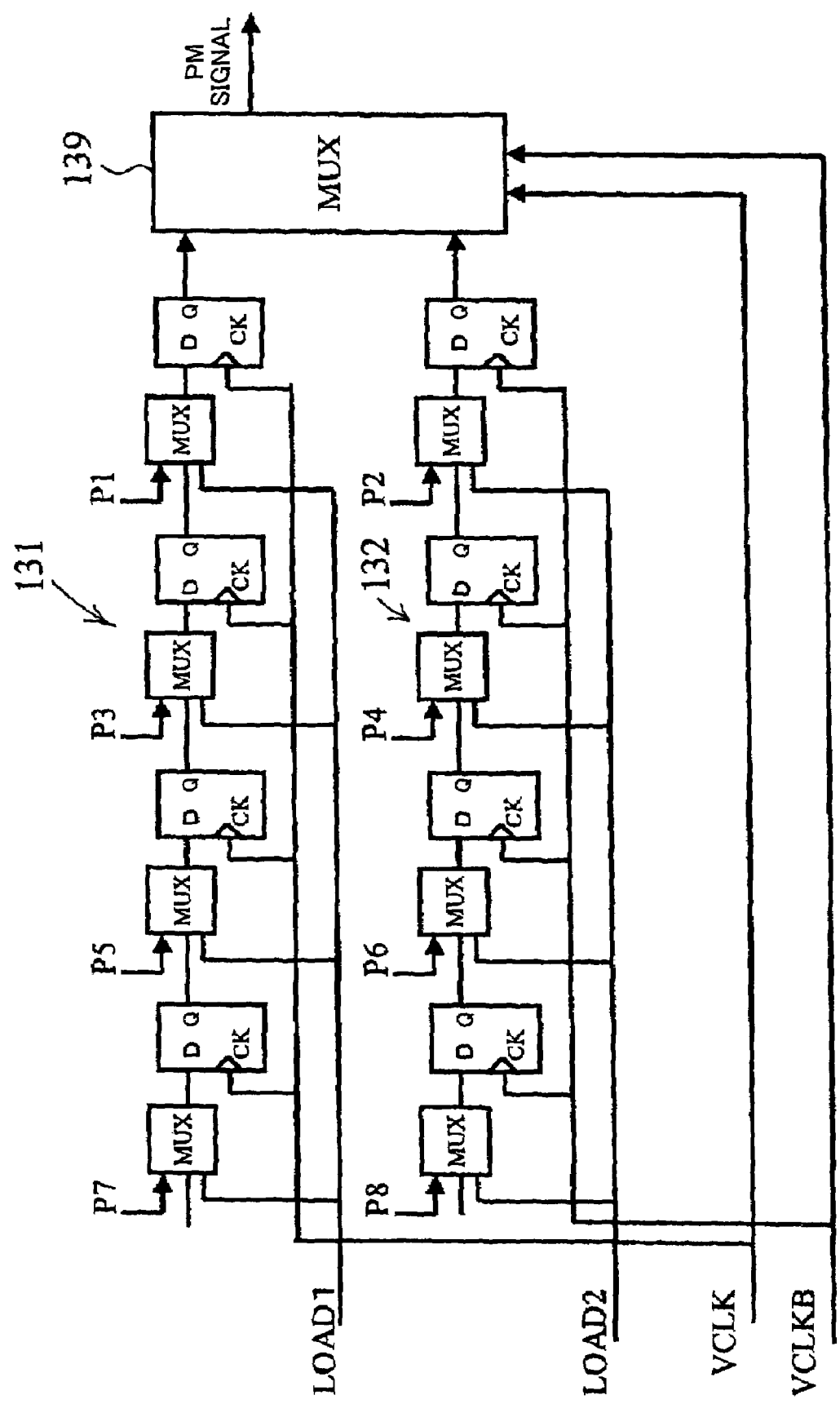
FIG. 23 shows a block diagram of an example of a configuration of a serial modulation signal generating part.

FIG. 23 shows an example of a configuration of the serial modulation signal generating part 13 in which two lines of shift registers each of which is of four bits as that shown in FIG. 20 are used. In this configuration, a high-frequency clock signal VCLK and a LOAD1 signal in synchronization therewith are input to a shift register 131, while a clock signal VCLKB which is an inverted one of the high-frequency clock signal VCLK and a LOAD2 signal in synchronization therewith are input to a shift register 132. Modulation data is of 8 bits (P1 through P8). Odd bits thereof are loaded on the shift register 131 in timing of the LOAD1 signal while even bits thereof are loaded on the shift register 132 in timing of the LOAD2 signal, and the modulation data thus loaded is shifted in sequence with the high-frequency clock signals VCLK and VCLKB. A multiplexer (MUX) 139 selects one of output bits of the shirt reregisters 131 and 132 in sequence in timing of the respective high-frequency clock signals, and outputs the selected one. Accordingly, a pulse series is output serially from the MUX 139 in the order of P1, P2, P3, P4, P5, P6, P7 and P8.

Thus, in the configuration shown in FIG. 23, it is possible to generate the serial modulation signal at a frequency double with respect to the given high-frequency clock signal VCLK. In other words, it is possible to generate the serial pulse modulation signal of a higher resolution even with the same clock frequency given.

In this example of configuration, the high-frequency clock signals in two phases VCLK and VCLKB are needed. When the voltage controlled oscillator such as that shown in FIG. 3 or 5 is used as a voltage controlled oscillator in a PLL circuit used as the high-frequency clock signal generating part 11, it is possible to take directly such high-frequency clock signals in two phases different by the angle $\pi$ (180 degrees) from any stages of the differential inverters of the oscillating circuit part (ring oscillator part) in the voltage controlled oscillator. It is also possible to generate high-frequency clock signals in a single phase by a PLL circuit, and then to generate necessary clock signals in two phases such as those mentioned above by causing two of the high-frequency clock signal in the single phase to pass through an even number of inverters and an odd number of inverters, respectively.

Figure 24:
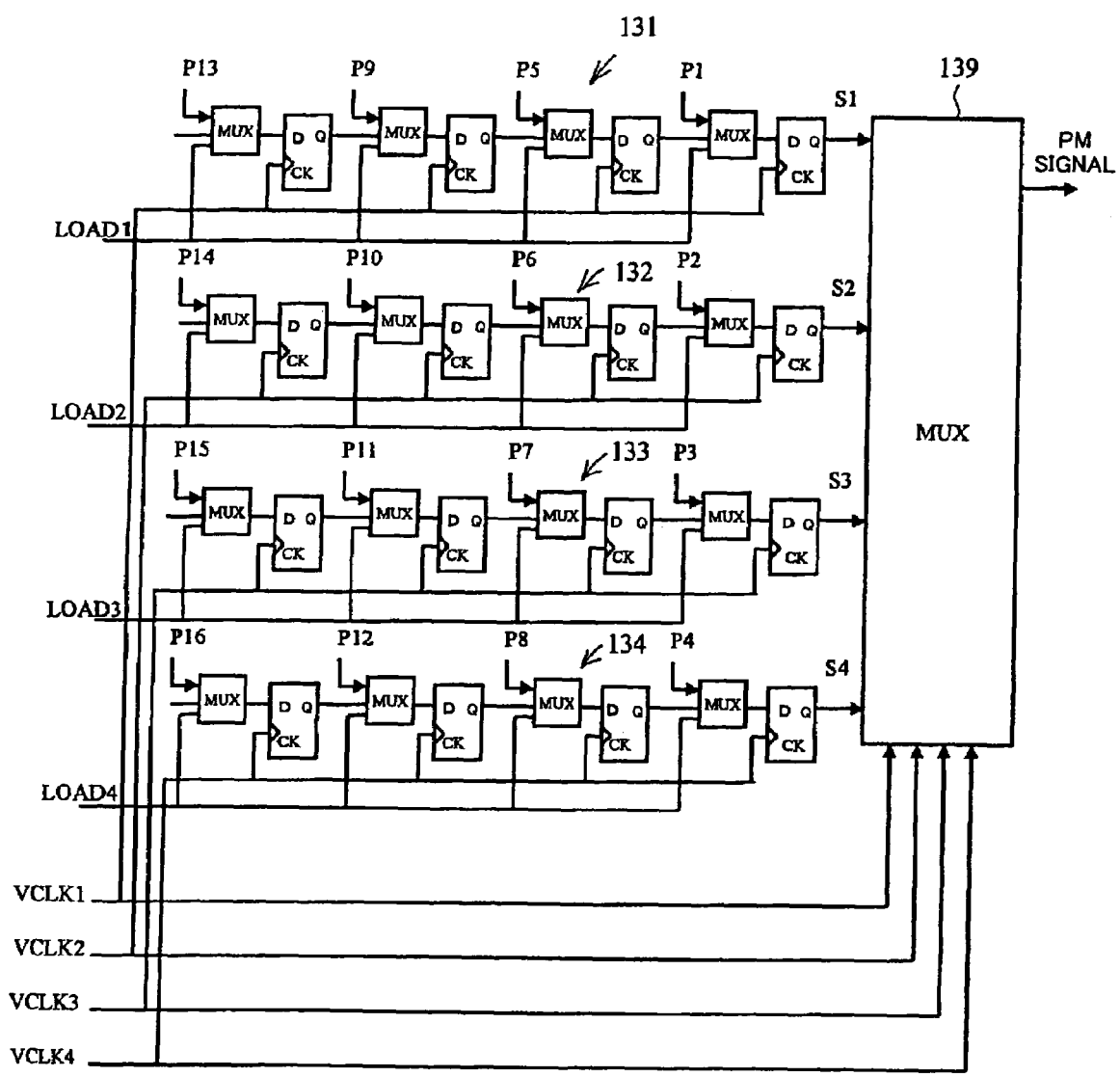
FIG. 24 shows a block diagram of another example of a configuration of a serial modulation signal generating part.

FIG. 24 shows an example of a configuration of the serial modulation signal generating part 13 in which four lines of shift registers each of which is of four bits as shown in FIG. 20 are employed. As clock signals for shifting respective shift registers 131, 132, 133 and 134, high-frequency clock signals in four phases VCLK1, VCLK2, VCLK3 and VCLK4 having phases different by the angle $\pi/4$ (90 degrees) each are used. In this case, modulation data is of 16 bits (P1 through P16), and are loaded on the shift registers 131 through 134 taking one of each four bits. Specifically, four bits of P1, P5, P9 and P13 are loaded on the shift register 131 in timing of a LOAD1 signal in synchronization with the clock signal VCLK1; four bits of P2, P6, P10 and P14 are loaded on the shift register 132 in timing of a LOAD2 signal in synchronization with the clock signal VCLK2; four bits of P3, P7, P11 and P15 are loaded on the shift register 133 in timing of a LOAD3 signal in synchronization with the clock signal VCLK3; and four bits of P4, P8, P12 and P16 are loaded on the shift register 134 in timing of a LOAD4 signal in synchronization with the clock signal VCLK4.

Figure 25:
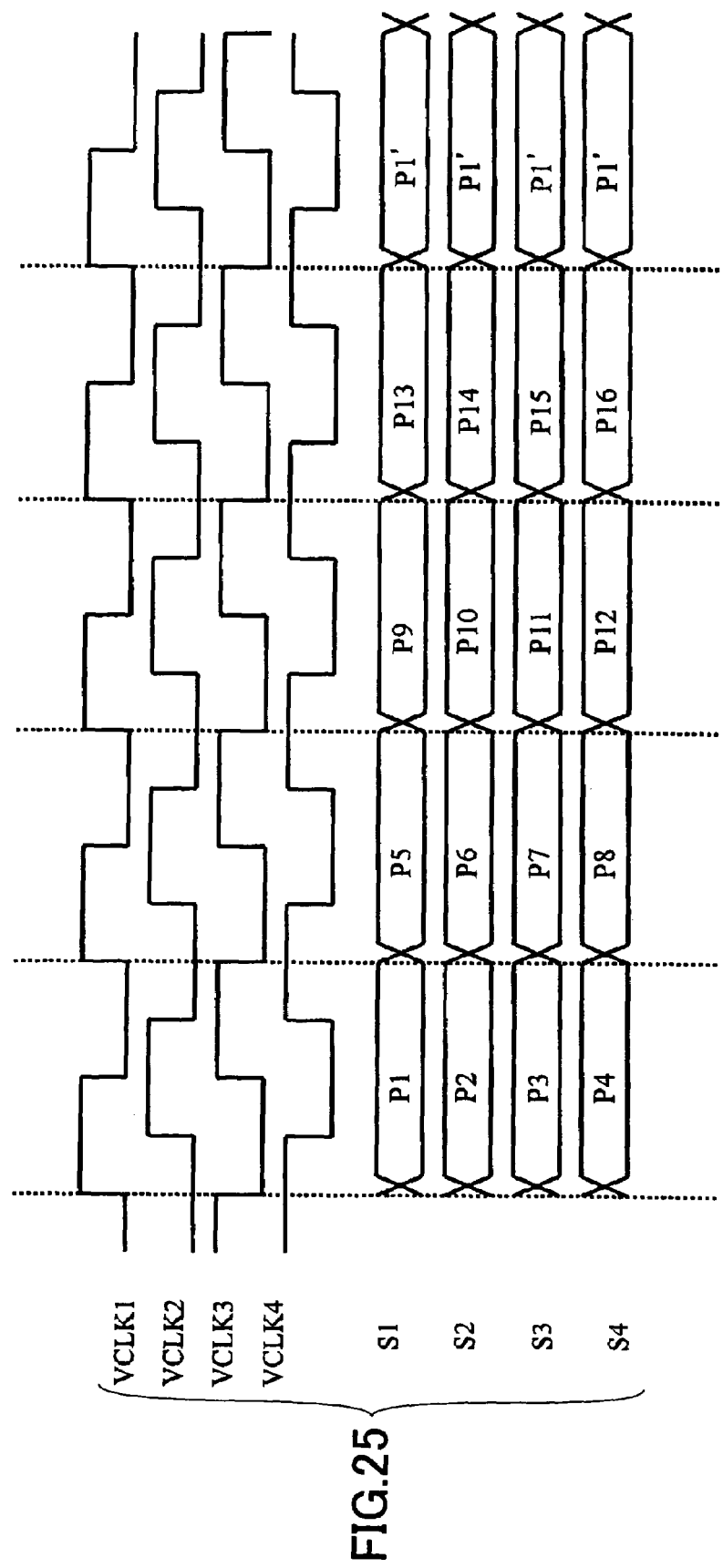
FIG. 25 shows a timing chart illustrating the operation.

Then, by means of shifting operation in the shift registers 131 through 134, P1 through P16 are output in timing as shown in FIG. 25 as output data S1, S2, S3 and S4 of the respective shift registers. Then, a multiplexer MUX 139 selects one of the output data of the respective shift registers in sequence in timing of the clock signals VCLK1 through VCLK4, and thus, a pulse series is output serially in the order of P1 through P16.

Thus, in the configuration shown in FIG. 24, the pulse modulation signal at a frequency four times that of the given high-frequency clock VCLK can be produced. In other words, it is possible to generate the serial pulse modulation signal of a higher resolution even with the same clock frequency given.

When the voltage controlled oscillator such as that shown in FIG. 3 or 5 is used as a voltage controlled oscillator in a PLL circuit used as the high-frequency clock signal generating part 11, it is possible to take directly the high-frequency clock signals in four phases VCLK1 through VCLK4 from the oscillating circuit part (ring oscillator part) in the voltage controlled oscillator. That is, in the configuration shown in FIG. 3 or 5, VCLK1 is taken from the drain of the n-channel MOS-FET 312 of the differential inverter in the second stage; VCLK3 is taken from the drain of the n-channel MOS-FET 311; VCLK2 is taken from the drain of the n-channel MOS-FET 316 of the differential inverter in the fourth stage; and VCLK4 is taken from the drain of the n-channel MOS-FET 315. It is noted that, by taking a clock signal from each stage, it is possible to obtain clock signals in eight phases having phases different from each other by the angle $\pi/4$ (45 degrees) each. Similarly, in a configuration in which an odd number of stages of, for example, three stages of differential inverters are used, it is possible to produce clock signals in six phases having phases different from each other by the angle $\pi/3$ (60 degrees) each.

Figure 26:
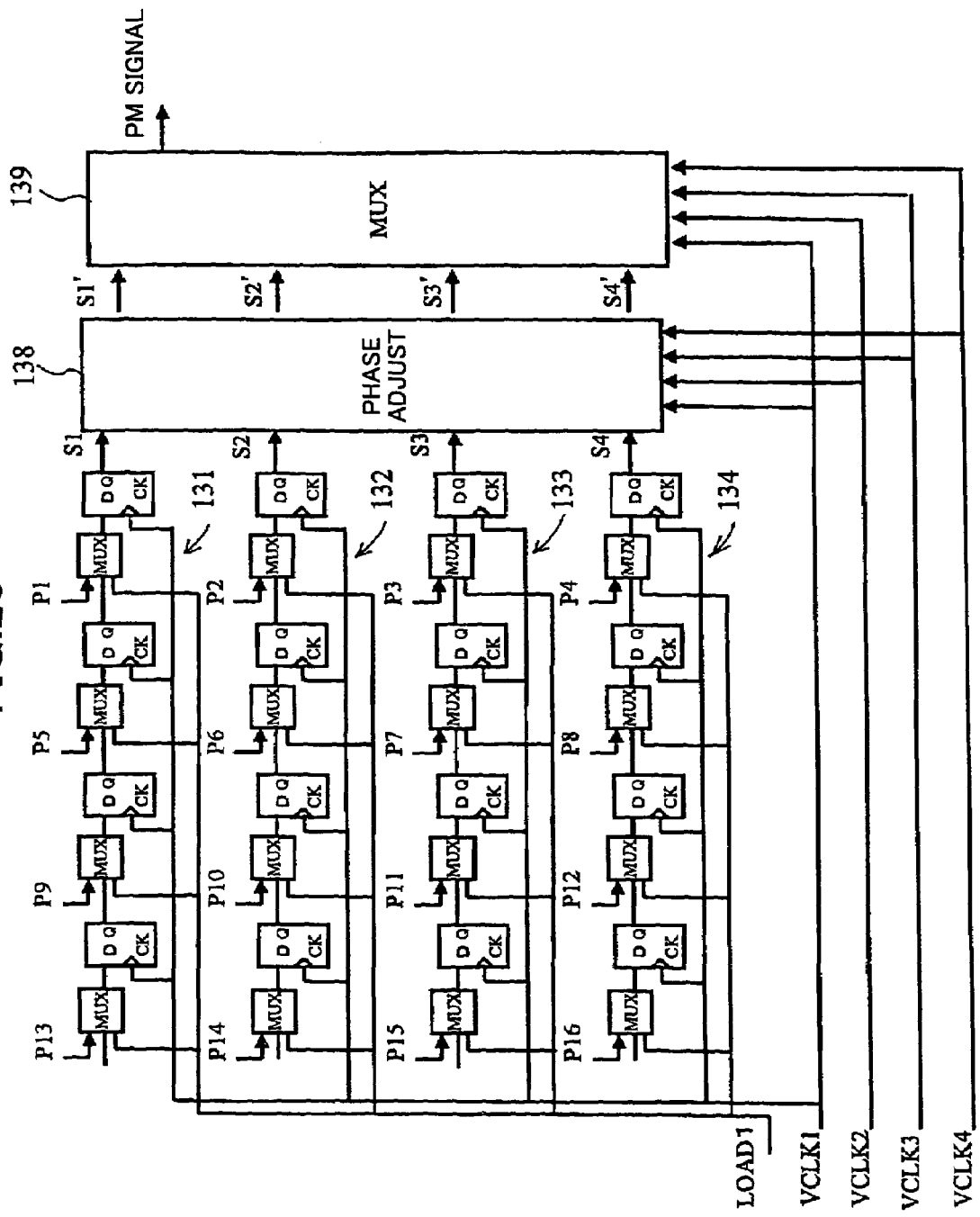
FIG. 26 shows a block diagram of another example of a configuration of a serial modulation signal generating part.
Figure 27:
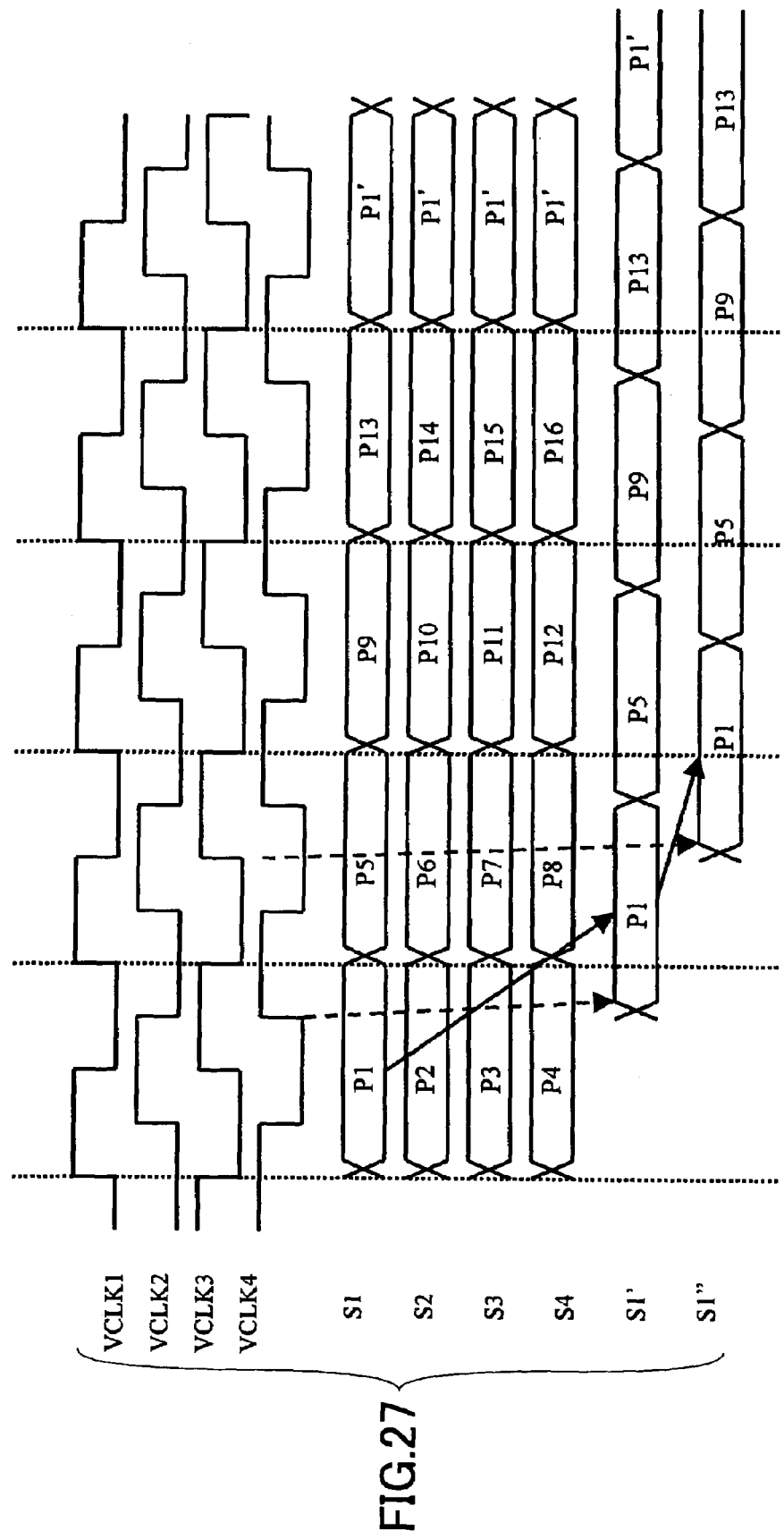
FIG. 27 shows a timing chart illustrating the operation.

FIG. 26 shows another example of the serial modulation signal generating part 13. In this configuration, the same as the configuration shown in FIG. 24, four lines of four-bit shift registers 131 through 134 are used. 16-bit modulation data (P1 through P16) are divided as a result of one of each four bits being taken, and loaded on the four lines of shift registers. In this case, in timing of one LOAD1 signal in synchronization with a clock signal VCLK1, all loading on all the shift registers is performed, and also, all the shift registers perform shifting operation with the common clock signal VCLK1. Accordingly, output data S1, S2, S3 and S4 of the respective shift registers 131, 132, 133 and 134 are in synchronization with the clock signal VCLK1, as shown in FIG. 27. Therefore, when the output data S1 of the shift register 131 is to be output at a rising edge of the clock signal VCLK1 and a decaying edge of the clock signal VCLK2 through a multiplexer MUX 139 for example, it is not possible to latch the pulses since an indefinite part exists at the timing. However, as shown in FIG. 27, the data S1 is once latched by the clock signal VCLK4 to be data S1', and also, is once latched by the clock signal VCLK3 to be data S1". Thereby, it becomes possible to latch the thus-phase-shifted data at a rising edge of the clock signal VCLK1 and at a decaying edge of the clock signal VCLK2. In order to adjust phases of the output data of the shift registers in such a way, a phase adjusting part 138 is added. Data S1', S2', S3' and S4' obtained from phase adjustment performed by the phase adjusting part 138 is thus input to the MUX 139, as shown in FIG. 26.

Operation in the MUX 139 is basically same as that in the case of FIG. 24. By performing selection of the output data of the respective shift registers after selecting the clock signal so that thereby the output of the shift registers can be stably latched, the output data of the four lines of shift registers can be properly converted into a serial pulse series and be then output as the signal PM.

In this example, the phase adjusting part 138 is needed to adjust the phases of the outputs of the shift registers. However, this example is advantageous in that only the common high-frequency clock signal and the common load signal in synchronization therewith are needed even for the four shift registers.

Although the examples in each of which the four lines of shift registers are used have been described, it is also possible to provide a configuration in which more than four lines of shift registers are used. Furthermore, although the four-bit shift registers are used in each example, it is also possible to produce a pulse series with a large number of bits by using shift registers of a larger number of bits.

The above-mentioned LUT suitable for the high resolution mode is described next with reference to FIGS. 28 and 29A–29C.

Figure 28:
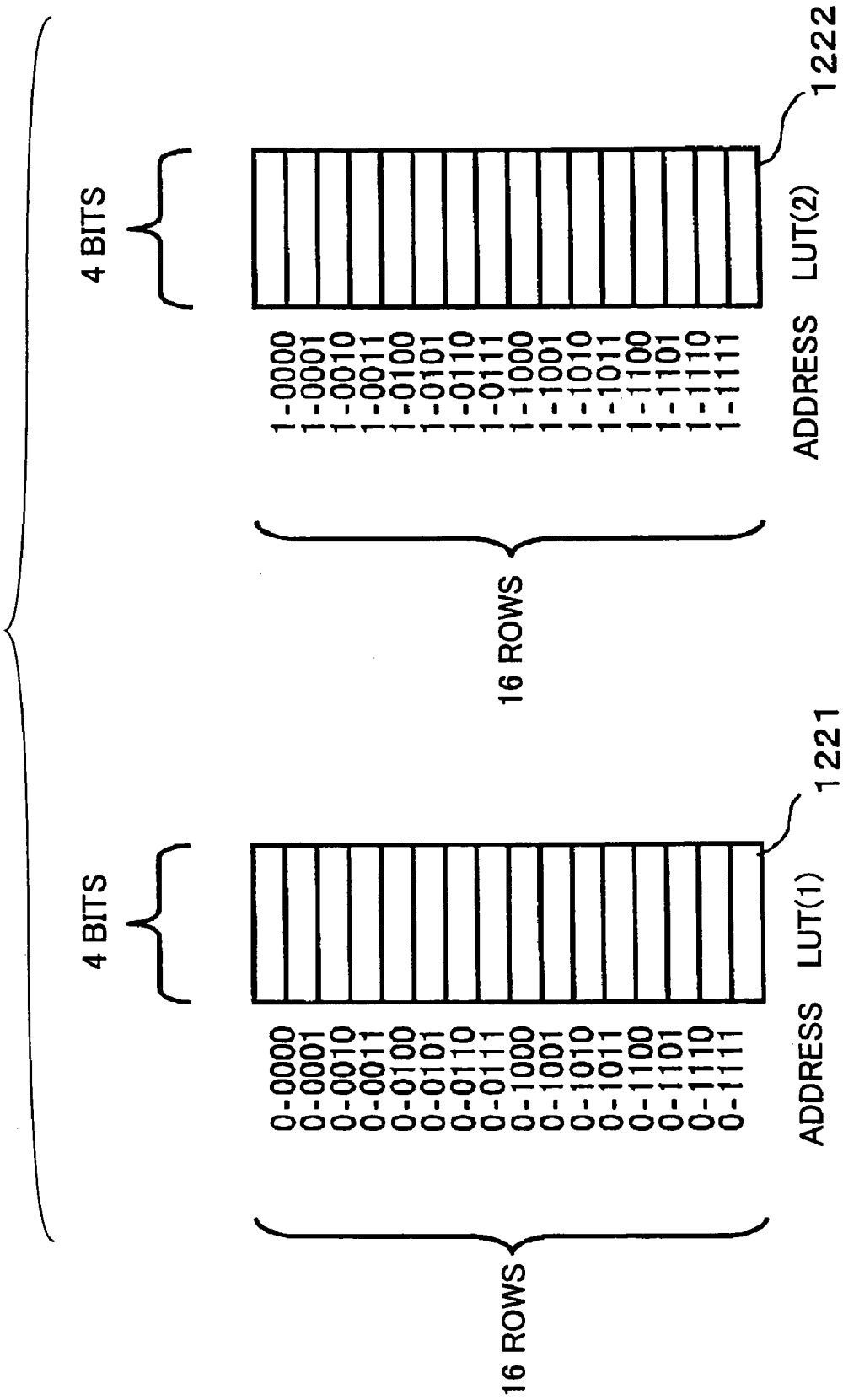
FIG. 28 shows another example of a configuration of a lookup table (LUT) for generating modulation data.

FIG. 28 shows an example of an LUT suitable for a high resolution mode. In this example, two LUTs of 4 bits×16 rows each of which is shown in FIG. 18 are used. An address signal of 5 bits is used for the LUT(1) 1221 and the LUT(2) 1222. The MSB thereof corresponds to a high resolution mode signal, and is used to select one of these LUTs 1221 and 1222. The other four bits of the address signal are image data, and are used to select a particular row of each of the respective LUTs.

In this configuration of the LUTs, a LOAD signal is given twice for one dot. In synchronization with the first LOAD signal thereof, the high resolution signal is set as "0", and four bits of image data is input together in the address signal. The address signal thus includes these five bits, i.e., the high resolution signal and the four bits of image signal. Since the high resolution signal is "0" in this case, the LUT(1) 1221 is selected accordingly, and four bits on a relevant row of the LUT are output therefrom. Then, in synchronization with the second LOAD signal, the high resolution signal is set as "1", and four bits of image data is given as the address signal the same as the above. As a result, the LUT(2) is selected, and four bits on a relevant row in the LUT are output therefrom. Thus, in the high resolution mode, total 8 bits of modulation data is produced with the use of both the LUT(2) 1221 and the LUT(2) 1222.

On the other hand, in the normal mode, the LOAD signal is given once for one dot, and, in this case, the high resolution signal is "0" and four bits of image data is given as the address signal only once. Thereby, only the LUT(2) 1221 is selected, and four-bit data on a relevant row in the LUT is output therefrom.

It is noted that an LUT of $2^8=256$ rows should be prepared for producing the above-mentioned total 8 bits by the single LUT. However, by preparing two LUTs each of which is of 16 rows as in the case of FIG. 28 described above, it is possible to reduce the total number of rows required into 32 for the same purpose. Accordingly, it is possible to effectively reduce the memory capacity required.

Figure 29B:
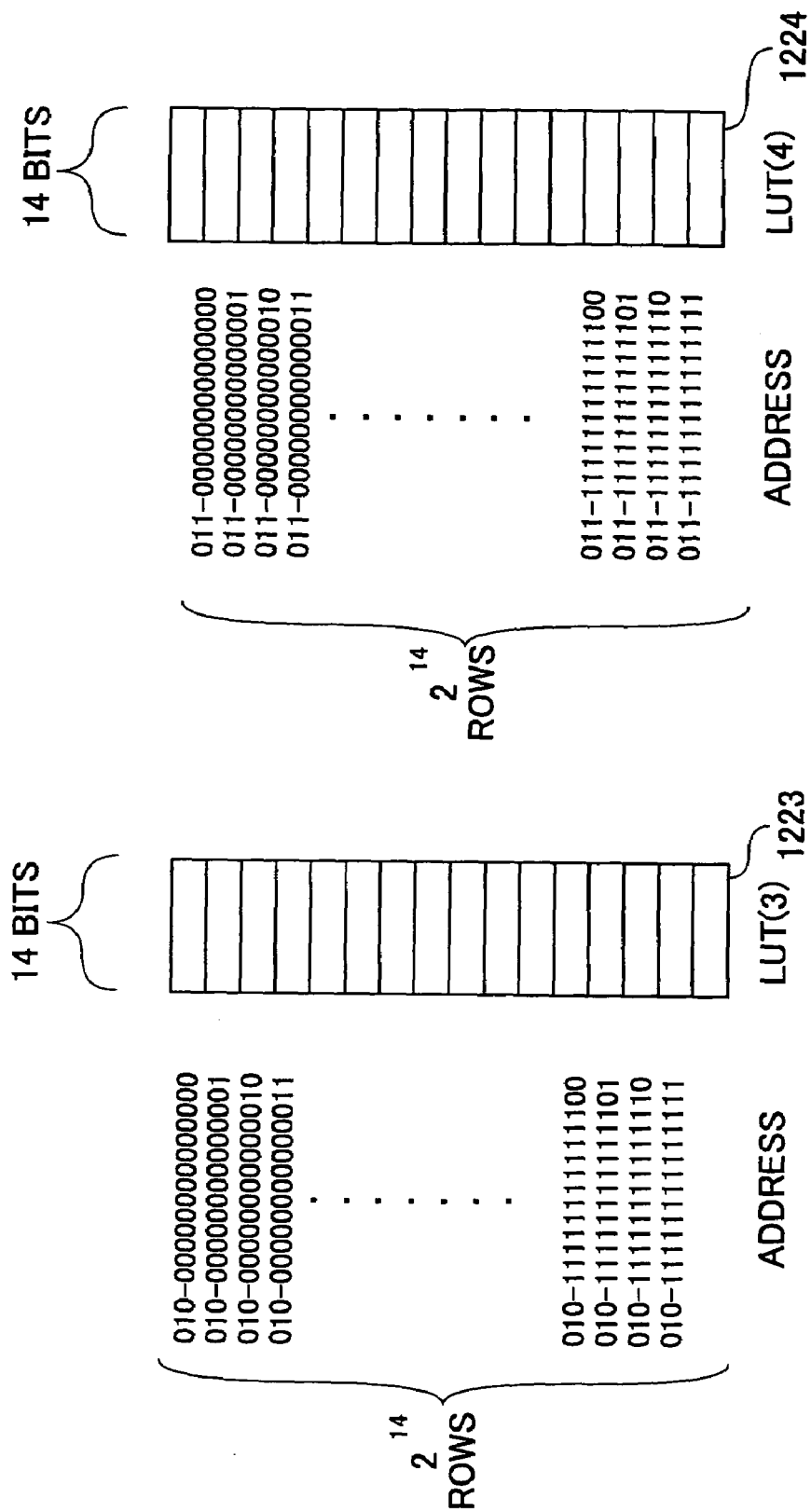

FIGS. 29A, 29B and 29C show another example of LUT suitable for the high resolution mode. In this example, in addition to the high resolution mode, the number of pulses is further changed. This example uses total six LUTs, i.e., an LUT(1) 1221 and an LUT(2) 1222 of 16 bits×$2^{16}$ rows, an LUT(3) 1223 and an LUT(4) 1224 of 14 bits×$2^{14}$ rows, and an LUT(5) 1225 and an LUT(6) 1226 of 18 bits×$2^{18}$ rows.

An address signal of 19 bits is used for the LUT(1) 1221 and the LUT(2) 1222, an address signal of 17 bits is used for the LUT(3) 1223 and the LUT(4) 1224, and an address signal of 21 bits is used for the LUT(5) 1225 and the LUT(6) 1226, as shown. In each of these address signals, the most significant 3 bits are used for selecting one of the LUT(1) 1221 through LUT(6) 1226. Specifically, in these most significant three bits, the MSB and the second MSB are used for selecting any pair of the pair of LUTs outputting 16 bits, those outputting 14 bits and those outputting 18 bits, while the third MSB is used to select one of the thus-selected pair of LUTS. As this third MSB, the high resolution mode signal is designated, and, in the high resolution mode, the two LUTs selected by the other two MSBs are used together as mentioned above.

In this example, with a combination of the high resolution mode signal (third MSB) and the other two MSBs in the address signal, it is possible to designate any one of six sorts of output modulation data, i.e., one of those of 14 bits, 16 bits, 18 bits, 28 bits, 32 bits and 36 bits. This designation of LUT is easily achieved with the use of an address decoder provided in front of the LUT(1) 1221 through the LUT(6) 1226, the most significant three bits of the address signal given are decoded by means of this address decoder, and the LUT is selected according to the thus-obtained decoding result. Further, by increasing the number of bits of the address signal used for selecting the LUT, the number of available combinations in selection of the LUT increases. As a result, the number of available combinations of the number of bits in the output modulation data increases.

In this example, operation in the high resolution mode is basically same as in the case of FIG. 28 described above. That is, the high resolution signal is set as "0" at the first LOAD signal, and is set as "1" at the second LOAD signal. The most significant two bits in the address signal are set according to the number of bits required for the modulation data finally provided. For example, in a case where the most significant two bits are "00", the LUT(1) 1221 is selected at the first LOAD signal, and 16-bit data on a relevant row in the LUT is output. Then, the LUT(2) 1222 is selected at the second LOAD signal, and 16-bit data on a relevant row in the LUT is output. Thus, the total 32 bits are output as the modulation data. Similarly, in a case where the most significant two bits are "01", total 28 bits are output as the modulation data by means of the LUT(3) 1223 and the LUT(4) 1224 with the first and second LOAD signals.

It is obvious that change in the number of output pulses same as that performed in the above-described configuration may also be achieved with the use of a decoder. Further, change in pulse series may also be achieved by adding a bit compression/decompression circuit between the LUT and the shift register, for example.

Figure 30:
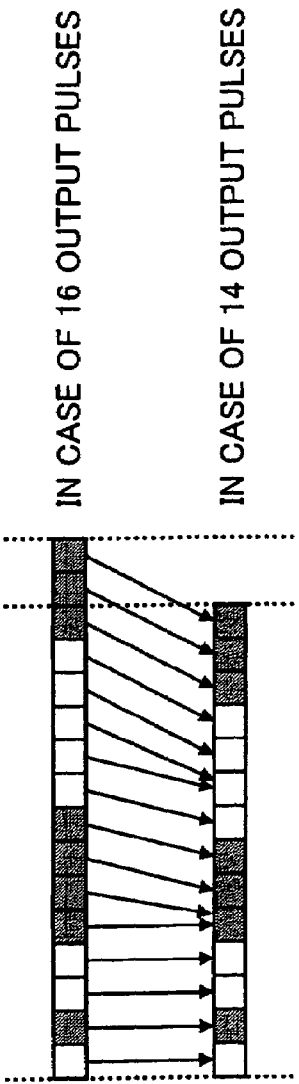
FIG. 30 shows a variant embodiment of an output pulse series.
Figure 31:
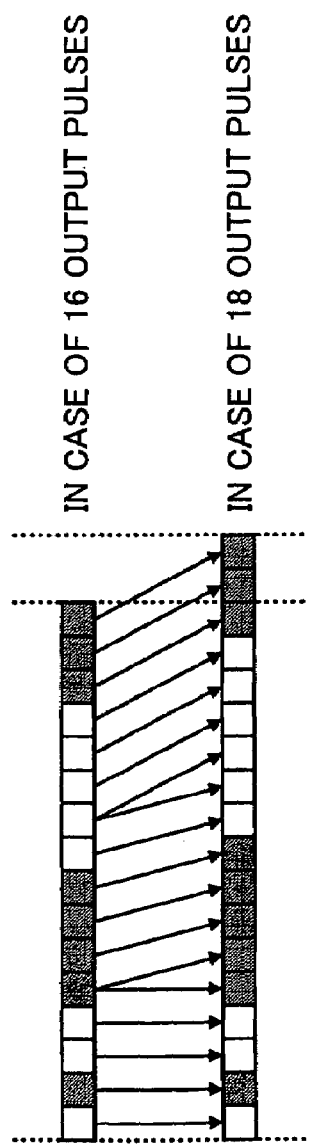
FIG. 31 shows another variant embodiment of an output pulse series.
Figure 32:
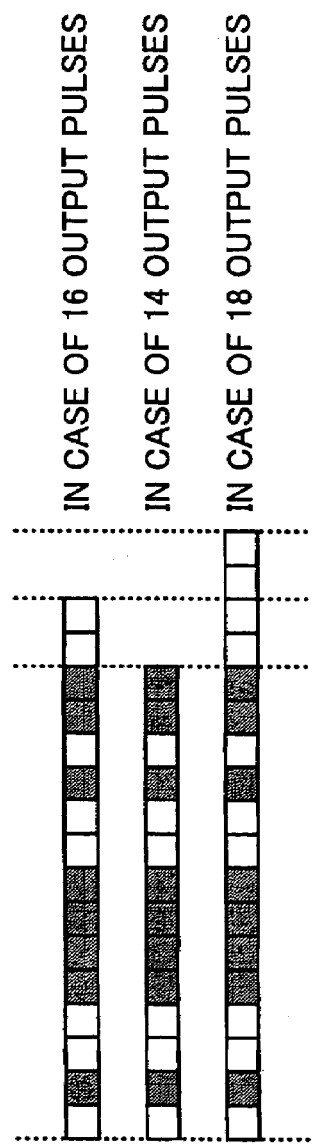
FIG. 32 shows another variant embodiment of an output pulse series.

Description is made next in further detail for the change in pulse series with reference to FIGS. 30, 31 and 32. FIG. 30 shows an example in which an output pulse pattern of 16 pulses (first line) is changed to another output pulse pattern of 14 pulses (second line). In such a case in which the output pattern of 16 pulses is provided to an image forming apparatus or such, and, if the image forming apparatus then deletes the last two pulses without changing the data pattern itself so as to achieve a desired tone at a desired position, the tone is actually changed accordingly from $8/16$ to $6/14$ (assuming that the number of black/ON pulses is regarded as the tone value), and thus, the tone differs from one originally desired. In order to solve such a problem, the data pattern itself is changed as indicated by arrows shown in FIG. 30, by means of a memory or a decoder. As a result, the resulting tone becomes $7/14$, and thus, the tone becomes coincident ($8/16 = 7/14 = 0.5$) in this case. Even when tone does not become just coincident, it is possible to minimize the tone difference otherwise occurring due to the change in the number of pulses, by providing a converting part for converting the data pattern itself so that tone closest to the tone in the original 16 pulse can be obtained even after the number of pulses is changed (reduced to 14 in this example).

FIG. 31 shows an example in which an output pulse pattern of 16 pulses (first line) is changed into another output pulse pattern of 18 pulses (second line). The same as in the example shown in FIG. 30, a converting part is provided for performing data conversion such that resulting tone becomes closest to the original tone, and in this example, the tone changes from 8/16 into 9/18 in a method illustrated by arrows in the figure. Thus, by providing a data converting part which performs data conversion appropriately according to the number of pulses in a case where the number of pulses in a given pulse series should be changed, it is possible to achieve a high-resolution image forming apparatus in which influence for image tone or such can be well controlled even when the number of pulses is changed there. In this example, the reference number of pulses is assumed as 16 for the purpose of simplification of description. However, as the number of pulses included in a basic pulse series increases, the data converting part can be configured to have a finer pitch. Accordingly, it becomes possible to achieve the configuration of the data converting part in which the influence for the image tone resulting can be controlled better.

FIG. 32 shows another example according to a concept different from that in the examples shown in FIGS. 30 and 31. As shown in FIG. 32, it is assumed that the number of output pulses is changed among 14, 16 and 18. It is also assumed that, even when the number of pulses is thus changed among 14, 16 and 16, only 14 pulses thereof, counted from the left end, can be actually output. In such a case, when the number of pulses is 16 (first line), the rightmost two pulses should be set as white (OFF), and, similarly, when the number of pulses is 18 (third line), the rightmost four pulses should be set as white (OFF), as shown. For example, in a case of a raster-type image forming apparatus, since a Gaussian distribution occurs on a photopositive body even when an output of less than a duty of 100% is applied, it is possible to output a black solid image. Therefore, as the number of pulses is changed without changing the data pattern itself with maintaining the maximum duty of $14/18 \approx 77.8\%$ as shown in FIG. 32, it is possible to achieve a configuration in which the above-mentioned data converting part is not needed.

As described above, by employing the PLL circuit according to the present invention in the high-frequency clock signal generating part 11, it is possible to take multiple phase clock signals directly from the PLL circuit as shown in FIG. 25, for example. However, in a case where it is requested to adjust a phase difference or a duty in the multiple phase clock signals freely, one or a plurality of signal delay circuits may be provided in the high-frequency clock signal generating part 11 by which clock signals in one or a plurality of phases taken from the PLL circuit are delayed and thus desired clock signals are produced. An example of such a signal delay circuit is described next with reference to FIGS. 33, 34 and 35.

Figure 33:
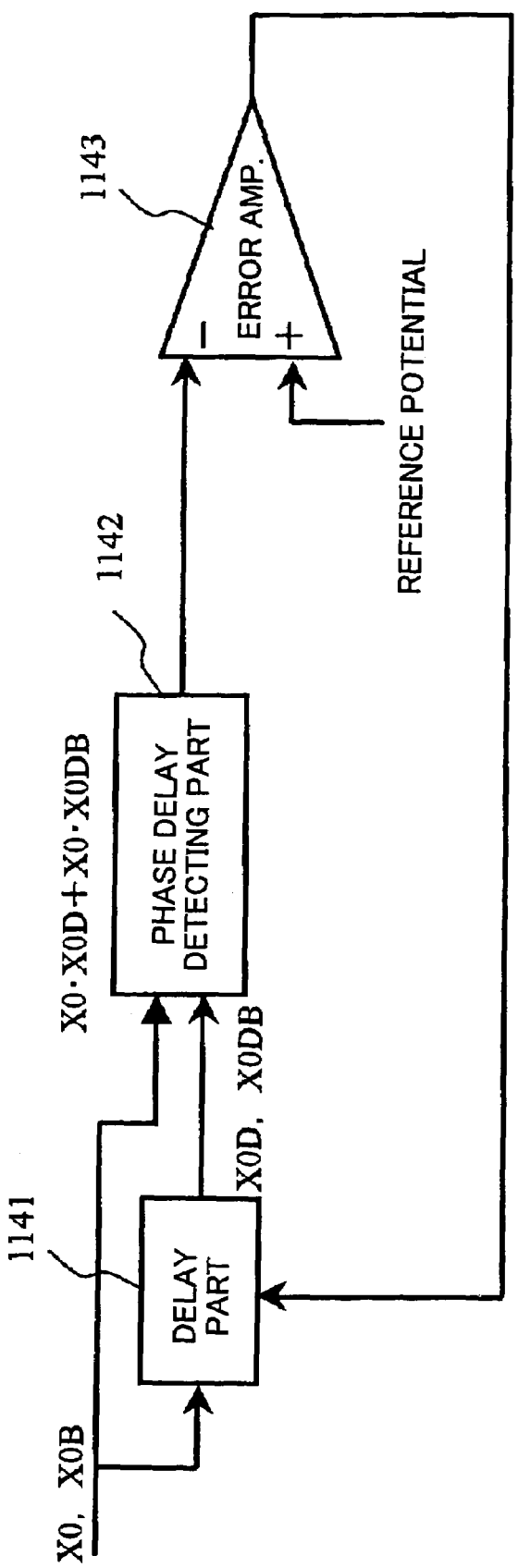
FIG. 33 shows a conceptual diagram of a signal delay circuit.
Figure 34:
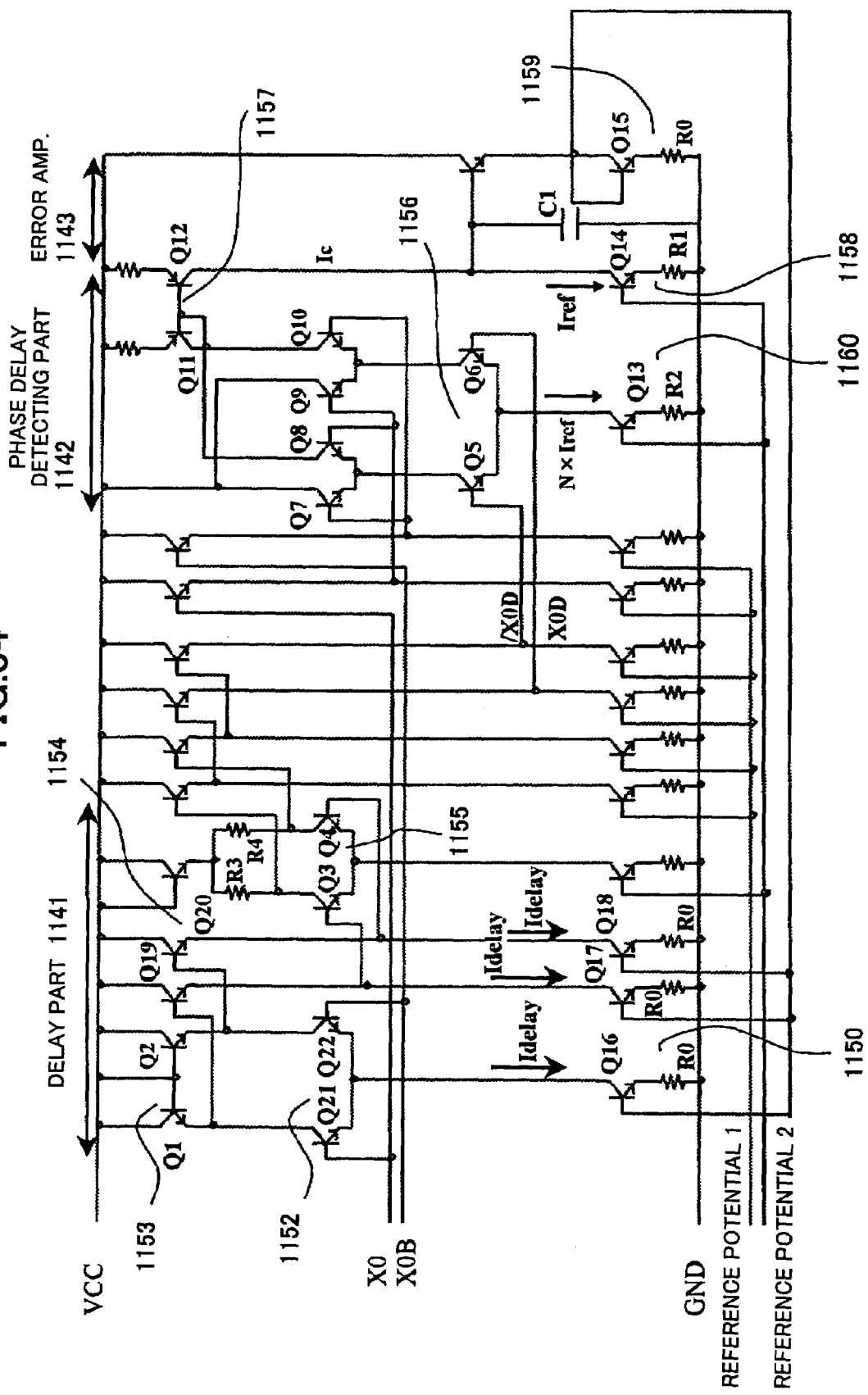
FIG. 34 shows a circuit diagram of a specific example of the signal delay circuit shown in FIG. 33.

FIG. 33 shows a conceptual diagram of the signal delay circuit; FIG. 34 shows a specific configuration example thereof; and FIG. 35 shows waveforms therein.

In FIG. 33, clock signals X0 and X0B have phases reverse to one another, are taken from the PLL circuit or such directly or are obtained as a result of clock signals once taken from the PLL circuit being made to pass through inverters or such. These clock signals X0 and X0B are input to a delay part 1141, and clock signals X0D and X0DB delayed thereby and the original clock signals X0 and X0B are then input to a phase detecting part 1142. A value of a phase difference between the clock signals X0, X0B and the clock signals X0D, X0DB detected by the phase detecting part 1142 is compared with a reference potential by an error amplifying part 1143, and, an output signal therefrom is returned to the delay part 11141 in a feedback manner, and thus, a delay amount is controlled.

Figure 35:
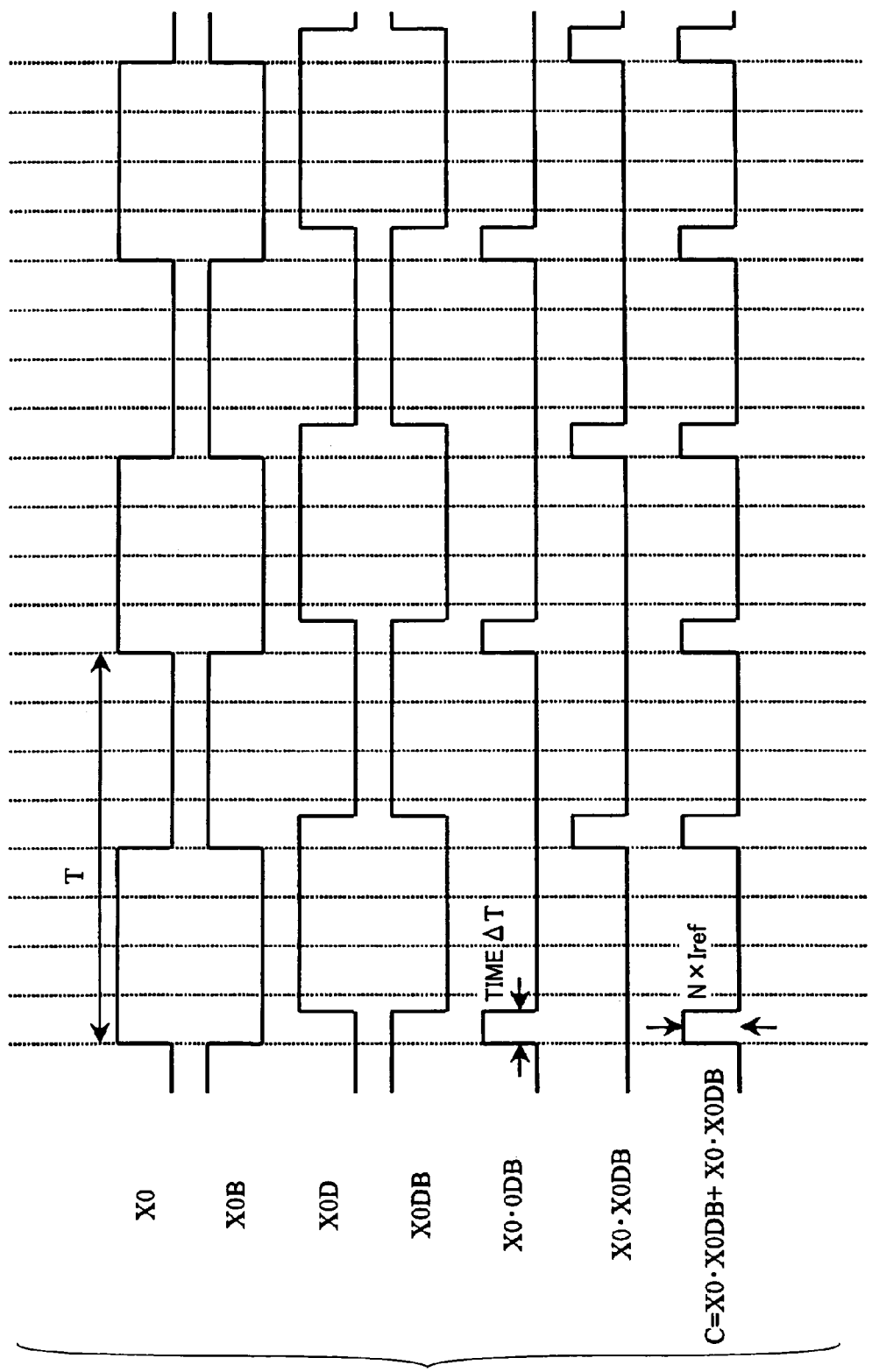
FIG. 35 shows a waveform in the signal delay circuit shown in FIG. 33.

With reference to FIG. 35, the clock signals X0 and X0B are delayed by the delay part 1141 by a time Δt so as to be the signals X0D and X0DB. Logic in the phase delay detecting part is as follows assuming that the output thereof is C:

$$C = X0 \cdot X0DB + X0B \cdot X0D$$

The reason for adopting the logic in the delay detecting part 1142 as such is that a phase delay amount should be accurately detected even if a duty in the input clock signals X0 and X0B is not accurately 50%. In this case, the output signal C of the phase delay detecting part 1142 has a waveform in which a pulse of the delay time Δt appears in each period of T/2. There, the output signal C of the phase delay detecting part 1142 is a current output, and the current value is expressed as N×Iref.

The error amplifying part 1143 compares the current output C with a reference current Iref which acts as a reference signal, and generates a current Idelay defining the delay amount in the delay part 18. In this case, assuming that N=4, for example, an integration value of integrated waveform of C becomes Iref when the delay time ΔT=T/8, and thus, the delay amount in the delay part 1142 is controlled so that the delay time ΔT=T/8. In general, the following formula holds:

$$\text{delay time } \Delta T = T/2N$$

That is, by setting N freely, it is possible to freely obtain a pulse signal for which the delay time ΔT is controlled, with delay in a range of the period T/2, which is the half of the period of the clock signals X0 and X0B.

The specific example of circuit configuration shown in FIG. 34 configured by bipolar transistors is described next. By means of a current source 1150 configured by transistors Q16 through Q18 and a resister R0, the current Idelay determining the delay amount in the delay part 1141 is generated. The input clock signals X0 and X0B are delayed by a diode load circuit 1153 configured by transistors Q1 and Q2, and an emitter follower circuit 1154 configured by transistors Q19 and Q20, via a differential circuit 1152 configured by transistors Q21 and Q22. Since an output of the diode load circuit 1153 configured by the transistors Q1 and Q2 has a very small amplitude, swing is controlled as a result of an output signal of the emitter follower circuit 1154 configured by the transistors Q19 and Q20 being output via a binarizing circuit 11155 configured by transistors Q3 and Q4 and resisters R3 and R4. An ECL circuit 1156 configured by transistors Q5 through Q10 provides the following output C by the input signals X0D and X0DB from the above-mentioned binarizing circuit 1155:

$$C = X0B \cdot X0D + X0 \cdot X0DB$$

The output current Ic is inverted by a current mirror circuit 1157 configured by transistors Q11 and Q12, and is compared with the reference current Iref generated by a transistor Q14 and a resister R1. A collector of the transistor Q14 of a comparing part 1158 has high impedance, and also, a capacitance C1 is connected with respect to the ground GND. Thus, Ic is compared with Iref, and a comparison result thereof becomes a current generated by a current source 1159 including a transistor Q15 and a resister R0. Current sources 1150 and 1159 configured by the transistors Q15 through Q18 and the resister R0 configure a current mirror circuit in which the identical currents flow therethrough, since they have the identical emitter resistors of R0. That is, a current generated by the transistor Q15 and the resister R0 corresponds to the current Idelay, and the output current Idelay of the current mirror circuit configured by the transistors Q15 through Q18 and the resister R0 is controlled so that the delay amount in the delay amount generating part 1141 becomes a desired delay amount, by means of the output obtained from the transistor Q15 and the resister R0.

Assuming that a current of a current source 1160 configured by a transistor Q13 and a resister R2 is N times Iref, it is possible to obtain the delayed pulse signals X0D and X0DB, for which the delay time $\Delta T$ is expressed by the following formula:

$$\text{delay time } \Delta T = T/2N$$

For example, in a case where N=4, setting is made such that R1:R2=4:1, and also, an area factor (emitter area) of the transistor Q13:an area factor (emitter area) of the transistor Q14=1:4. Thereby, it is possible to cause accurately a current of 4×Iref to flow through the current source 1160 configured by the transistor Q13 and the resister R2. Accordingly, it is possible to generate the delayed pulse signals X0D and X0DB having the delay time $\Delta T=T/8$, i.e., the phase delay amount $\Delta \theta = \pi/4$.

A semiconductor laser driving device and an image forming apparatus according to embodiments of the present invention employing the pulse modulation signal generating circuit according to the present invention described above are described next.

Figure 36:
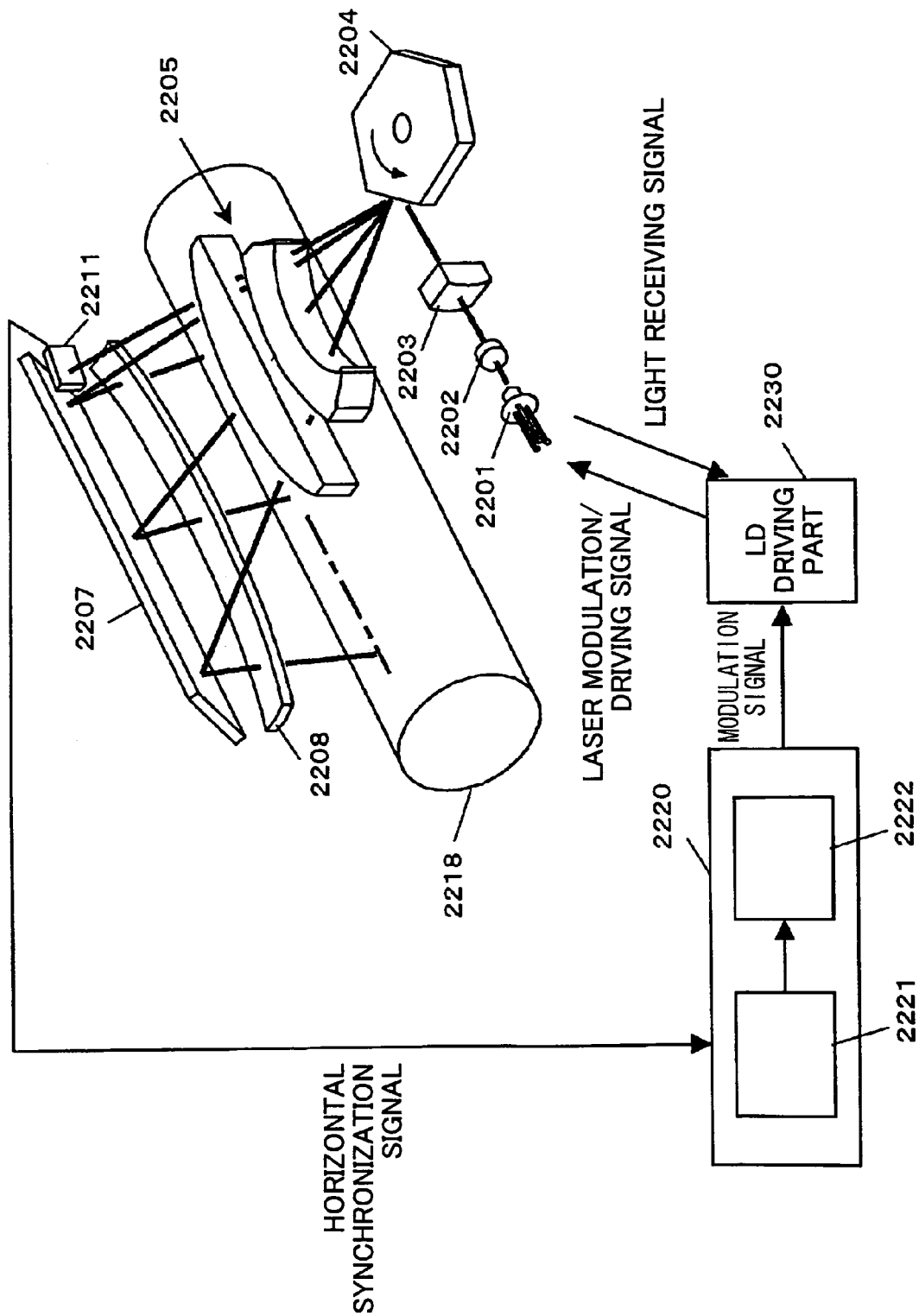
FIG. 36 shows a configuration of an image forming apparatus and a semiconductor laser driving device in a single beam type according to the present invention.

FIG. 36 shows a semiconductor laser modulation device and an image forming apparatus in a tenth embodiment of the present invention. The image forming apparatus according to the embodiment of the present invention is a single beam type image forming apparatus in which a single laser beam output form a semiconductor laser (LD) 2201 is used to scan a photosensitive body 2218, and thus an electrostatic latent image is formed thereon.

As shown, in the image forming apparatus according to the present embodiment, an image processing unit 2220 basically includes an image processing part 2221 and the pulse modulation signal generating part 2222 according to the present invention described above. Image data is input to the pulse modulation signal generating part 2222 from the image processing part 2221, the pulse modulation signal generating part 2222 outputs a serial pulse modulation signal as described above, and the pulse modulation signal is then provided to an LD driving part 2230 which configures the semiconductor laser driving device according to the embodiment of the present invention together with the pulse modulation signal generating part 2222. The LD driving part 2230 drives (modulates) the semiconductor laser 2201 according to the pulse modulation signal.

A scanning optical system thereof is described next. A laser beam emitted by the semiconductor laser 2201 passes through a collimator lens 2202 and a cylinder lens 2203, is deflected (for scanning) by a polygon mirror 2204, is imaged on and exposes the photosensitive body 2218 through an fθ lens 2205, a mirror 2207 and a toroidal lens 2206, and thus, forms an image (electrostatic latent image) on the photosensitive body 2218 which is previously charged electrically by a charger (not shown). At each scanning operation, a scanning start position of the laser beam is detected by a horizontal synchronization sensor 2211, and a detection signal thereof is given to the image processing unit 2220 as a horizontal synchronization signal. The image processing part 2221 generates an image clock signal in synchronization with the horizontal synchronization signal. The image processing part 2221 receives an image read by means of an image inputting device such as a scanner, generates image data in synchronization with the horizontal synchronization signal and the image clock signal, and provides it to the pulse modulation signal generating part 2222. This image data is thus generated in general in consideration of photosensitive characteristics of the photosensitive body 2218. The image processing part 2222 generates, other than the image data, the high resolution mode signal, the data inverting signal, the mode selection signal, the LOAD signal and so forth, such as those shown in FIG. 22, and transfers a group of these signals to the pulse modulation signal generating part 2222 in predetermined timing. The pulse modulation signal generating part 2222 generates modulation data from the image data as described above, and outputs a high-frequency pulse modulation signal in synchronization with the image clock signal as a result of converting the modulation data into the high-frequency pulse modulation signal in a form of a serial pulse series.

Around the photosensitive body 2218, other than the charger which electrically charges the surface of the photosensitive body 2218 uniformly, parts/components which are those generally included in such an electrophotographic image forming apparatus are disposed, such as a unit developing the electrostatic latent image on the photosensitive body 2218 by toner, a unit transferring the thus-developed toner image to a recording paper or to an intermediate transfer body, a unit removing and collecting residual toner from the photosensitive body 2218, and so forth, which are omitted from the figure.

Figure 37:
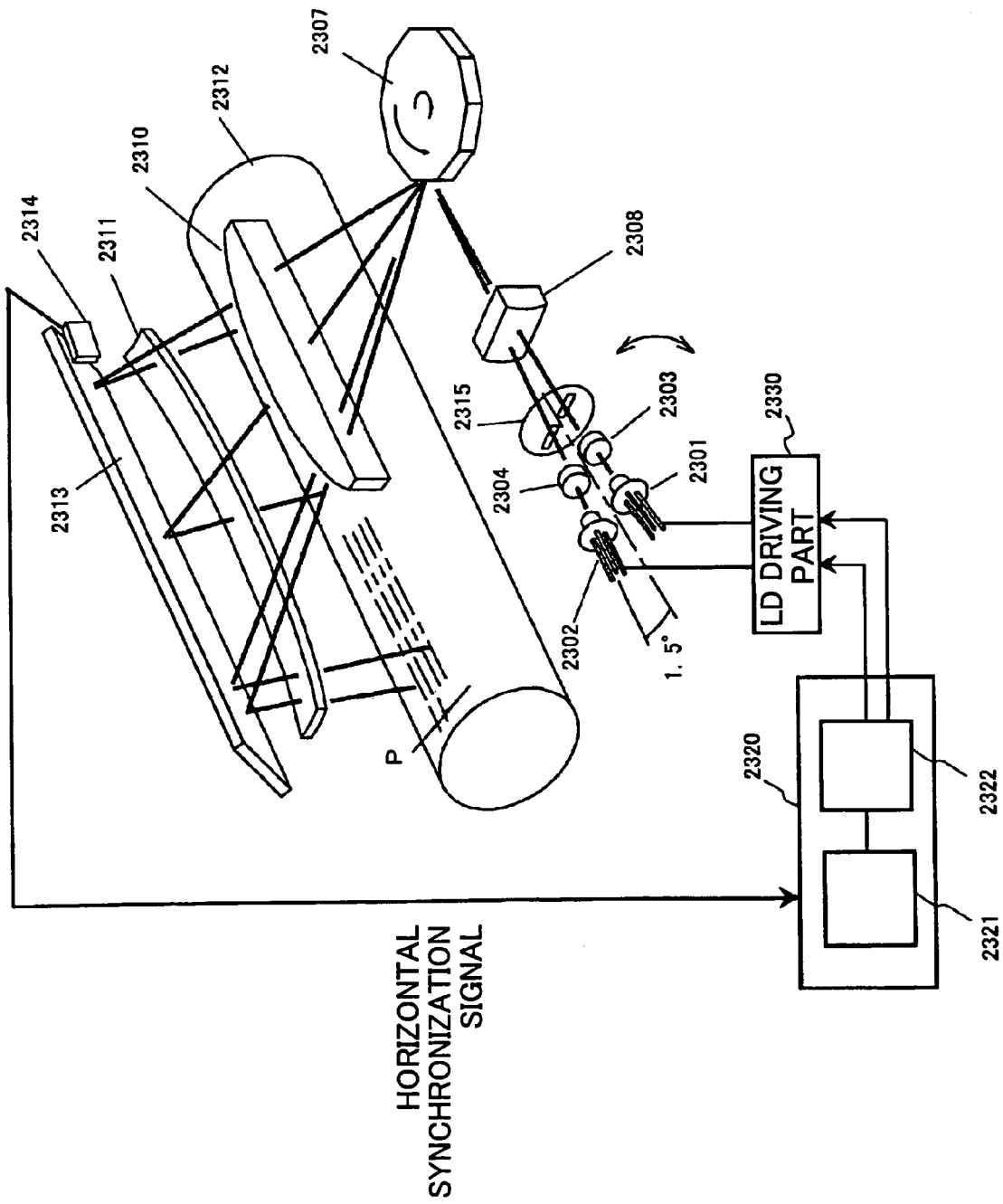
FIG. 37 shows a configuration of an image forming apparatus and a semiconductor laser driving device in a double beam type according to the present invention.

An eleventh embodiment of the present invention is described next. FIG. 37 shows a semiconductor laser modulation device and an image forming apparatus according to the eleventh embodiment of the present invention. The image forming apparatus in the present embodiment is a two beam type image forming apparatus in which two laser beams emitted from two semiconductor lasers (LD) 2301 and 2302 are used to simultaneously scan a photosensitive body 2312 to form an electrostatic latent image thereon for two lines at each scanning operation.

An image processing unit 2320 thereof basically includes an image processing part 2321 and a pulse modulation signal generating part 2322 according to the present invention. In order to drive the two semiconductor lasers 2301 and 2302 at once, the pulse modulation signal generating part 2322 includes both a set of a modulation data generating part and a serial modulation signal generating part corresponding to the semiconductor laser 2301 and a set of a modulation data generating part and a serial modulation signal generating part corresponding to the semiconductor laser 2302, as well as a high-frequency clock signal generating part common to these respective sets. From the image processing part 2321, image data corresponding to the respective semiconductor lasers 2301 and 2302 is input to the pulse modulation signal generating part 2322, which then outputs two serial pulse modulation signals such as those described above, which are then provided to an LD driving part 2330 which configures the semiconductor laser driving device according to the present invention together with the pulse modulation signal generating part 2322. The LD driving part 2330 drives (modulate) the two semiconductor lasers 2301 and 2302 simultaneously according to the thus-provided two pulse modulation signals.

A scanning optical system thereof is described next. The semiconductor lasers 2301 and 2302 are disposed so that the optical axes thereof are made to coincide with those of collimator lenses 2303 and 2304, beam emitting angles thereof are formed as being symmetrical with respect to a main scanning direction, and the beam emitting axes thereof intersect at a point at which the beams are reflected by a polygon mirror 2307. The plurality of laser beams emitted from the respective semiconductor lasers pass through the collimator lenses 2303 and 2304, an aperture 2315 and a cylinder lens 2308, are together deflected (for scanning) by the polygon mirror 2307, are imaged on and expose the photosensitive body 2312 through an fθ lens 2310, a mirror 2313 and a toroidal lens 2311, and thus, form an image (electrostatic latent image) on the photosensitive body 2312 which is previously charged electrically by a charger (not shown). At each scanning operation, a scanning start position of the laser beams are detected by a horizontal synchronization sensor 2314, and a detection signal thereof is given to the image processing unit 2320 as a horizontal synchronization signal. The image processing part 2321 generates an image clock signal in synchronization with the horizontal synchronization signal, as well as receives an image read by means of an image inputting device such as a scanner, generates image data in synchronization with the horizontal synchronization signal and the image clock signal, and provides it to the pulse modulation signal generating part 2322. This image data is thus generated in general in consideration of photosensitive characteristics of the photosensitive body 2312. The image processing part 2321 generates, other than the image data, the high resolution mode signal, the data inverting signal, the mode selection signal, the LOAD signal and so forth, such as those shown in FIG. 22, and transfers a group of these signals to the pulse modulation signal generating part 2322 in predetermined timing. The pulse modulation signal generating part 2322 generates modulation data for two lines from the image data as described above, and outputs two high-frequency pulse modulation signals in synchronization with the image clock signal as a result of converting the modulation data into serial pulse series.

Around the photosensitive body 2312, other than the charger which electrically charges the surface of the photosensitive body 2312 uniformly, parts/components which are those generally included in an electrophotographic image forming apparatus are disposed, such as a unit developing the electrostatic latent image on the photosensitive body 2312 by toner, a unit transferring the thus-developed toner image to a recording paper or to an intermediate transfer body, a unit removing and collecting residual toner from the photosensitive body 2312, and so forth, which are omitted from the figure.

Figure 38:
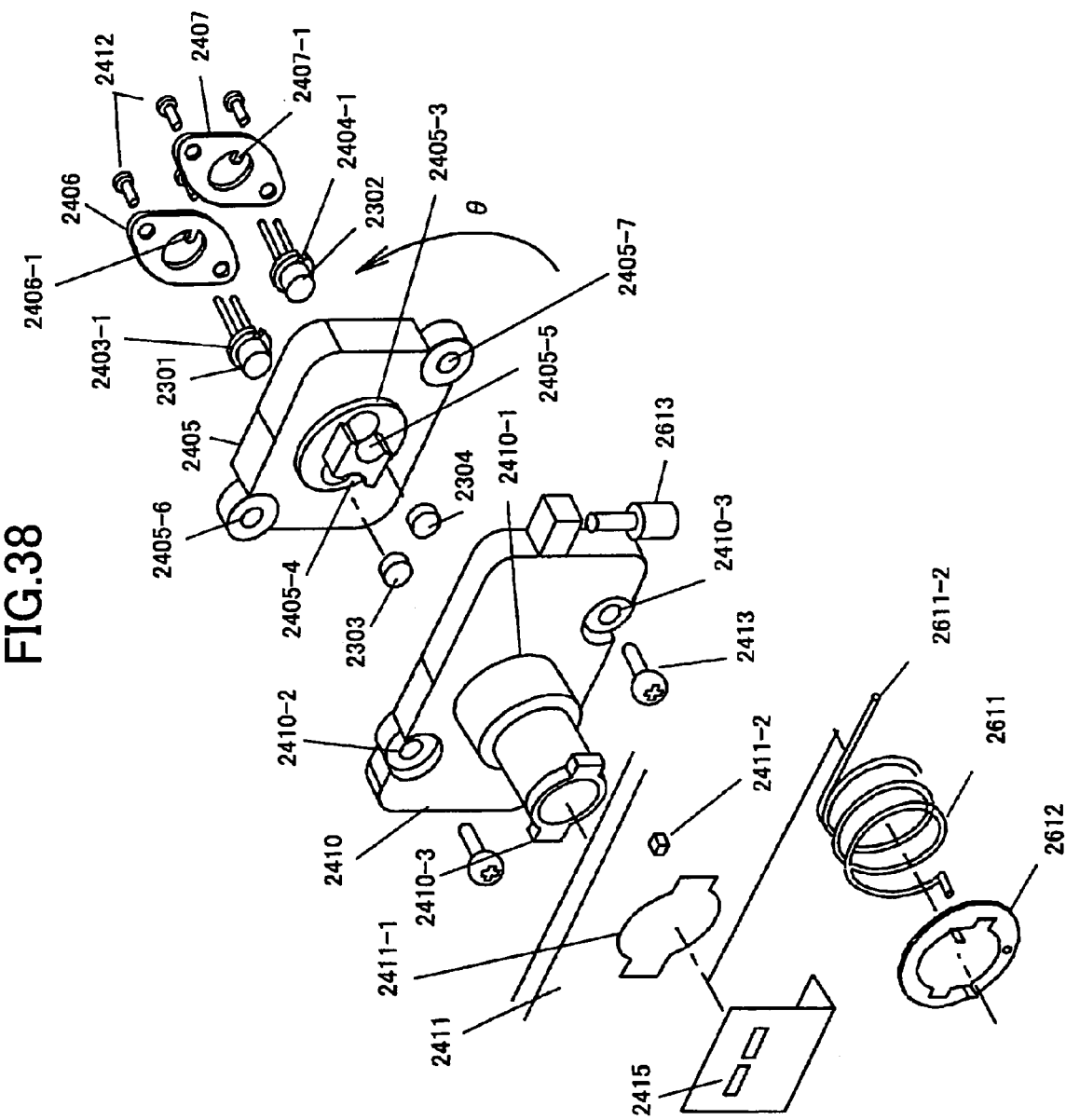
FIG. 38 shows an exploded perspective view of a light source unit employing two semiconductor lasers.

An example of a configuration of a light source unit including the above-mentioned semiconductor lasers 2301 and 2302 is shown in FIG. 38 in an exploded perspective view. Respective cylindrical heat sink parts 2403-1 and 2404-1 of the semiconductor lasers 2301 and 2302 are fitted into fitting holes (not shown) formed on the revere side of a base member 2405 inclined by a slight angle (approximately 1.5 degrees in the embodiment) to the main scanning direction, and, the semiconductor lasers 2301 and 2302 are fixed by fixing members 2406 and 2407 from the reverse side where projections thereof 2406-1 and 2407-1 are aligned with cut-out parts of the heat sink parts. The optical axis directions of the collimator lenses 2303 and 2304 are adjusted where the peripheries thereof are set along a semi-circular mounting guide surfaces 2405-4 and 2405-5 of the base member, and these collimator lenses are bonded thereto after being positioned so that respective divergent beams emitted from light emitting points become parallel beams. In order to make setting such that laser beams emitted from the semiconductor lasers 2301 and 2302 intersect on the main scanning plane, the fitting holes 2405-1 and 2405-2 and the semi-circular mounting guide surfaces 2405-4 and 2405-5 are inclined. A cylindrical engagement part of the base member 2413 is engaged with a holder member 2410, screws 2413 are tightened to screw holes 2405-6 and 2405-7 via through holes 2410-2 and 2410-3, and thus, the base member 2413 is fixed to the holder member 2410.

A cylindrical part 2410-1 of the holder member in this light source unit is fitted to a reference hole 2411 provided in a muting wall of an optical housing, a spring 2611 is inserted from the front side so that a stopper member 2612 is engaged to a cylindrical part projection 2401-3, and thus, the holder member 2410 is held onto the reverse side of the mounting wall 2411 closely. At this time, as a result of one end 2611-2 of the spring 2611 being hooked to a projection 2411-2, rotation force is caused with respect to the center of the cylindrical part as a rotation axis, an adjustment screw 2613 provided to receive the rotation force is used to rotate the entire unit in a direction θ around the optical axis, and thus, a pitch between scanning lines on the photosensitive body drawn by the two laser beams is adjusted. The aperture 2315 (2415 in FIG. 38) for adjusting beam emission diameters of the respective laser beams has a configuration in which slits are provided for the respective semiconductor laser arrays, and is mounted on the optical housing.

Figure 39:
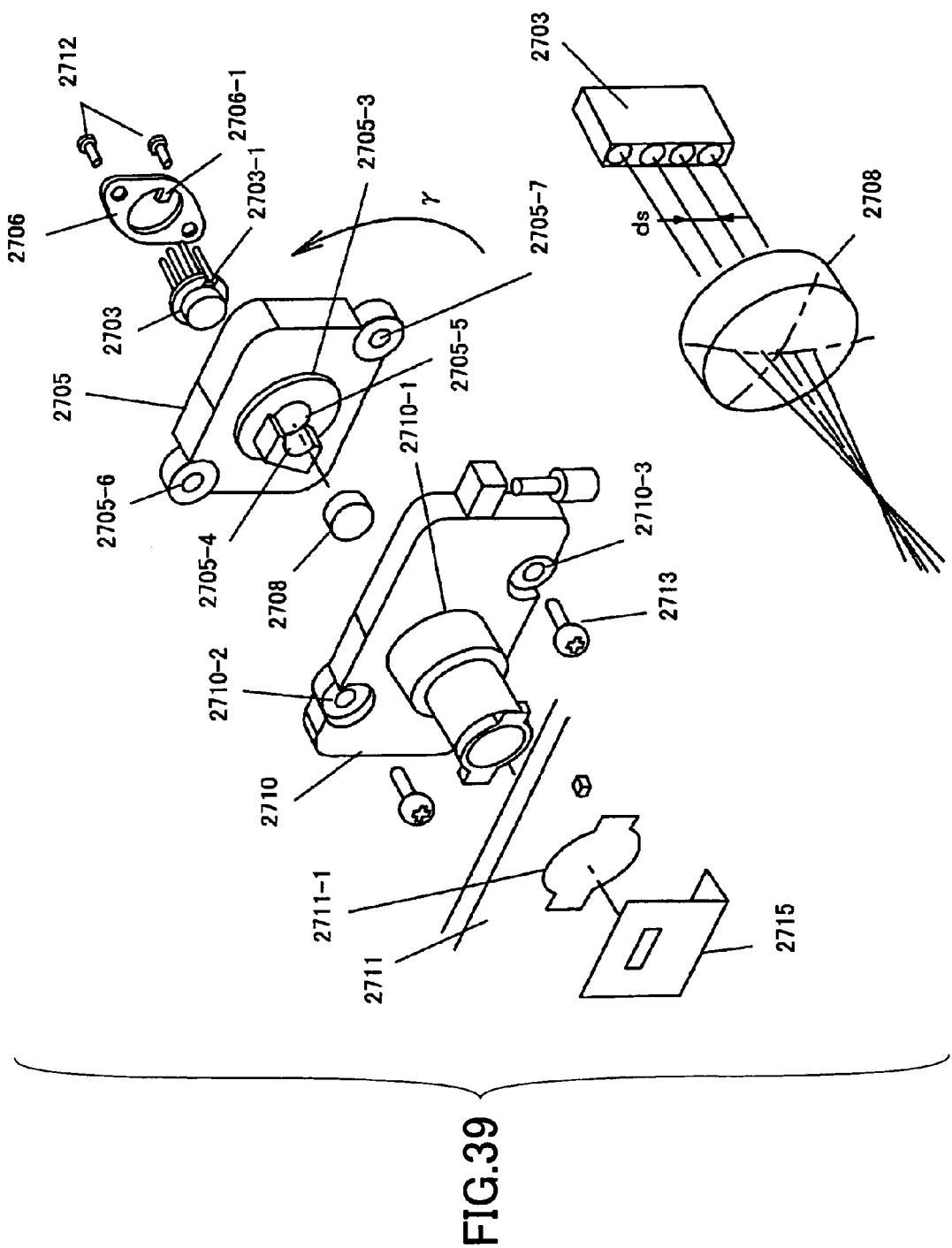
FIG. 39 shows an exploded perspective view of a light source unit employing a semiconductor laser array.

As can be seen from the description above, it is obvious that, with the use of one or a plurality of semiconductor laser arrays each having a plurality of light emitting sources, a multi-beam image forming apparatus which simultaneously scans and draw a plurality of lines, and a semiconductor laser modulation device used therefor can be easily produced. FIG. 39 shows another example of a configuration of the light source unit in which a single semiconductor laser array in which four light emitting sources are arranged with the separation of ds is used. This light source unit has basically the same configuration as that shown in FIG. 38, and thus, duplicate description is omitted.

The above-mentioned embodiments are those of applying the present invention into an image forming apparatus. However, it is also possible to apply the present invention to any other technical fields in which a high-quality clock signal with effectively reduced jitter is required. For example, it is possible to apply the present invention, and, especially, to apply a voltage controlled oscillator or a PLL circuit according to the present invention to a communication apparatus such as a signal transmitter/receiver in which a high-quality clock signal is used as a data transfer clock signal, i.e., a clock signal of 1 GHz for data transfer at 1 Gbps, for example.

Further, the present invention is not limited to the above-described embodiments, and variations and modifications may be made without departing from the basic concept of the present invention claimed below.

The present application is based on Japanese priority applications Nos. 2003-155306 and 2004-075842, filed on May 30, 2003 and Mar. 17, 2004, respectively, the entire contents of which are hereby incorporated by reference.

What is claimed is:

1. A voltage controlled oscillator comprising:
   an oscillation frequency control part comprising a voltage-to-current converting circuit converting an input voltage to a current having a value corresponding to the input voltage, and outputting a current in proportion to the current obtained from said voltage-to-current converting circuit; and
   an oscillating circuit part comprising a ring oscillator, wherein a current in proportion to the output current of said oscillation frequency control part flows through said ring oscillator so that the oscillation frequency in said ring oscillator is controlled by the output current of said oscillation frequency control part,
   wherein a first power source voltage of said oscillation frequency control part is higher than a second power source voltage of said oscillating circuit part and the oscillation off the oscillating circuit part is carried out between a ground electric potential and the second power source voltage.

2. An image forming apparatus configured to scan a photosensitive body with one or a plurality of laser beams and to form an electrostatic latent image on said photosensitive body, comprising:
   a pulse modulation signal generating circuit converting modulation data for modulating said semiconductor laser into a serial pulse series; and
   a driving part driving said semiconductor laser according to the serial pulse series output from said pulse modulation signal generating circuit, said pulse modulation signal generating circuit including,
      a high-frequency clock generating part generating a high-frequency clock signal from a PLL circuit, and
      a serial modulation signal generating part comprising a shift register, providing modulation data having a plurality of bits to the shift register, causing the shift register to perform shift operation according to the high-frequency clock signal so as to convert the modulation data into a serial pulse series to be output,
   wherein said PLL circuit comprises:
      a voltage controlled oscillator generating a clock signal;
      a phase comparing part detecting a phase difference between the clock frequency generated by said voltage controlled oscillator or a frequency obtained from dividing the once oscillated frequency and a reference clock frequency; and
      a voltage inputting part inputting a voltage corresponding to the phase difference detected by said phase comparing part to said voltage controlled oscillator,
   wherein said voltage controlled oscillator comprises,
      an oscillation frequency control part comprising a voltage-to-current converting circuit converting an input voltage to a current having a value corresponding to the input voltage, and outputting a current in proportion to the current obtained from said voltage-to-current converting circuit, and
      an oscillating circuit part comprising a ring oscillator,
      wherein a current in proportion to the output current of said oscillation frequency control part flows through said ring oscillator so that the oscillation frequency in said ring oscillator is controlled by the output current of said oscillation frequency control part,
      wherein the oscillation off the oscillating circuit part is carried out between a ground electric potential and a power source voltage applied to the oscillating circuit, and
      wherein said voltage-to-current converting circuit has linear voltage-to-current conversion characteristics in a predetermined range of the input voltage including a ground potential.

* * * * *